(12) United States Patent
Deng et al.

(10) Patent No.: US 12,052,911 B2
(45) Date of Patent: *Jul. 30, 2024

(54) UV PATTERNABLE POLYMER BLENDS FOR ORGANIC THIN-FILM TRANSISTORS

(71) Applicant: Corning Incorporated, Corning, NY (US)

(72) Inventors: Huayun Deng, Painted Post, NY (US); Mingqian He, Horseheads, NY (US); Xin Li, Shanghai (CN); Yang Li, Shanghai (CN); Weijun Niu, Painted Post, NY (US); Arthur Lawrence Wallace, Painted Post, NY (US); Hongxiang Wang, Shanghai (CN)

(73) Assignee: CORNING INCORPORATED, Corning, NY (US)

( * ) Notice: Subject to any disclaimer, the term of this patent is extended or adjusted under 35 U.S.C. 154(b) by 430 days.

This patent is subject to a terminal disclaimer.

(21) Appl. No.: 17/291,406

(22) PCT Filed: Oct. 22, 2019

(86) PCT No.: PCT/US2019/057301
§ 371 (c)(1),
(2) Date: May 5, 2021

(87) PCT Pub. No.: WO2020/096761
PCT Pub. Date: May 14, 2020

(65) Prior Publication Data
US 2022/0006016 A1    Jan. 6, 2022

(30) Foreign Application Priority Data
Nov. 5, 2018  (CN) .......................... 201811307488.7

(51) Int. Cl.
*H10K 85/10*  (2023.01)
*C08G 61/12*  (2006.01)
*H10K 10/46*  (2023.01)

(52) U.S. Cl.
CPC ......... *H10K 85/113* (2023.02); *C08G 61/126* (2013.01); *H10K 85/151* (2023.02);
(Continued)

(58) Field of Classification Search
CPC .................................................. H10K 85/113
See application file for complete search history.

(56) References Cited

U.S. PATENT DOCUMENTS

2010/0183820 A1* 7/2010 Seubert ................ B05D 3/0209
427/493
2013/0085256 A1* 4/2013 He ......................... C09B 69/109
548/126
(Continued)

FOREIGN PATENT DOCUMENTS

CN        102010499 A    4/2011
CN        103946275 A    7/2014
(Continued)

OTHER PUBLICATIONS

Wang et al., "Inducing Elasticity through Oligo-Siloxane Crosslinks for Intrinsically Stretchable Semiconducting Polymers", In Advanced Functional Materials, vol. 26, Issue 40, 2016, 25 pages.
(Continued)

*Primary Examiner* — William D Young
(74) *Attorney, Agent, or Firm* — Travis B. Gasa

(57) ABSTRACT

A cross-bred organic semiconductor (OSC) polymer, includes a diketopyrrolopyrrole (DPP)-fused thiophene polymeric material, such that: the DPP-fused thiophene polymeric material comprises a first linear alkyl-substituted DPP portion and a second branched alkyl-substituted DPP
(Continued)

portion, the cross-bred OSC polymer comprises a repeat unit having both the first linear alkyl-substituted DPP portion and the second branched alkyl-substituted DPP portion, and the fused thiophene is beta-substituted.

6 Claims, 7 Drawing Sheets

(52) U.S. Cl.
CPC .................. *C08G 2261/124* (2013.01); *C08G 2261/1412* (2013.01); *C08G 2261/18* (2013.01); *C08G 2261/228* (2013.01); *C08G 2261/3223* (2013.01); *C08G 2261/3241* (2013.01); *C08G 2261/3243* (2013.01); *C08G 2261/92* (2013.01); *H10K 10/466* (2023.02); *H10K 10/484* (2023.02)

(56) References Cited

U.S. PATENT DOCUMENTS

| | | | |
|---|---|---|---|
| 2015/0206616 | A1 | 7/2015 | He et al. |
| 2016/0155633 | A1* | 6/2016 | Zhou .................. C08J 3/24 257/632 |
| 2016/0222167 | A1 | 8/2016 | He et al. |
| 2018/0244838 | A1 | 8/2018 | Miyamoto et al. |
| 2018/0248122 | A1* | 8/2018 | Otsuki ................. H10K 71/135 |

FOREIGN PATENT DOCUMENTS

| | | |
|---|---|---|
| CN | 104703685 A | 6/2015 |
| CN | 105849170 A | 8/2016 |
| CN | 107406585 A | 11/2017 |
| CN | 107406586 A | 11/2017 |
| JP | 5355857 B2 | 11/2013 |
| WO | 02/10129 A2 | 2/2002 |
| WO | 2002/101129 A1 | 12/2002 |
| WO | 2017/001823 A1 | 1/2017 |

OTHER PUBLICATIONS

Yao et al., "Significant Improvement of Semiconducting Performance of the Diketopyrrolopyrrole-Quaterthiophene Conjugated Polymer through Side-Chain Engineering via Hydrogen-Bonding", in Journal of The American Chemical Society, Issue No. 138, 2016, 22 pages.

Zeng et al., "Solar Cells: Two-Dimensional Single-Layer Organic-Inorganic Hybrid Perovskite Semiconductors", In Advanced Energy Materials, vol. 7, Issue 7, 2017, 7 pages.

International Search Report and Written Opinion of the International Searching Authority; PCT/US2019/057301; dated Feb. 10, 2020; 11 pages; European Patent Office.

Matthews et al., "Scalable Synthesis of Fused Thiophene-Diketopyrrolopyrrole Semiconducting Polymers Processed from Nonchlorinated Solvents into High Performance Thin Film Transistors", Chemistry of Materials, vol. 25, No. 5, Mar. 12, 2013, pp. 782-789.

Rumer et al., "Organic photovoltaics: Crosslinking for optimal morphology and stability", Materials Today, vol. 18, No. 8, Oct. 1, 2015, pp. 425-435.

Shin et al., "Bis(thienothiophenyl) Diketopyrrolopyrrole-Based Conjugated Polymers with Various Branched Alkyl Side Chains and Their Applications in Thin-Film Transistors and Polymer Solar Cells", In ACS Applied Materials & Interfaces, vol. 7, No. 5, Jan. 28, 2015 pp. 3280-3288.

Yiu et al., "Side-Chain Tunability of Furan-Containing Low-Band-Gap Polymers Provides Control of Structural Order in Efficient Solar Cells" Journal of The American Chemical Society, vol. 134, No. 4, Dec. 22, 2011, pp. 2180-2185.

"Welcome to STN International", STN on the Web, 2016, 4 pages.

Chinese Patent Application No. 201811307488.7, Office Action dated Apr. 29, 2023, 4 pages (English Translation only), Chinese Patent Office.

Taiwanese Patent Application No. 108138331, Search Report, dated Jul. 5, 2023, 1 page; Taiwanese Patent Office.

\* cited by examiner

UV PATTERNABLE POLYMER BLENDS FOR ORGANIC THIN-FILM TRANSISTORS

BACKGROUND

1. Field

This application is a national stage application under 35 U.S.C. § 371 of International Application No. PCT/US2019/057301, filed on Oct. 22, 2019, which claims the benefit of priority under 35 U.S.C. § 119 of Chinese Patent Application Serial No. 201811307488.7, filed on Nov. 5, 2018, the contents of both of which are relied upon and incorporated herein by reference in their entirety.

The disclosure relates to UV patternable organic semiconductor (OSC) polymer blends as semiconducting layers for organic thin-film transistors (OTFTs).

2. Technical Background

Organic thin-film transistors (OTFTs) have garnered extensive attention as alternatives to conventional silicon-based technologies, which require high temperature and high vacuum deposition processes, as well as complex photolithographic patterning methods. Semiconducting (i.e., organic semiconductor, OSC) layers are one important component of OTFTs which can effectively influence the performance of devices.

Conventional OTFT devices often comprise OSC layers having polymers with structures that lead to gelling, film particles and low reproducibility.

This disclosure presents improved UV patternable OSC polymer blends and use thereof for OSC layers of organic thin-film transistors.

SUMMARY

In some embodiments, a polymer blend, comprises: at least one cross-bred organic semiconductor (OSC) polymer and at least one crosslinker, wherein: the at least one cross-bred OSC polymer is a diketopyrrolopyrrole (DPP)-fused thiophene polymeric material, the DPP-fused thiophene polymeric material comprises a first linear alkyl-substituted DPP portion and a second branched alkyl-substituted DPP portion, and the fused thiophene is beta-substituted.

In one aspect, which is combinable with any of the other aspects or embodiments, the crosslinker includes at least one of: acrylates, epoxides, oxetanes, alkenes, alkynes, azides, thiols, allyloxysilanes, phenols, anhydrides, amines, cyanate esters, isocyanate esters, silyl hydrides, cinnamates, coumarins, fluorosulfates, silyl ethers, or a combination thereof.

In one aspect, which is combinable with any of the other aspects or embodiments, the polymer blend further comprises: at least one photoinitiator, wherein the at least one photoinitiator is present in a range of 0.1 wt. % to 10 wt. %.

In one aspect, which is combinable with any of the other aspects or embodiments, the polymer blend further comprises: at least one of antioxidants, lubricants, compatibilizers, leveling agents, or nucleating agents present in a range of 0.05 wt. % to 5 wt. %.

In one aspect, which is combinable with any of the other aspects or embodiments, the first linear alkyl-substituted DPP portion and the second branched alkyl-substituted DPP portion may comprise, independently, the repeat unit of Formula 1 or Formula 2, or a salt, isomer, or analog thereof:

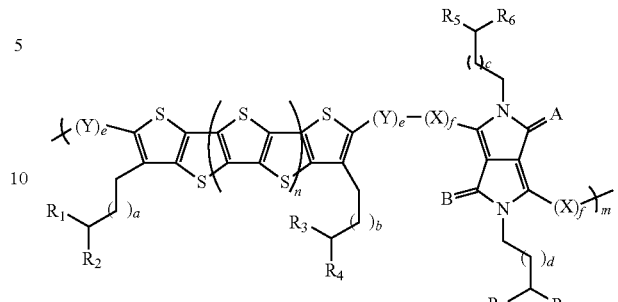

Formula 1

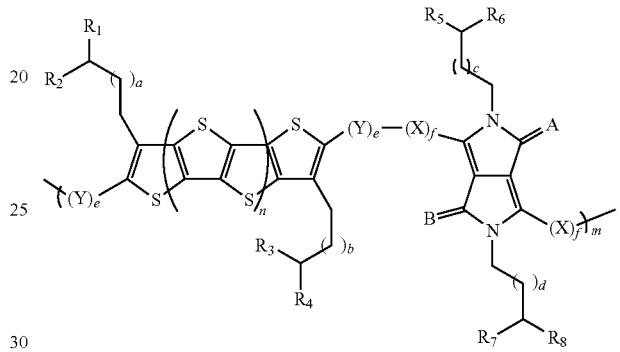

Formula 2 wherein in Formula 1 and Formula 2: m is an integer greater than or equal to one; n is 0, 1, or 2; $R_1$, $R_2$, $R_3$, $R_4$, $R_5$, $R_6$, $R_7$, and $R_8$, may be, independently, hydrogen, substituted or unsubstituted $C_4$ or greater alkyl, substituted or unsubstituted $C_4$ or greater alkenyl, substituted or unsubstituted $C_4$ or greater alkynyl, or $C_5$ or greater cycloalkyl; a, b, c, and d are independently, integers greater than or equal to 3; e and f are integers greater than or equal to zero; X and Y are, independently a covalent bond, an optionally substituted aryl group, an optionally substituted heteroaryl, an optionally substituted fused aryl or fused heteroaryl group, an alkyne or an alkene; and A and B may be, independently, either S or O, with the provisos that: (i) at least one of $R_1$ or $R_2$; one of $R_3$ or $R_4$; one of $R_5$ or $R_6$; and one of $R_7$ or $R_8$ is a substituted or unsubstituted alkyl, substituted or unsubstituted alkenyl, substituted or unsubstituted alkynyl, or cycloalkyl; (ii) if any of $R_1$, $R_2$, $R_3$, or $R_4$ is hydrogen, then none of $R_5$, $R_6$, $R_7$, or $R_8$ are hydrogen; (iii) if any of $R_5$, $R_6$, $R_7$, or $R_8$ is hydrogen, then none of $R_1$, $R_2$, $R_3$, or $R_4$ are hydrogen; (iv) e and f cannot both be 0; (v) if either e or f is 0, then c and d, independently, are integers greater than or equal to 5; and (vi) the polymer having a molecular weight, wherein the molecular weight of the polymer is greater than 10,000.

In one aspect, which is combinable with any of the other aspects or embodiments, the at least one crosslinker comprises at least one of: (A) a polymer selected from:

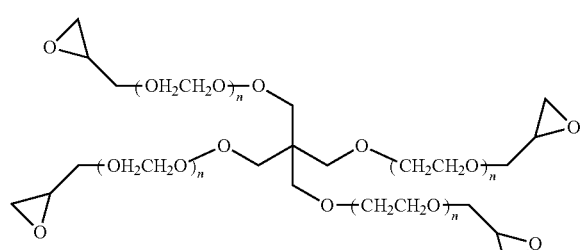
C1
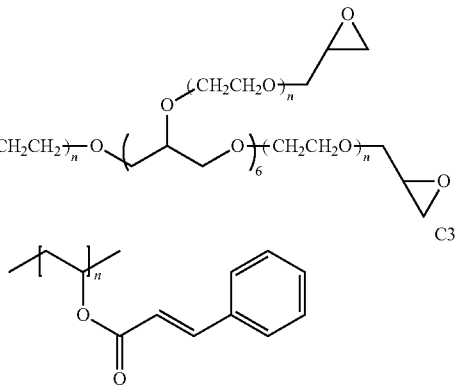
C2
C3
wherein n is an integer greater than or equal to two, or (B) a small-molecule selected from:
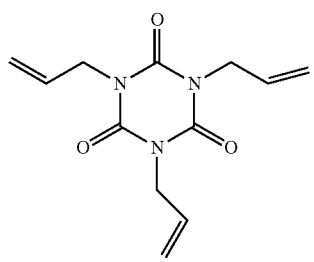
C4
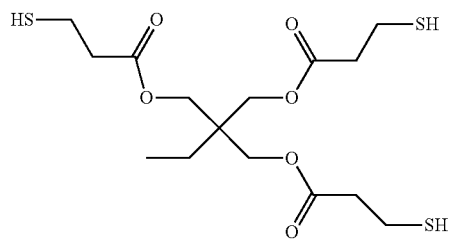
C5
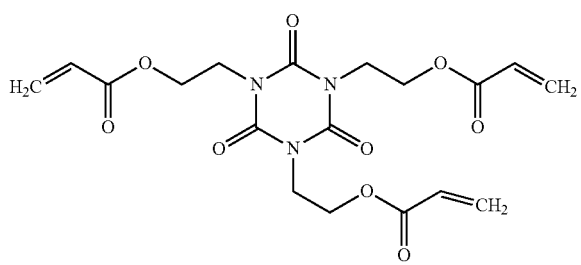
C6
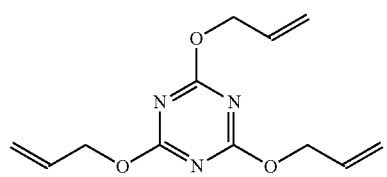
C7
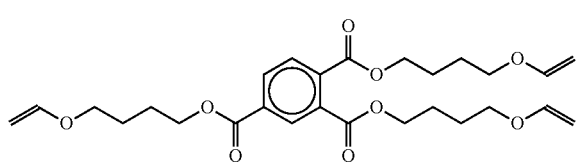
C8
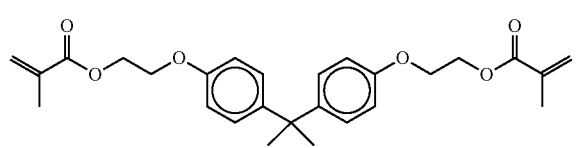
C9
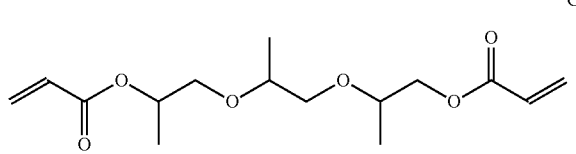
C10
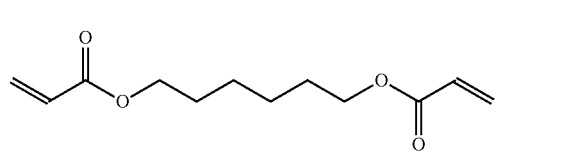
C11

-continued
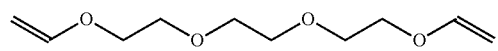
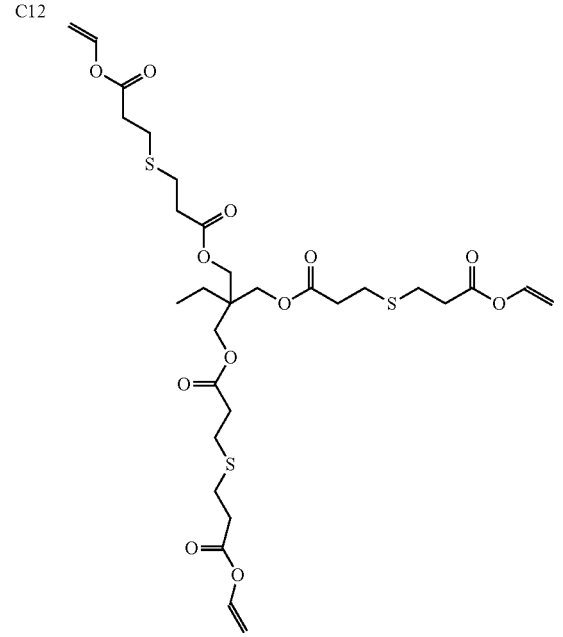
C12
C13
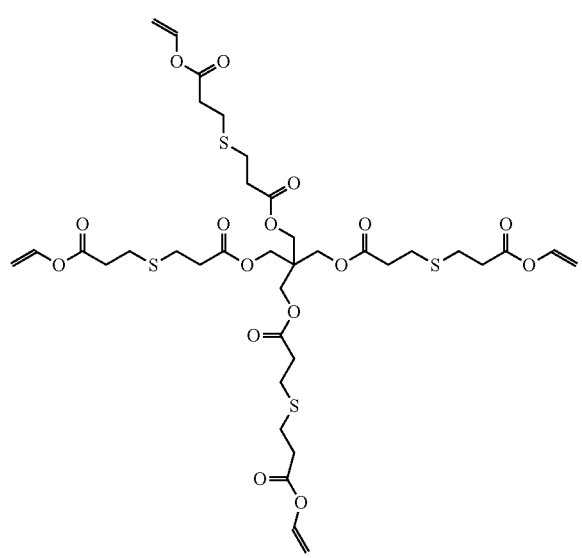
C14
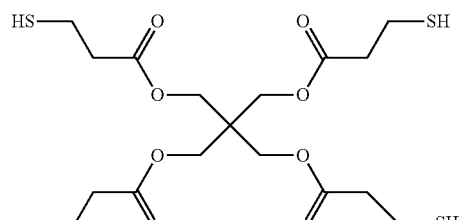
C16
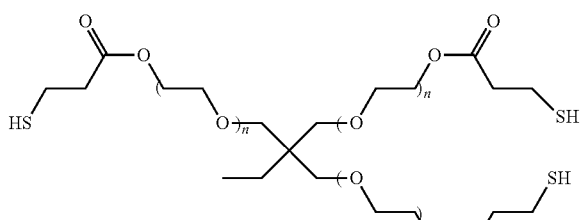
C15
C17 or, (C) a combination thereof.

In one aspect, which is combinable with any of the other aspects or embodiments, the at least one photoinitiator comprises at least one free radical photoinitiator.

In one aspect, which is combinable with any of the other aspects or embodiments, the at least one photoinitiator comprises at least one cationic photoinitiator.

In one aspect, which is combinable with any of the other aspects or embodiments, the at least one photoinitiator comprises: 1-hydroxy-cyclohexyl-phenyl-ketone (184); 2-benzyl-2-dimethylamino-1-(4-morpholinophenyl)-butanone-1 (369); diphenyl(2,4,6-trimethylbenzoyl)phosphine oxide (TPO); 2-isopropyl thioxanthone (ITX); 1-[4-(phenylthio) phenyl]-1,2-octanedione 2-(0-benzoyloxime) (HR-CURE-OXE01); 2,2-dimethoxy-1,2-diphenylethan-1-one (BDK); benzoyl peroxide (BPO); hydroxyacetophenone (HAP); 2-hydroxy-2-methylprophenone (1173); 2-methyl-4'-(methylthio)-2-morpholinopropiophenone (907); 2-benzyl-2-(dimethylamino)-4'-morpholinobutyrophenone (IHT-PI 910); Ethyl-4-(dimethylamino)benzoate (EDB); methyl o-benzoyl benzoate (OMBB); bis-(2,6 dimethoxy-benzoyl)-phenyl phosphine oxide (BAPO); 4-benzoyl-4' methyldiphenylsulfide (BMS); benzophenone (BP); 1-chloro-4-propoxy thiozanthone (CPTX); chlorothioxanthone (CTX); 2,2-diethoxyacetophenone (DEAP); diethyl thioxanthone (DETX); 2-dimethyl aminoethyl benzonate (DMB); 2,2-dimethoxy-2-phenyl acetophenone (DMPA); 2-ethyl anthraquinone (2-EA); ethyl-para-N,N-dimethyl-dimethylamino lenzoate (EDAB); 2-ethyl hexyl-dimethylaminolenzoate (EHA); 4,4-bis-(diethylamino)-benzophenone (EMK); methyl benzophenone (MBF); 4-methyl benzophenone (MBP); Michler's ketone (MK); 2-methyl-1-[4(methylthiol) phenyl]-2-morpholino propanone (1) (MMMP); 4-phenyl-benzophenone (PBZ); 2,4,6-trimethyl-benzoly-ethoxyl phenyl phosphine oxide (TEPO); bis(4-tert-butylphenyl) iodonium perfluoro-1-butanesulfonate; bis(4-tert-butylphenyl) iodonium p-toluenesulfonate; bis(4-tert-butylphenyl) iodonium triflate; boc-methoxyphenyldiphenylsulfonium triflate; (4-tert-Butylphenyl) diphenylsulfonium triflate; diphenyliodonium hexafluorophosphate; diphenyliodonium nitrate; diphenyliodonium p-toluenesulfonate; diphenyliodonium triflate; (4-fluorophenyl) diphenylsulfonium triflate; N-hydroxynaphthalimide triflate; N-hydroxy-5-norbornene-2,3-dicarboximide perfluoro-1-butanesulfonate; (4-iodophenyl) diphenylsulfonium triflate; (4-methoxyphenyl) diphenylsulfonium triflate; 2-(4-Methoxystyryl)-4,6-bis(trichloromethyl)-1,3,5-triazine; (4-methylthiophenyl) methyl phenyl sulfonium triflate; 1-naphthyl diphenylsulfonium triflate; (4-phenoxyphenyl) diphenylsulfonium triflate; (4-phenylthiophenyl) diphenylsulfonium triflate; triarylsulfonium hexafluoroantimonate salts, mixed 50 wt. % in propylene carbonate; triarylsulfonium hexafluorophosphate salts, mixed 50 wt. % in propylene carbonate; triphenylsulfonium perfluoro-1-butanesufonate; triphenylsulfonium triflate; tris(4-tert-butylphenyl) sulfonium perfluoro-1-butanesulfonate; tris(4-tert-butylphenyl)sulfonium triflate; aryl diazo salts; diaryliodonium salts; triaryl sulfonium salts; aryl ferrocenium salts; or combinations thereof.

In one aspect, which is combinable with any of the other aspects or embodiments, the at least one crosslinker comprises C=C bonds, thiols, oxetanes, halides, azides, or combinations thereof.

In one aspect, which is combinable with any of the other aspects or embodiments, the at least one cross-bred OSC polymer comprises a repeat unit having: the first linear alkyl-substituted DPP portion, the second branched alkyl-substituted DPP portion, and at least one fused thiophene.

In one aspect, which is combinable with any of the other aspects or embodiments, the at least one cross-bred OSC polymer comprises a repeat unit having: the first linear alkyl-substituted DPP portion, the second branched alkyl-substituted DPP portion, and at least two fused thiophenes.

In some embodiments, a method of making a cross-bred organic semiconductor (OSC) polymer, comprises: reacting a first fused thiophene monomer with a first linear alkyl-substituted DPP monomer to form a first DPP-fused thiophene portion; reacting a second fused thiophene monomer with a second branched alkyl-substituted DPP monomer to form a second DPP-fused thiophene portion; and at least one of: reacting the first DPP-fused thiophene portion and the second DPP-fused thiophene portion; reacting the first DPP-fused thiophene portion with itself, and reacting the second DPP-fused thiophene portion with itself, wherein the fused thiophene is beta-substituted, and wherein the cross-bred OSC polymer comprises both the first DPP-fused thiophene portion and the second DPP-fused thiophene portion.

In one aspect, which is combinable with any of the other aspects or embodiments, the step of reacting the first fused thiophene monomer with the first linear alkyl-substituted DPP monomer comprises:

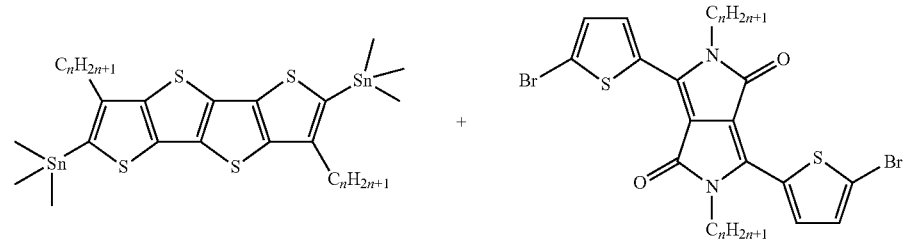

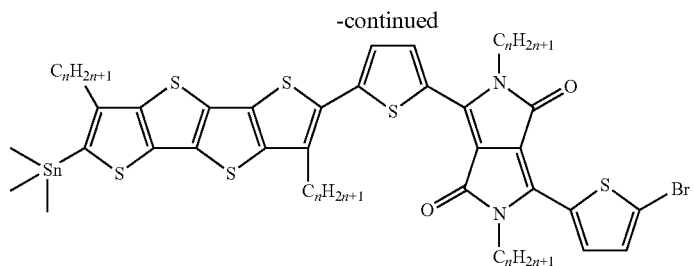

where n is at least 4.

In one aspect, which is combinable with any of the other aspects or embodiments, the step of reacting the second fused thiophene monomer with the second branched alkyl-substituted DPP monomer comprises:

In one aspect, which is combinable with any of the other aspects or embodiments, the step of reacting the first DPP-fused thiophene portion and the second DPP-fused thiophene portion comprises:

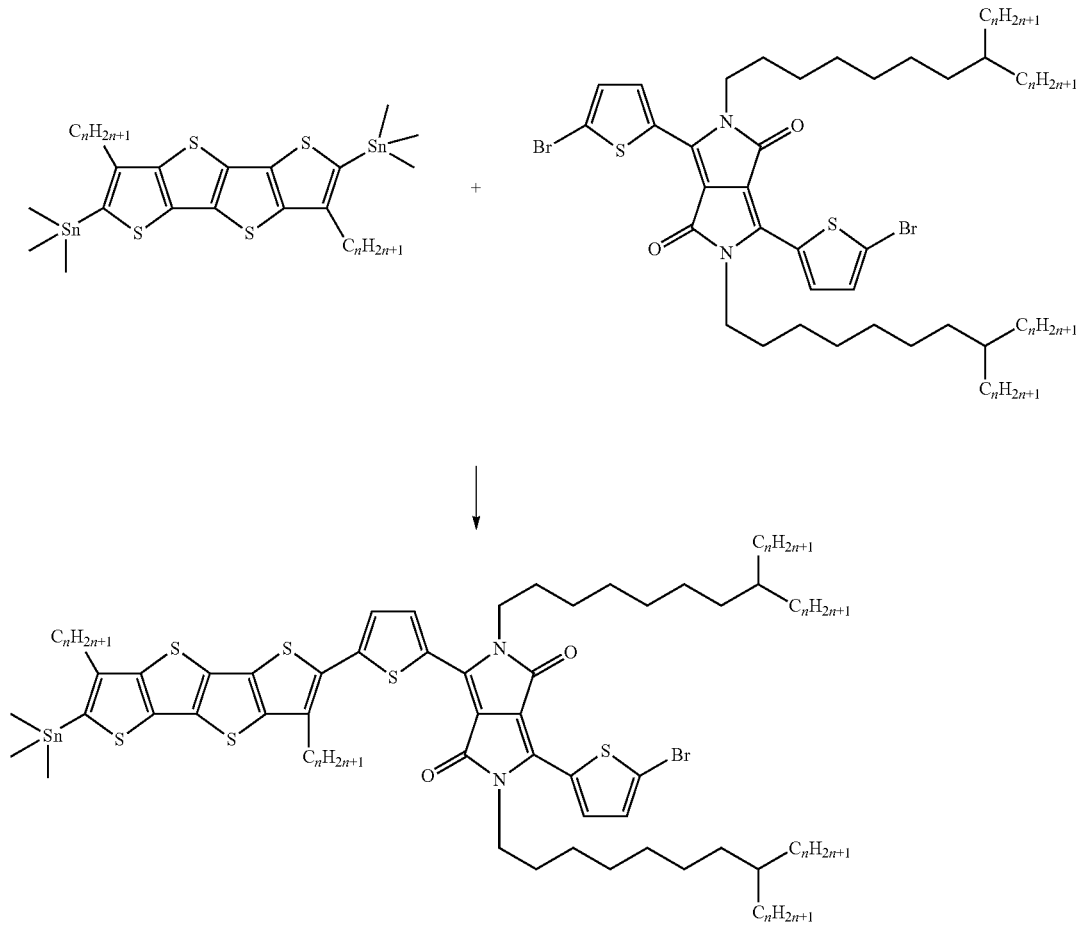

where n is at least 4.

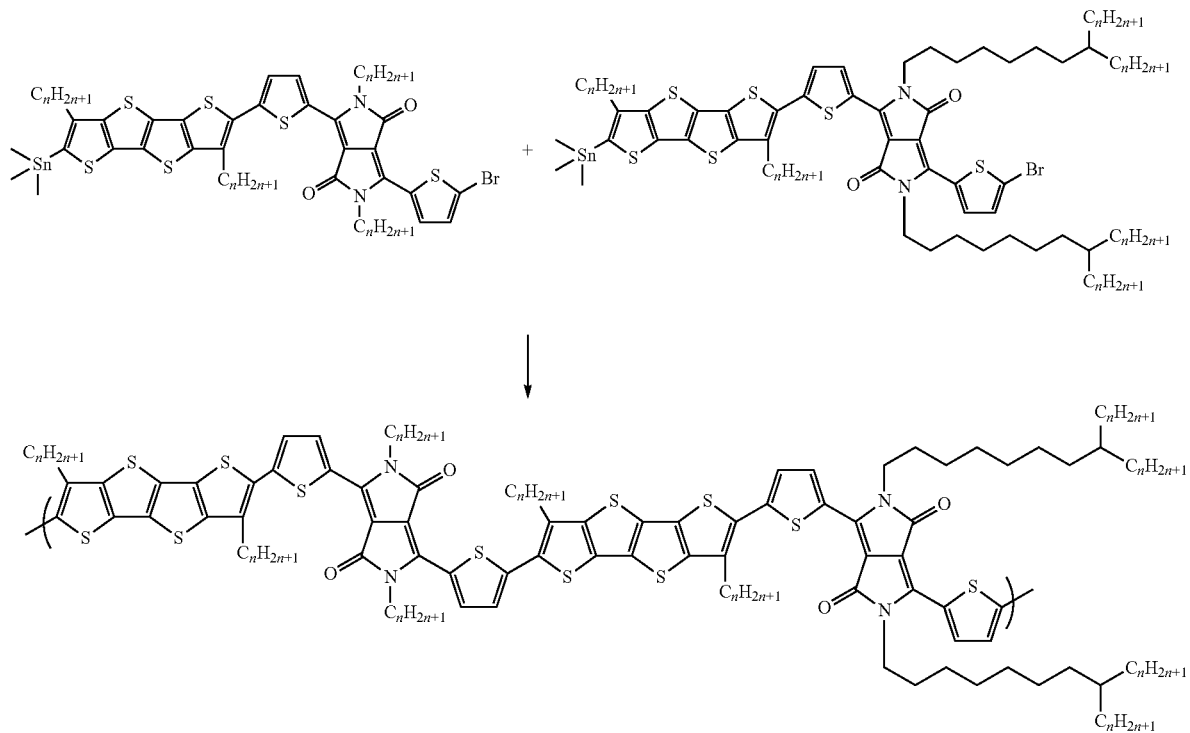

where n is at least 4.

In one aspect, which is combinable with any of the other aspects or embodiments, the step of reacting the first fused thiophene monomer with the first linear alkyl-substituted DPP monomer; and the step of reacting the second fused thiophene monomer with the second branched alkyl-substituted DPP monomer; and the at least one of: reacting the first DPP-fused thiophene portion and the second DPP-fused thiophene portion; reacting the first DPP-fused thiophene portion with itself, and reacting the second DPP-fused thiophene portion with itself is conducted in a batch reactor vessel.

In one aspect, which is combinable with any of the other aspects or embodiments, the method further comprises: mixing the first fused thiophene monomer, the first linear alkyl-substituted DPP monomer, the second fused thiophene monomer, and the second branched alkyl-substituted DPP monomer together in a batch reactor vessel.

In one aspect, which is combinable with any of the other aspects or embodiments, the first fused thiophene monomer is the same as the second fused thiophene monomer.

In one aspect, which is combinable with any of the other aspects or embodiments, the steps of: (1) reacting the first fused thiophene monomer with the first linear alkyl-substituted DPP monomer; (2) reacting the second fused thiophene monomer with the second branched alkyl-substituted DPP monomer; and (3) at least one of: reacting the first DPP-fused thiophene portion and the second DPP-fused thiophene portion; reacting the first DPP-fused thiophene portion with itself, and reacting the second DPP-fused thiophene portion with itself comprises:

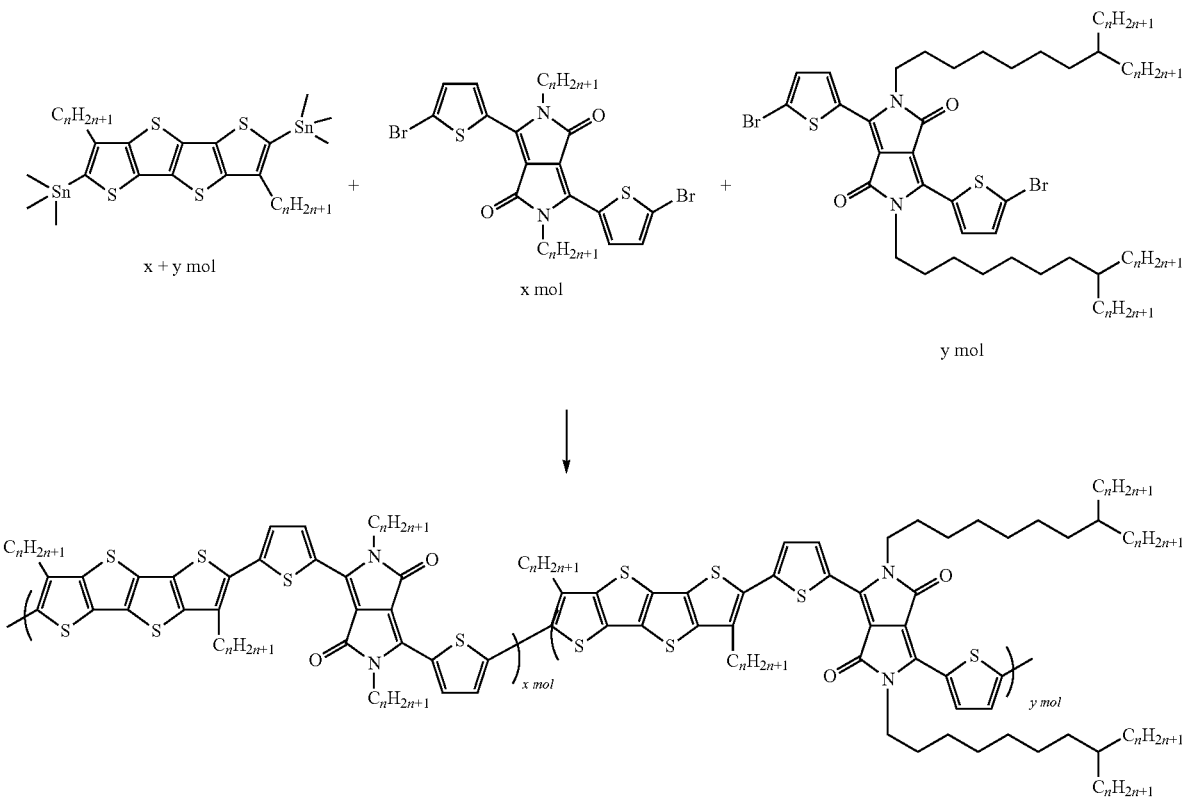

where n is at least 4, x is at least 1, y is at least 1.

In one aspect, which is combinable with any of the other aspects or embodiments, the first fused thiophene monomer is different from the second fused thiophene monomer.

In some embodiments, an organic semiconductor device comprises a polymer blend as disclosed herein.

In some embodiments, a cross-bred organic semiconductor (OSC) polymer, comprises a diketopyrrolopyrrole (DPP)-fused thiophene polymeric material, wherein: the DPP-fused thiophene polymeric material comprises a first linear alkyl-substituted DPP portion and a second branched alkyl-substituted DPP portion, the cross-bred OSC polymer comprises both the first linear alkyl-substituted DPP portion and the second branched alkyl-substituted DPP portion, and the fused thiophene is beta-substituted.

In one aspect, which is combinable with any of the other aspects or embodiments, the cross-bred OSC polymer has the structure of:

BRIEF DESCRIPTION OF THE DRAWINGS

The disclosure will become more fully understood from the following detailed description, taken in conjunction with the accompanying figures, in which.

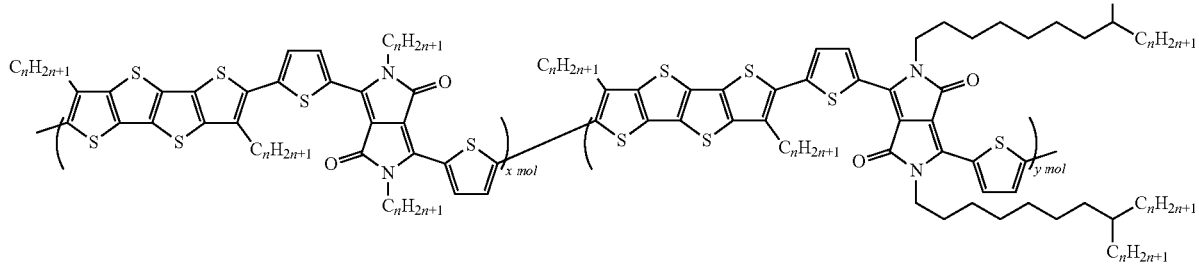

Figure 1:
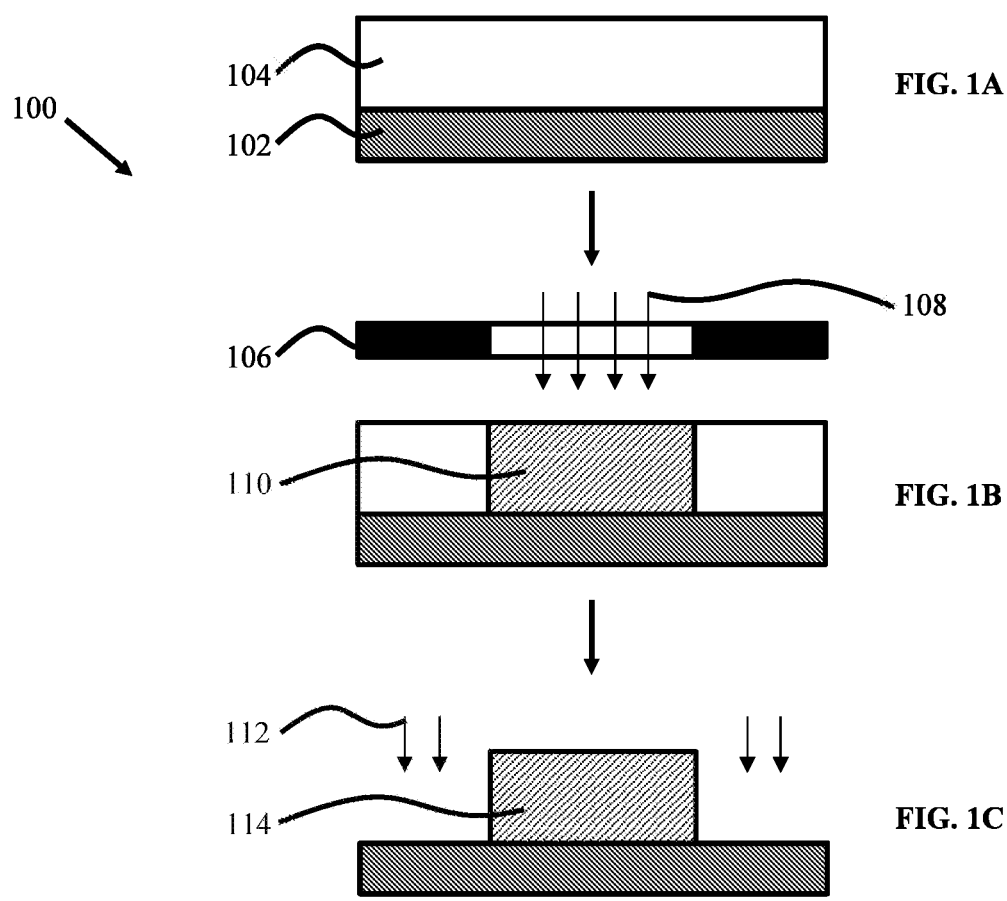
FIGS. 1A to 1C illustrate patterning techniques of organic semiconductor blends, according to some embodiments.

where n is at least 4, x is at least 1, y is at least 1.

DETAILED DESCRIPTION

Reference will now be made in detail to exemplary embodiments which are illustrated in the accompanying drawings. Whenever possible, the same reference numerals will be used throughout the drawings to refer to the same or like parts. The components in the drawings are not necessarily to scale, emphasis instead being placed upon illustrating the principles of the exemplary embodiments. It should be understood that the present application is not limited to the details or methodology set forth in the description or illustrated in the figures. It should also be understood that the terminology is for the purpose of description only and should not be regarded as limiting.

Additionally, any examples set forth in this specification are illustrative, but not limiting, and merely set forth some of the many possible embodiments of the claimed invention.

Other suitable modifications and adaptations of the variety of conditions and parameters normally encountered in the field, and which would be apparent to those skilled in the art, are within the spirit and scope of the disclosure.

Definitions

The term "alkyl group" refers to a monoradical branched or unbranched saturated hydrocarbon chain having 1 to 40 carbon atoms. This term is exemplified by groups such as methyl, ethyl, n-propyl, isopropyl, n-butyl, isobutyl, t-butyl, pentyl, n-hexyl, n-heptyl, n-octyl, n-decyl, or tetradecyl, and the like. The alkyl group can be substituted or unsubstituted. The term "substituted alkyl group" refers to: (1) an alkyl group as defined above, having 1, 2, 3, 4 or 5 substituents, typically 1 to 3 substituents, selected from the group consisting of alkenyl, alkynyl, alkoxy, aralkyl, aldehyde, cycloalkyl, cycloalkenyl, acyl, acylamino, acyl halide, acyloxy, amino, aminocarbonyl, alkoxycarbonylamino, azido, cyano, halogen, hydroxy, keto, thiocarbonyl, carboxy, carboxyalkyl, arylthiol, ester, heteroarylthio, heterocyclylthio, hydroxyl, thiol, alkylthio, aryl, aryloxy, heteroaryl, aminosulfonyl, aminocarbonylamino, heteroaryloxy, heterocyclyl, heterocyclooxy, hydroxyamino, alkoxyamino, nitro, —SO-alkyl, —SO-aryl, —SO-heteroaryl, —SO$_2$-alkyl, —SO$_2$-aryl and —SO$_2$-heteroaryl, thioalkyl, vinyl ether. Unless otherwise constrained by the definition, all substituents may optionally be further substituted by 1, 2, or 3 substituents chosen from alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2; or (2) an alkyl group as defined above that is interrupted by 1-10 atoms independently chosen from oxygen, sulfur and NR$_a$, where R$_a$ is chosen from hydrogen, alkyl, cycloalkyl, alkenyl, cycloalkenyl, alkynyl, aryl, heteroaryl and heterocyclyl. All substituents may be optionally further substituted by alkyl, alkoxy, halogen, CF$_3$, amino, substituted amino, cyano, or —S(O)$_n$R$_{SO}$, in which R$_{SO}$ is alkyl, aryl, or heteroaryl and n is 0, 1 or 2; or (3) an alkyl group as defined above that has both 1, 2, 3, 4 or 5 substituents as defined above and is also interrupted by 1-10 atoms as defined above. For example, the alkyl groups can be an alkyl hydroxy group, where any of the hydrogen atoms of the alkyl group are substituted with a hydroxyl group.

The term "alkyl group" as defined herein also includes cycloalkyl groups. The term "cycloalkyl group" as used herein is a non-aromatic carbon-based ring (i.e., carbocyclic) composed of at least three carbon atoms, and in some embodiments from three to 20 carbon atoms, having a single cyclic ring or multiple condensed rings. Examples of single ring cycloalkyl groups include, but are not limited to, cyclopropyl, cyclobutyl, cyclopentyl, cyclohexyl, cyclooctyl, and the like. Examples of multiple ring cycloalkyl groups include, but are not limited to, adamantanyl, bicyclo[2.2.1]heptane, 1,3,3-trimethylbicyclo[2.2.1]hept-2-yl, (2,3,3-trimethylbicyclo[2.2.1]hept-2-yl), or carbocyclic groups to which is fused an aryl group, for example indane, and the like. The term cycloalkyl group also includes a heterocycloalkyl group, where at least one of the carbon atoms of the ring is substituted with a heteroatom such as, but not limited to, nitrogen, oxygen, sulfur, or phosphorus.

The term "unsubstituted alkyl group" is defined herein as an alkyl group composed of just carbon and hydrogen.

The term "acyl" denotes a group —C(O)R$_{CO}$, in which R$_{CO}$ is hydrogen, optionally substituted alkyl, optionally substituted cycloalkyl, optionally substituted heterocyclyl, optionally substituted aryl, and optionally substituted heteroaryl.

The term "aryl group" as used herein is any carbon-based aromatic group (i.e., aromatic carbocyclic) such as having a single ring (e.g., phenyl) or multiple rings (e.g., biphenyl), or multiple condensed (fused) rings (e.g., naphthyl or anthryl). These may include, but are not limited to, benzene, naphthalene, phenyl, etc.

The term "aryl group" also includes "heteroaryl group," meaning a radical derived from an aromatic cyclic group (i.e., fully unsaturated) having 1, 2, 3, 4, 5, 6, 7, 8, 9, 10, 11, 12, 13, 14, or 15 carbon atoms and 1, 2, 3 or 4 heteroatoms selected from oxygen, nitrogen, sulfur, and phosphorus within at least one ring. In other words, heteroaryl groups are aromatic rings composed of at least three carbon atoms that has at least one heteroatom incorporated within the ring of the aromatic group. Such heteroaryl groups can have a single ring (e.g., pyridyl or furyl) or multiple condensed rings (e.g., indolizinyl, benzothiazolyl, or benzothienyl). Examples of heteroaryls include, but are not limited to, [1,2,4]oxadiazole, [1,3,4]oxadiazole, [1,2,4]thiadiazole, [1,3,4]thiadiazole, pyrrole, imidazole, pyrazole, pyridine, pyrazine, pyrimidine, pyridazine, indolizine, isoindole, indole, indazole, purine, quinolizine, isoquinoline, quinoline, phthalazine, naphthylpyridine, quinoxaline, quinazoline, cinnoline, pteridine, carbazole, carboline, phenanthridine, acridine, phenanthroline, isothiazole, phenazine, isoxazole, phenoxazine, phenothiazine, imidazolidine, imidazoline, triazole, oxazole, thiazole, naphthyridine, and the like as well as N-oxide and N-alkoxy derivatives of nitrogen containing heteroaryl compounds, for example pyridine-N-oxide derivatives.

Unless otherwise constrained by the definition for the heteroaryl substituent, such heteroaryl groups can be optionally substituted with 1 to 5 substituents, typically 1 to 3 substituents selected from the group consisting of alkyl, alkenyl, alkynyl, alkoxy, cycloalkyl, cycloalkenyl, acyl, acylamino, acyloxy, amino, aminocarbonyl, alkoxycarbonylamino, azido, cyano, halogen, hydroxy, keto, thiocarbonyl, carboxy, carboxyalkyl, arylthio, heteroarylthio, heterocyclylthio, thiol, alkylthio, aryl, aryloxy, heteroaryl, aminosulfonyl, aminocarbonylamino, heteroaryloxy, heterocyclyl, heterocyclooxy, hydroxyamino, alkoxyamino, nitro, —SO-alkyl, —SO-aryl, —SO-heteroaryl, —SO$_2$-alkyl, SO$_2$-aryl and —SO$_2$-heteroaryl. Unless otherwise constrained by the definition, all substituents may optionally be further substituted by 1-3 substituents chosen from alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2.

The aryl group can be substituted or unsubstituted. Unless otherwise constrained by the definition for the aryl substituent, such aryl groups can optionally be substituted with from 1 to 5 substituents, typically 1 to 3 substituents, selected from the group consisting of alkyl, alkenyl, alkynyl, alkoxy, aldehyde, cycloalkyl, cycloalkenyl, acyl, acylamino, acyloxy, amino, aminocarbonyl, alkoxycarbonylamino, azido, cyano, ester, halogen, hydroxy, keto, thiocarbonyl, carboxy, carboxyalkyl, arylthio, heteroarylthio, heterocyclylthio, thiol, alkylthio, aryl, aryloxy, heteroaryl, aminosulfonyl, aminocarbonylamino, heteroaryloxy, heterocyclyl, heterocyclooxy, hydroxyamino, alkoxyamino, nitro, —SO-alkyl, —SO-aryl, —SO-heteroaryl, —SO$_2$-alkyl, SO$_2$-aryl and —SO$_2$-heteroaryl. Unless otherwise constrained by the definition, all substituents may optionally be further substituted by 1-3 substituents chosen from alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2. In some embodiments, the term "aryl group" is limited to substituted or unsubstituted aryl and heteroaryl rings having from three to 30 carbon atoms.

The term "aralkyl group" as used herein is an aryl group having an alkyl group or an alkylene group as defined herein covalently attached to the aryl group. An example of an aralkyl group is a benzyl group. "Optionally substituted aralkyl" refers to an optionally substituted aryl group covalently linked to an optionally substituted alkyl group or alkylene group. Such aralkyl groups are exemplified by benzyl, phenylethyl, 3-(4-methoxyphenyl)propyl, and the like.

The term "heteroaralkyl" refers to a heteroaryl group covalently linked to an alkylene group, where heteroaryl and alkylene are defined herein. "Optionally substituted heteroaralkyl" refers to an optionally substituted heteroaryl group covalently linked to an optionally substituted alkylene group. Such heteroaralkyl groups are exemplified by 3-pyridylmethyl, quinolin-8-ylethyl, 4-methoxythiazol-2-ylpropyl, and the like.

The term "alkenyl group" refers to a monoradical of a branched or unbranched unsaturated hydrocarbon group typically having from 2 to 40 carbon atoms, more typically 2 to 10 carbon atoms and even more typically 2 to 6 carbon atoms and having 1-6, typically 1, double bond (vinyl). Typical alkenyl groups include ethenyl or vinyl (—CH═CH$_2$), 1-propylene or allyl (—CH$_2$CH═CH$_2$), isopropylene (—C(CH$_3$)═CH$_2$), bicyclo[2.2.1]heptene, and the like. When alkenyl is attached to nitrogen, the double bond cannot be alpha to the nitrogen.

The term "substituted alkenyl group" refers to an alkenyl group as defined above having 1, 2, 3, 4 or 5 substituents, and typically 1, 2, or 3 substituents, selected from the group consisting of alkyl, alkenyl, alkynyl, alkoxy, cycloalkyl, cycloalkenyl, acyl, acylamino, acyloxy, amino, aminocarbonyl, alkoxycarbonylamino, azido, cyano, halogen, hydroxy, keto, thiocarbonyl, carboxy, carboxyalkyl, arylthio, heteroarylthio, heterocyclylthio, thiol, alkylthio, aryl, aryloxy, heteroaryl, aminosulfonyl, aminocarbonylamino, heteroaryloxy, heterocyclyl, heterocyclooxy, hydroxyamino, alkoxyamino, nitro, —SO-alkyl, —SO-aryl, —SO-heteroaryl, —SO$_2$-alkyl, SO$_2$-aryl and —SO$_2$-heteroaryl. Unless otherwise constrained by the definition, all substituents may optionally be further substituted by 1, 2, or 3 substituents chosen from alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2.

The term "cycloalkenyl group" refers to carbocyclic groups of from 3 to 20 carbon atoms having a single cyclic ring or multiple condensed rings with at least one double bond in the ring structure.

The term "alkynyl group" refers to a monoradical of an unsaturated hydrocarbon, typically having from 2 to 40 carbon atoms, more typically 2 to 10 carbon atoms and even more typically 2 to 6 carbon atoms and having at least 1 and typically from 1-6 sites of acetylene (triple bond) unsaturation. Typical alkynyl groups include ethynyl, (—C≡CH), propargyl (or prop-1-yn-3-yl, —CH$_2$C≡CH), and the like. When alkynyl is attached to nitrogen, the triple bond cannot be alpha to the nitrogen.

The term "substituted alkynyl group" refers to an alkynyl group as defined above having 1, 2, 3, 4 or 5 substituents, and typically 1, 2, or 3 substituents, selected from the group consisting of alkyl, alkenyl, alkynyl, alkoxy, cycloalkyl, cycloalkenyl, acyl, acylamino, acyloxy, amino, aminocarbonyl, alkoxycarbonylamino, azido, cyano, halogen, hydroxy, keto, thiocarbonyl, carboxy, carboxyalkyl, arylthio, heteroarylthio, heterocyclylthio, thiol, alkylthio, aryl, aryloxy, heteroaryl, aminosulfonyl, aminocarbonylamino, heteroaryloxy, heterocyclyl, heterocyclooxy, hydroxyamino, alkoxyamino, nitro, —SO-alkyl, —SO-aryl, —SO-heteroaryl, —SO$_2$— alkyl, SO$_2$-aryl and —SO$_2$-heteroaryl. Unless otherwise constrained by the definition, all substituents may optionally be further substituted by 1, 2, or 3 substituents chosen from alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2.

The term "alkylene group" is defined as a diradical of a branched or unbranched saturated hydrocarbon chain, having 1, 2, 3, 4, 5, 6, 7, 8, 9, 10, 11, 12, 13, 14, 15, 16, 17, 18, 19 or 20 carbon atoms, typically 1-10 carbon atoms, more typically 1, 2, 3, 4, 5 or 6 carbon atoms. This term is exemplified by groups such as methylene (—CH$_2$—), ethylene (—CH$_2$CH$_2$—), the propylene isomers (e.g., —CH$_2$CH$_2$CH$_2$— and —CH(CH$_3$)CH$_2$—) and the like.

The term "substituted alkylene group" refers to: (1) an alkylene group as defined above having 1, 2, 3, 4, or 5 substituents selected from the group consisting of alkyl, alkenyl, alkynyl, alkoxy, cycloalkyl, cycloalkenyl, acyl, acylamino, acyloxy, amino, aminocarbonyl, alkoxycarbonylamino, azido, cyano, halogen, hydroxy, keto, thiocarbonyl, carboxy, carboxyalkyl, arylthio, heteroarylthio, heterocyclylthio, thiol, alkylthio, aryl, aryloxy, heteroaryl, aminosulfonyl, aminocarbonylamino, heteroaryloxy, heterocyclyl, heterocyclooxy, hydroxyamino, alkoxyamino, nitro, —SO-alkyl, —SO-aryl, —SO-heteroaryl, —SO$_2$-alkyl, —SO$_2$-aryl and —SO$_2$-heteroaryl. Unless otherwise constrained by the definition, all substituents may optionally be further substituted by 1, 2, or 3 substituents chosen from alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2; or (2) an alkylene group as defined above that is interrupted by 1-20 atoms independently chosen from oxygen, sulfur and NR$_a$—, where R$_a$ is chosen from hydrogen, optionally substituted alkyl, cycloalkyl, cycloalkenyl, aryl, heteroaryl and heterocyclyl, or groups selected from carbonyl, carboxyester, carboxyamide and sulfonyl; or (3) an alkylene group as defined above that has both 1, 2, 3, 4 or 5 substituents as defined above and is also interrupted by 1-20 atoms as defined above. Examples of substituted alkylenes are chloromethylene (—CH(Cl)—), aminoethylene (—CH(NH$_2$)CH$_2$—), methylaminoethylene (—CH (NHMe)CH$_2$—), 2-carboxypropylene isomers (—CH$_2$CH(CO$_2$H)CH$_2$—), ethoxyethyl (—CH$_2$CH$_2$O—CH$_2$CH$_2$—), ethylmethylaminoethyl (—CH$_2$CH$_2$N(CH$_3$)CH$_2$CH$_2$—), and the like.

The term "alkoxy group" refers to the group R—O—, where R is an optionally substituted alkyl or optionally substituted cycloalkyl, or R is a group —Y—Z, in which Y is optionally substituted alkylene and Z is optionally substituted alkenyl, optionally substituted alkynyl; or optionally substituted cycloalkenyl, where alkyl, alkenyl, alkynyl, cycloalkyl and cycloalkenyl are as defined herein. Typical alkoxy groups are optionally substituted alkyl-O— and include, by way of example, methoxy, ethoxy, n-propoxy, iso-propoxy, n-butoxy, tert-butoxy, sec-butoxy, n-pentoxy, n-hexoxy, 1,2-dimethylbutoxy, trifluoromethoxy, and the like.

The term "alkylthio group" refers to the group R$_S$—S—, where R$_S$ is as defined for alkoxy.

The term "aminocarbonyl" refers to the group —C(O)NR$_N$R$_N$ where each R$_N$ is independently hydrogen, alkyl, aryl, heteroaryl, heterocyclyl or where both R$_N$ groups are joined to form a heterocyclic group (e.g., morpholino). Unless otherwise constrained by the definition, all substituents may optionally be further substituted by 1-3 substituents chosen from alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2.

The term "acylamino" refers to the group —NR$_{NCO}$C(O)R where each R$_{NCO}$ is independently hydrogen, alkyl, aryl, heteroaryl, or heterocyclyl. Unless otherwise constrained by the definition, all substituents may optionally be further substituted by 1-3 substituents chosen from alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2.

The term "acyloxy" refers to the groups —O(O)C-alkyl, —O(O)C-cycloalkyl, —O(O)C-aryl, —O(O)C-heteroaryl, and —O(O)C-heterocyclyl. Unless otherwise constrained by the definition, all substituents may be optionally further substituted by alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2.

The term "aryloxy group" refers to the group aryl-O— wherein the aryl group is as defined above, and includes optionally substituted aryl groups as also defined above.

The term "heteroaryloxy" refers to the group heteroaryl-O—.

The term "amino" refers to the group —NH$_2$.

The term "substituted amino" refers to the group —NR$_w$R$_w$ where each R$_w$ is independently selected from the group consisting of hydrogen, alkyl, cycloalkyl, carboxyalkyl (for example, benzyloxycarbonyl), aryl, heteroaryl and heterocyclyl provided that both R$_w$ groups are not hydrogen, or a group —Y—Z, in which Y is optionally substituted alkylene and Z is alkenyl, cycloalkenyl, or alkynyl. Unless otherwise constrained by the definition, all substituents may optionally be further substituted by 1-3 substituents chosen from alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2.

The term "carboxy" refers to a group —C(O)OH. The term "carboxyalkyl group" refers to the groups —C(O)O-alkyl or —C(O)O-cycloalkyl, where alkyl and cycloalkyl, are as defined herein, and may be optionally further substituted by alkyl, alkenyl, alkynyl, alkoxy, halogen, CF$_3$, amino, substituted amino, cyano, and —S(O)$_n$R$_{SO}$, in which R$_{SO}$ is alkyl, aryl, or heteroaryl and n is 0, 1 or 2.

The terms "substituted cycloalkyl group" or "substituted cycloalkenyl group" refer to cycloalkyl or cycloalkenyl groups having 1, 2, 3, 4 or 5 substituents, and typically 1, 2, or 3 substituents, selected from the group consisting of alkyl, alkenyl, alkynyl, alkoxy, cycloalkyl, cycloalkenyl, acyl, acylamino, acyloxy, amino, aminocarbonyl, alkoxycarbonylamino, azido, cyano, halogen, hydroxy, keto, thiocarbonyl, carboxy, carboxyalkyl, arylthio, heteroarylthio, heterocyclylthio, thiol, alkylthio, aryl, aryloxy, heteroaryl, aminosulfonyl, aminocarbonylamino, heteroaryloxy, heterocyclyl, heterocyclooxy, hydroxyamino, alkoxyamino, nitro, —SO-alkyl, —SO-aryl, —SO-heteroaryl, —SO$_2$-alkyl, SO$_2$-aryl and —SO$_2$-heteroaryl. Unless otherwise constrained by the definition, all substituents may optionally be further substituted by 1, 2, or 3 substituents chosen from alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2.

The term "conjugated group" is defined as a linear, branched or cyclic group, or combination thereof, in which p-orbitals of the atoms within the group are connected via delocalization of electrons and wherein the structure can be described as containing alternating single and double or triple bonds and may further contain lone pairs, radicals, or carbenium ions. Conjugated cyclic groups may comprise both aromatic and non-aromatic groups, and may comprise polycyclic or heterocyclic groups, such as diketopyrrolopyrrole. Ideally, conjugated groups are bound in such a way as to continue the conjugation between the thiophene moieties they connect. In some embodiments, "conjugated groups" is limited to conjugated groups having three to 30 carbon atoms.

The term "halogen," "halo," or "halide" may be referred to interchangeably and refer to fluoro, bromo, chloro, and iodo.

The term "heterocyclyl" refers to a monoradical saturated or partially unsaturated group having a single ring or multiple condensed rings, having from 1 to 40 carbon atoms and from 1 to 10 hetero atoms, typically 1, 2, 3 or 4 heteroatoms, selected from nitrogen, sulfur, phosphorus, and/or oxygen within the ring. Heterocyclic groups can have a single ring or multiple condensed rings, and include tetrahydrofuranyl, morpholino, piperidinyl, piperazino, dihydropyridino, and the like.

Unless otherwise constrained by the definition for the heterocyclyl substituent, such heterocyclyl groups can be optionally substituted with 1, 2, 3, 4 or 5, and typically 1, 2 or 3 substituents, selected from the group consisting of alkyl, alkenyl, alkynyl, alkoxy, cycloalkyl, cycloalkenyl, acyl, acylamino, acyloxy, amino, aminocarbonyl, alkoxycarbonylamino, azido, cyano, halogen, hydroxy, keto, thiocarbonyl, carboxy, carboxyalkyl, arylthio, heteroarylthio, heterocyclylthio, thiol, alkylthio, aryl, aryloxy, heteroaryl, aminosulfonyl, aminocarbonylamino, heteroaryloxy, heterocyclyl, heterocyclooxy, hydroxyamino, alkoxyamino, nitro, —SO-alkyl, —SO-aryl, —SO-heteroaryl, —SO$_2$-alkyl, —SO$_2$-aryl and —SO$_2$-heteroaryl. Unless otherwise constrained by the definition, all substituents may optionally be further substituted by 1-3 substituents chosen from alkyl, carboxy, carboxyalkyl, aminocarbonyl, hydroxy, alkoxy, halogen, $CF_3$, amino, substituted amino, cyano, and $—S(O)_n R_{SO}$, where $R_{SO}$ is alkyl, aryl, or heteroaryl and n is 0, 1 or 2.

The term "thiol" refers to the group —SH. The term "substituted alkylthio" refers to the group —S-substituted alkyl. The term "arylthiol group" refers to the group aryl-S—, where aryl is as defined as above. The term "heteroarylthiol" refers to the group —S-heteroaryl wherein the heteroaryl group is as defined above including optionally substituted heteroaryl groups as also defined above.

The term "sulfoxide" refers to a group $—S(O)R_{SO}$, in which $R_{SO}$ is alkyl, aryl, or heteroaryl. The term "substituted sulfoxide" refers to a group $—S(O)R_{SO}$, in which $R_{SO}$ is substituted alkyl, substituted aryl, or substituted heteroaryl, as defined herein. The term "sulfone" refers to a group $—S(O)_2R_{SO}$, in which $R_{SO}$ is alkyl, aryl, or heteroaryl. The term "substituted sulfone" refers to a group $—S(O)_2R_{SO}$, in which $R_{SO}$ is substituted alkyl, substituted aryl, or substituted heteroaryl, as defined herein.

The term "keto" refers to a group —C(O)—. The term "thiocarbonyl" refers to a group —C(S)—.

As used herein, the term "room temperature" is 20° C. to 25° C.

Disclosed are compounds, compositions, and components that can be used for, can be used in conjunction with, can be used in preparation of, or are products of the disclosed methods and compositions. These and other materials are disclosed herein, and it is understood that when combinations, subsets, interactions, groups, etc. of these materials are disclosed that while specific reference of each various individual and collective combinations and permutation of these compounds may not be explicitly disclosed, each is specifically contemplated and described herein. Thus, if a class of molecules A, B, and C are disclosed as well as a class of molecules D, E, and F and an example of a combination molecule, A-D is disclosed, then even if each is not individually recited, each is individually and collectively contemplated. Thus, in this example, each of the combinations A-E, A-F, B-D, B-E, B-F, C-D, C-E, and C-F are specifically contemplated and should be considered disclosed from disclosure of A, B, and C; D, E, and F; and the example combination A-D. Likewise, any subset or combination of these is also specifically contemplated and disclosed. Thus, for example, the sub-group of A-E, B-F, and C-E are specifically contemplated and should be considered disclosed from disclosure of A, B, and C; D, E, and F; and the example combination A-D. This concept applies to all aspects of this disclosure including, but not limited to, steps in methods of making and using the disclosed compositions. Thus, if there are a variety of additional steps that can be performed it is understood that each of these additional steps can be performed with any specific embodiment or combination of embodiments of the disclosed methods, and that each such combination is specifically contemplated and should be considered disclosed.

A weight percent of a component, unless specifically stated to the contrary, is based on the total weight of the formulation or composition in which the component is included.

Organic semiconductors as functional materials may be used in a variety of applications including, for example, printed electronics, organic transistors, including organic thin-film transistors (OTFTs) and organic field-effect transistors (OFETs), organic light-emitting diodes (OLEDs), organic integrated circuits, organic solar cells, and disposable sensors. Organic transistors may be used in many applications, including smart cards, security tags, and the backplanes of flat panel displays. Organic semiconductors may substantially reduce cost compared to inorganic counterparts, such as silicon. Depositing OSCs from solution may enable fast, large-area fabrication routes such as various printing methods and roll-to-roll processes.

Organic thin-film transistors are particularly interesting because their fabrication processes are less complex as compared with conventional silicon-based technologies. For example, OTFTs generally rely on low temperature deposition and solution processing, which, when used with semiconducting conjugated polymers, can achieve valuable technological attributes, such as compatibility with simple-write printing techniques, general low-cost manufacturing approaches, and flexible plastic substrates. Other potential applications for OTFTs include flexible electronic papers, sensors, memory devices (e.g., radio frequency identification cards (RFIDs)), remote controllable smart tags for supply chain management, large-area flexible displays, and smart cards.

Organic Semiconductor (OSC) Polymer

An OSC polymer may be used to produce organic semiconductor devices. In some examples, a polymer blend comprises an organic semiconductor polymer. In some examples, the OSC polymer has a main backbone that is fully conjugated. In some examples, the OSC is a diketopyrrolopyrrole (DPP) fused thiophene polymeric material. In some examples, the fused thiophene is beta-substituted. This OSC may contain both fused thiophene and diketopyrrolopyrrole units. In some examples, the OSC is used in OTFT applications.

In some examples, the DPP-fused thiophene polymeric material may be modified with long linear and/or branched alkyl side chains to improve solution processing characteristics (e.g., solubility and non-gelling in commonly used organic solvents (see below). Polymeric materials comprising both linear alkyl side chains and branched alkyl side chains may benefit from the advantages of each. For example, better intermolecular stacking of linear alkyl side chain-substituted OSC polymers leads to excellent good OTFT performance, while better solubility of branched alkyl side chain-substituted OSC polymers minimizes gelling and/or reproducibility concerns. In other words, combining the advantageous attributes of the linear alkyl side chains and the branched alkyl side chains in the DPP-fused thiophene polymeric material allows for improved solution processing during formation of the organic semiconductor device (e.g., OTFT).

Thus, in some examples, the OSC polymer is a diketopyrrolopyrrole (DPP)-fused thiophene polymeric material comprising a first linear alkyl-substituted DPP portion and a second branched alkyl-substituted DPP portion ("cross-bred OSC polymers"), whereby the first linear alkyl-substituted DPP portion and the second branched alkyl-substituted DPP portion may comprise, independently, the repeat unit of Formula 1 or Formula 2, or a salt, isomer, or analog thereof:

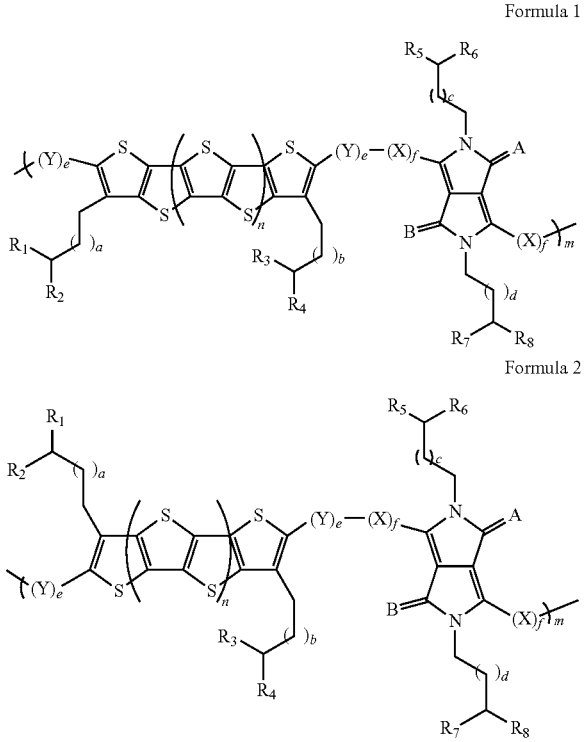

Formula 1

Formula 2 wherein in Formula 1 and Formula 2: m is an integer greater than or equal to one; n is 0, 1, or 2; $R_1$, $R_2$, $R_3$, $R_4$, $R_5$, $R_6$, $R_7$, and $R_8$, may be, independently, hydrogen, substituted or unsubstituted $C_4$ or greater alkyl, substituted or unsubstituted $C_4$ or greater alkenyl, substituted or unsubstituted $C_4$ or greater alkynyl, or $C_5$ or greater cycloalkyl; a, b, c, and d are independently, integers greater than or equal to 3; e and f are integers greater than or equal to zero; X and Y are, independently a covalent bond, an optionally substituted aryl group, an optionally substituted heteroaryl, an optionally substituted fused aryl or fused heteroaryl group, an alkyne or an alkene; and A and B may be, independently, either S or O, with the provisos that: (i) at least one of $R_1$ or $R_2$; one of $R_3$ or $R_4$; one of $R_5$ or $R_6$; and one of $R_7$ or $R_8$ is a substituted or unsubstituted alkyl, substituted or unsubstituted alkenyl, substituted or unsubstituted alkynyl, or cycloalkyl; (ii) if any of $R_1$, $R_2$, $R_3$, or $R_4$ is hydrogen, then none of $R_5$, $R_6$, $R_7$, or $R_8$ are hydrogen; (iii) if any of $R_5$, $R_6$, $R_7$, or $R_8$ is hydrogen, then none of $R_1$, $R_2$, $R_3$, or $R_4$ are hydrogen; (iv) e and f cannot both be 0; (v) if either e or f is 0, then c and d, independently, are integers greater than or equal to 5; and (iv) the polymer having a molecular weight, wherein the molecular weight of the polymer is greater than 10,000.

In some examples, the cross-bred OSC polymer comprises a repeat unit having: the first linear alkyl-substituted DPP portion, the second branched alkyl-substituted DPP portion, and at least one fused thiophene. In some examples, the cross-bred OSC polymer comprises a repeat unit having: the first linear alkyl-substituted DPP portion, the second branched alkyl-substituted DPP portion, and at least two fused thiophenes.

In some embodiments, the OSC polymers defined in Formula 1 or Formula 2 enable simple transistor fabrication at relatively low temperatures, which is particularly important for the realization of large-area, mechanically flexible electronics. A beta-substituted OSC polymer can also help to improve solubility.

In some examples, the polymers of Formulas 3, 4, and/or 5 (or salts, isomers, or analogs thereof) may be used to formulate the cross-bred OSC polymer comprising a linear alkyl-substituted DPP portion and a branched alkyl-substituted DPP portion. For example, the cross-bred OSC polymer may comprise blends of the polymers of Formulas 3 and 4, or blends of the polymers of Formulas 3 and 5, or blends of the polymers of Formulas 4 and 5, or blends of the polymers of Formulas 3-5. In other words, the cross-bred OSC polymer may be: (A) a random copolymer of the repeating unit of the polymers of Formulas 3 and 4, (B) a random copolymer of the repeating unit of the polymers of Formulas 3 and 5, (C) a random copolymer of the repeating unit of the polymers of Formulas 4 and 5, or (D) a random tri-polymer of the repeating unit of the polymers of Formulas 3-5.

Formula 3

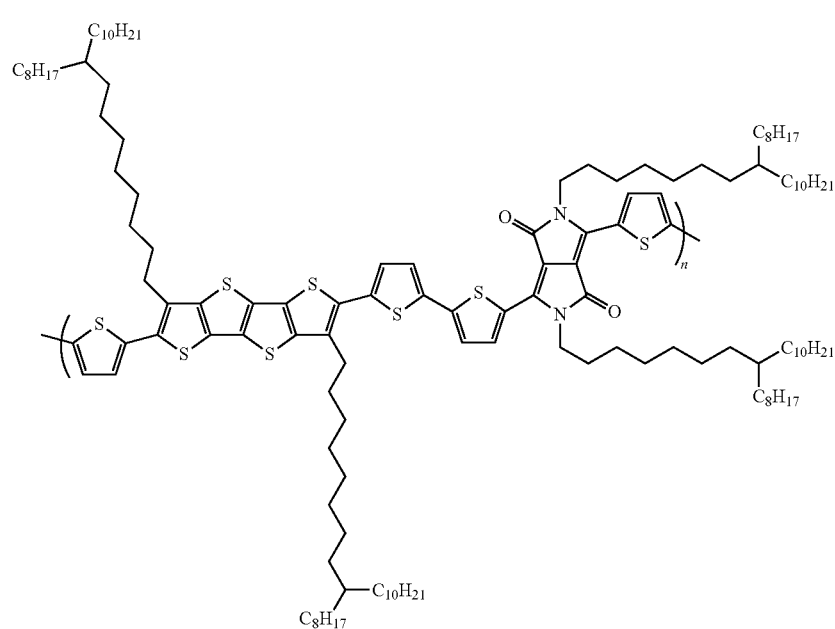

-continued

Formula 4

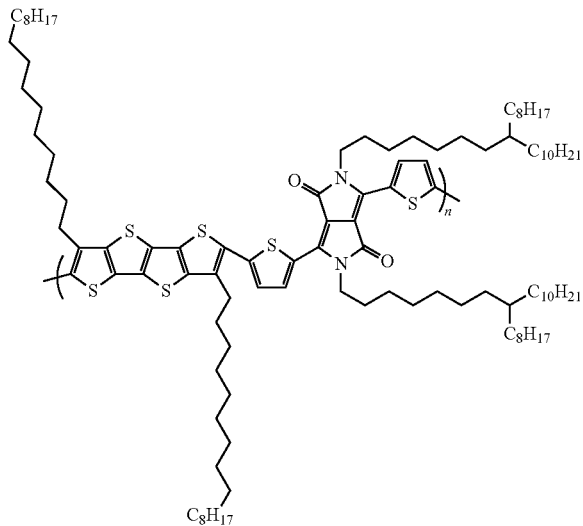

Formula 5

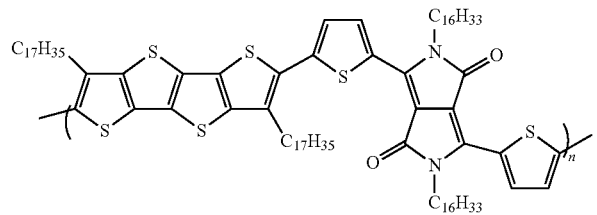

In some examples, the OSC has a solubility of 0.5 mg/mL, 1 mg/mL, 2 mg/mL, 3 mg/mL, 4 mg/mL, 5 mg/mL, or any range defined by any two of those endpoints. In some examples, the OSC has a solubility of 1 mg/mL or more at room temperature.

In some examples, the OSC has hole mobilities of 1 cm$^2$V$^{-1}$s$^{-1}$, 2 cm$^2$V$^{-1}$s, 3 cm$^2$V$^{-1}$s$^{-1}$, 4 cm$^2$V$^{-1}$s$^{-1}$s, 5 cm$^2$V$^{-1}$s$^{-1}$, 10 cm$^2$V$^{-1}$s$^{-1}$, or any range defined by any two of those endpoints. The hole mobilities may be equal to or greater than any of these values. In some examples, the OSC has hole mobilities of 1 to 4 cm$^2$V$^{-1}$s$^{-1}$. In some examples, the OSC has hole mobilities of 2 cm$^2$V$^{-1}$s$^{-1}$. In some examples, the OSC has hole mobilities of 2 cm$^2$V$^{-1}$s$^{-1}$ or more.

In some examples, the OSC polymers have On/Off ratios of greater than 10$^5$. In some examples, the OSC polymers have On/Off ratios of greater than 10$^6$.

In some examples, the OSC polymers have a threshold voltage in thin film transistor devices of 1 V, 2 V, 3V, 4 V, 5 V, 10 V, or any range defined by any two of those endpoints. In some examples, the OSC polymers have a threshold voltage in a range of 1 V to 3 V in thin film transistor devices. In some examples, the OSC polymers have a threshold voltage of 2 V in thin film transistor devices.

In some examples, a method of making a cross-bred organic semiconductor (OSC) polymer, comprises: reacting a first fused thiophene monomer with a first linear alkyl-substituted DPP monomer to form a first DPP-fused thiophene portion; reacting a second fused thiophene monomer with a second branched alkyl-substituted DPP monomer to form a second DPP-fused thiophene portion; and at least one of: reacting the first DPP-fused thiophene portion and the second DPP-fused thiophene portion; reacting the first DPP-fused thiophene portion with itself, and reacting the second DPP-fused thiophene portion with itself, wherein the fused thiophene is beta-substituted, and wherein the cross-bred OSC polymer comprises both the first DPP-fused thiophene portion and the second DPP-fused thiophene portion.

In some examples, the step of reacting the first fused thiophene monomer with the first linear alkyl-substituted DPP monomer comprises:

Reaction 1

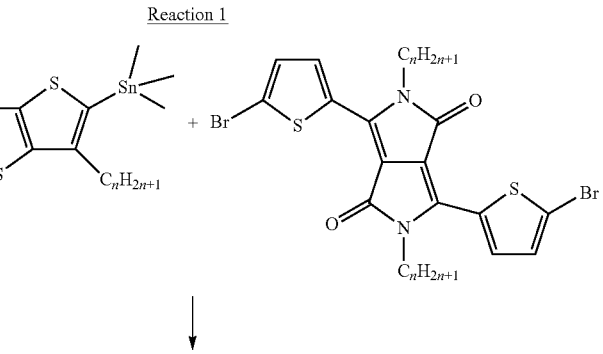

-continued
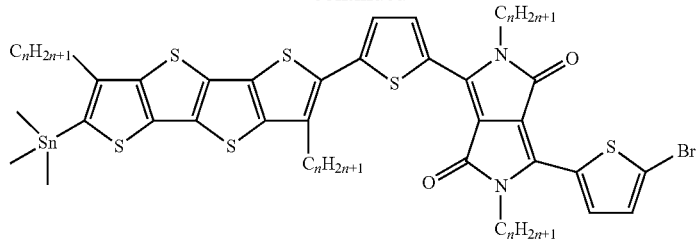
where n is at least 4.
In some examples, the step of reacting the second fused thiophene monomer with the second branched alkyl-substituted DPP monomer comprises:
Reaction 2
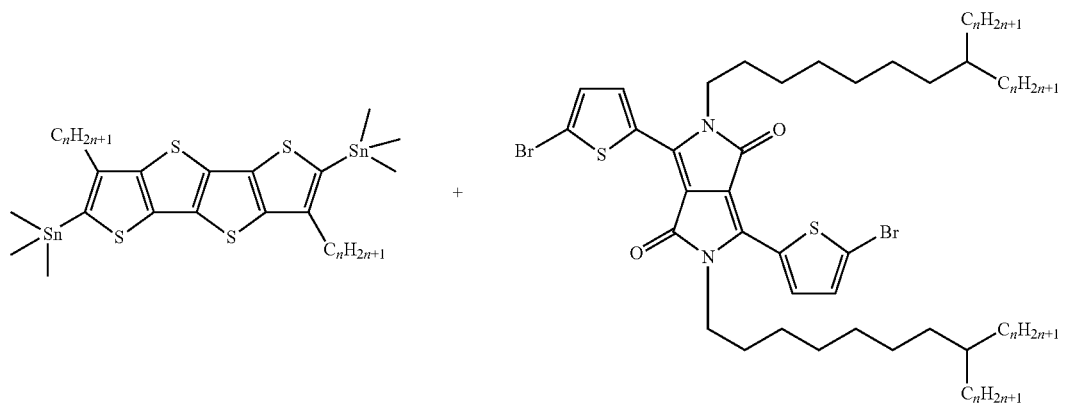
↓
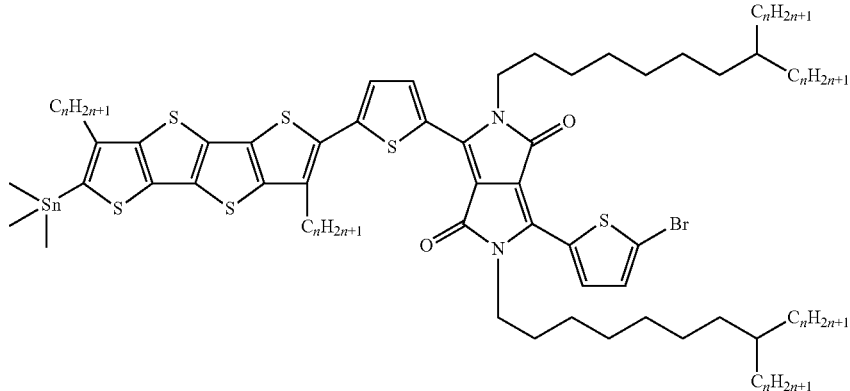
where n is at least 4.
In some examples, the step of reacting the first DPP-fused thiophene portion and the second DPP-fused thiophene portion comprises:

Reaction 3

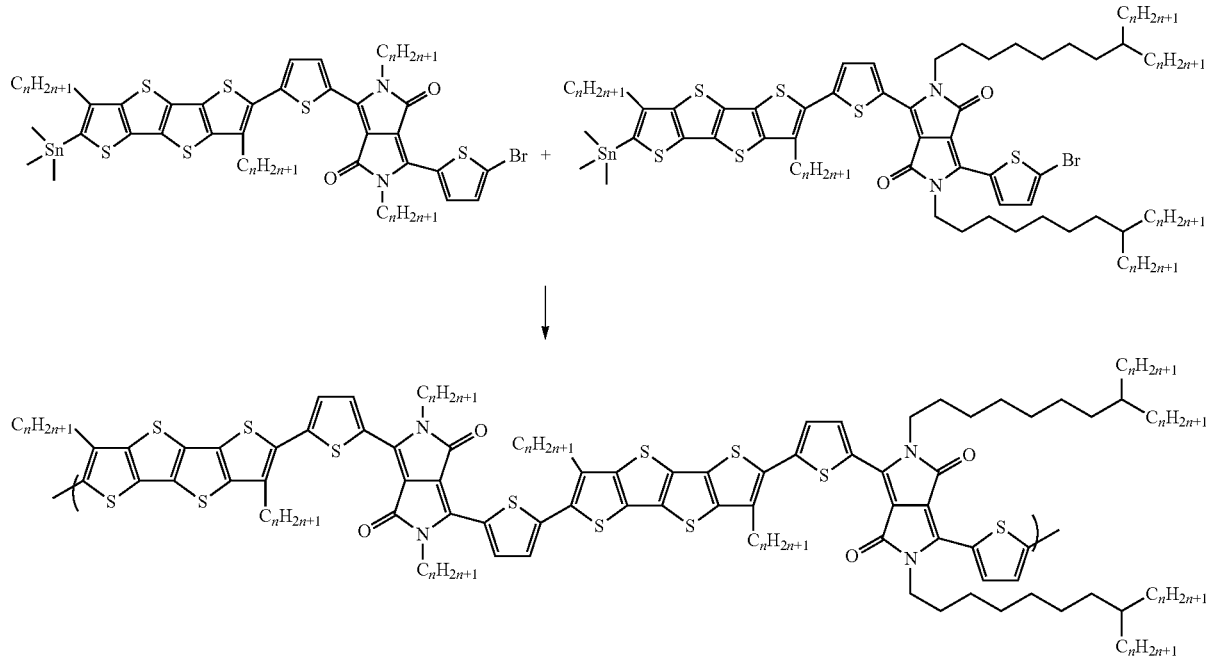

where n is at least 4.

In some examples, the step of reacting the first fused thiophene monomer with the first linear alkyl-substituted DPP monomer; and the step of reacting the second fused thiophene monomer with the second branched alkyl-substituted DPP monomer; and the at least one of: reacting the first DPP-fused thiophene portion and the second DPP-fused thiophene portion; reacting the first DPP-fused thiophene portion with itself; and reacting the second DPP-fused thiophene portion with itself is conducted in a batch reactor vessel.

In one aspect, which is combinable with any of the other aspects or embodiments, the method further comprises: mixing the first fused thiophene monomer, the first linear alkyl-substituted DPP monomer, the second fused thiophene monomer, and the second branched alkyl-substituted DPP monomer together in a batch reactor vessel.

In some examples, the first fused thiophene monomer is the same as the second fused thiophene monomer. In some examples, the first fused thiophene monomer is different from the second fused thiophene monomer.

In some examples, the steps of: (1) reacting the first fused thiophene monomer with the first linear alkyl-substituted DPP monomer; (2) reacting the second fused thiophene monomer with the second branched alkyl-substituted DPP monomer; and (3) at least one of: reacting the first DPP-fused thiophene portion and the second DPP-fused thiophene portion; reacting the first DPP-fused thiophene portion with itself; and reacting the second DPP-fused thiophene portion with itself comprises:

Reaction 4

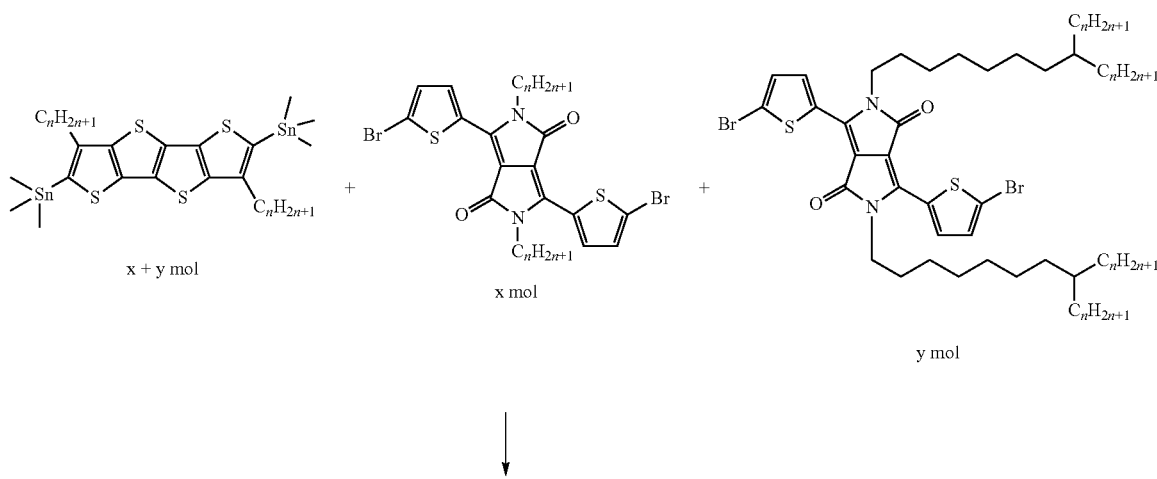

-continued

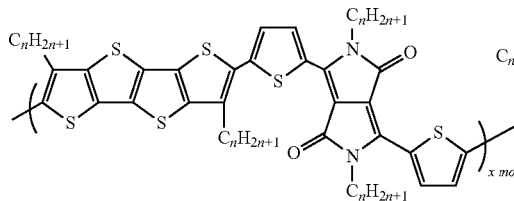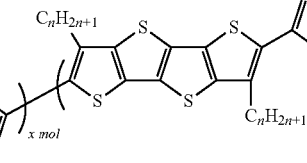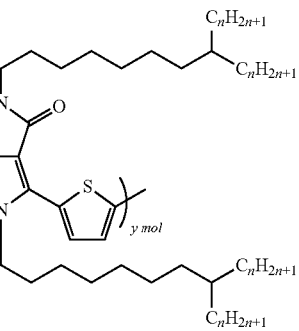

where n is at least 4, x is at least 1, y is at least 1.

While the above synthesis mechanism for the cross-bred organic semiconductor polymer (Reactions 1-4) is described as a Stille coupling reaction, other palladium-catalyzed coupling reaction schemes may also be used (e.g., Suzuki-Miyaura coupling, Negishi coupling, Kumada coupling, Hiyama coupling, Sonogashira coupling, Mizoroki-Heck coupling, Buchwald-Hartwig coupling, direct (hetero) arylation, etc.), as well as non-palladium catalyzed reaction schemes (e.g., Grignard reaction, etc.).

Moreover, the donors and/or acceptors are not limited to side chain branching (as shown in Reactions 1-4), but may also include core structures of the donors/acceptors, side chain chemistry (e.g., alkyls, ethers, esters, siloxanes, urethanes, etc.), side chain terminal functionalities (e.g., alkyl, acrylates, epoxides, oxetanes, alkenes, alkynes, azides, thiols, allyloxysilanes, phenols/alcohols, anhydrides, amines, cyanate esters, isocyanate esters, silyl hydrides, cinnamate/coumarin, fluorosulfates, silyl ethers, etc.), among others.

Crosslinker

In some examples, a polymer blend comprises at least one organic semiconductor (OSC) polymer and at least one crosslinker, such that the crosslinker includes at least one of: acrylates, epoxides, oxetanes, alkenes, alkynes, azides, thiols, allyloxysilanes, phenols, anhydrides, amines, cyanate esters, isocyanate esters, silyl hydrides, cinnamates, coumarins, fluorosulfates, silyl ethers, or a combination thereof. In some examples, the at least one crosslinker comprises C=C bonds, thiols, oxetanes, halides, azides, or combinations thereof.

In some examples, the crosslinker may be a small molecule or a polymer that reacts with the OSC polymer by one or a combination of reaction mechanisms, depending on functional moieties present in the crosslinker molecule. For example, crosslinkers comprising thiol groups may react with double bonds in the OSC polymer via thiol-ene click chemistry. In some examples, crosslinkers comprising vinyl groups may react with double bonds in the OSC polymer via addition reaction. In some examples, crosslinkers (comprising thiols, vinyl groups, etc., or combinations thereof) may react with crosslinkable functionalities incorporated in the side chains of OSC polymers. These include, for example, acrylates, epoxides, oxetanes, alkenes, alkynes, azides, thiols, allyloxysilanes, phenols, anhydrides, amines, cyanate esters, isocyanate esters, silyl hydrides, cinnamates, coumarins, fluorosulfates, silyl ethers, or combinations thereof.

In one aspect, which is combinable with any of the other aspects or embodiments, the at least one crosslinker comprises at least one of: (A) a polymer selected from:

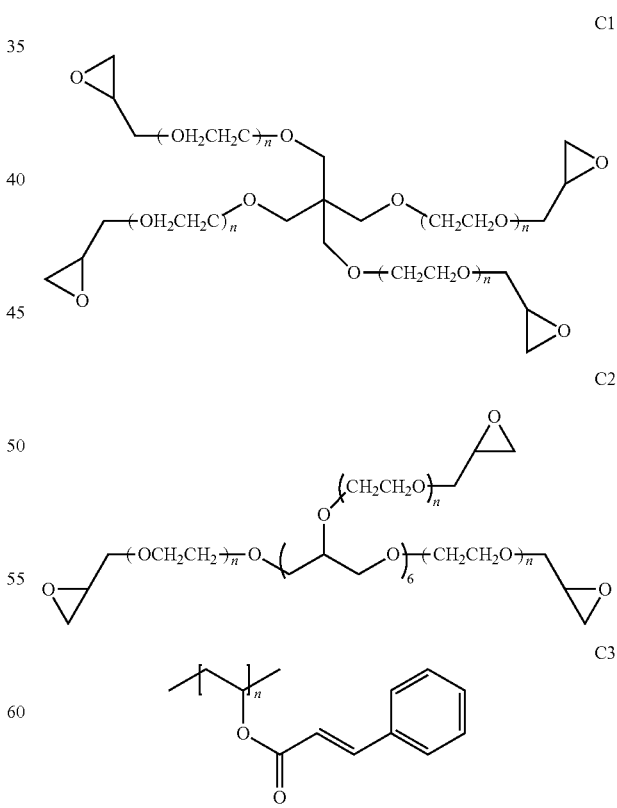

wherein n is an integer greater than or equal to two, or (B) a small-molecule selected from:

| 33 | 34 |
|---|---|
| 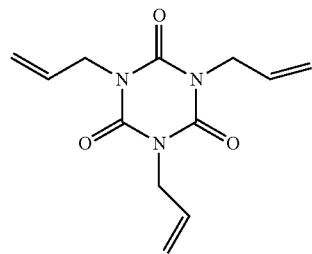 | C4 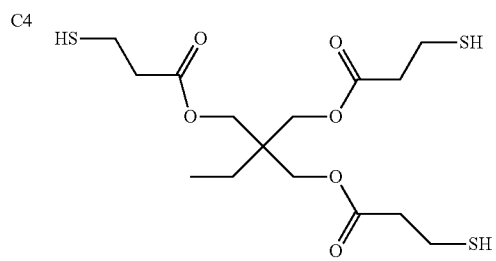 C5 |
| C6 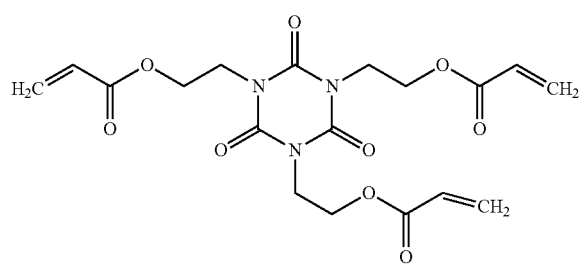 | C7 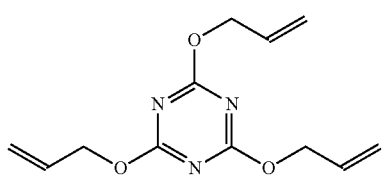 |
| C8 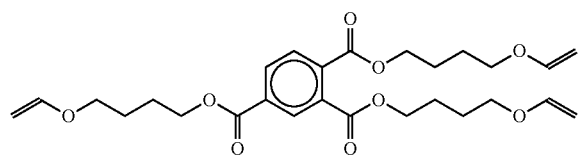 | C9 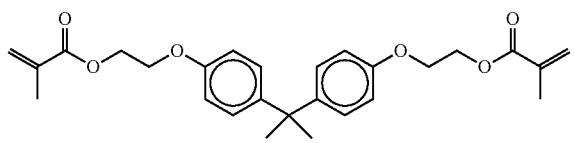 |
| C10 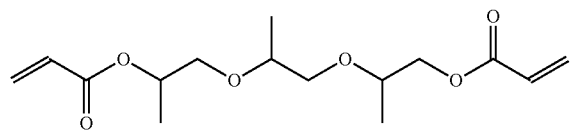 | C11 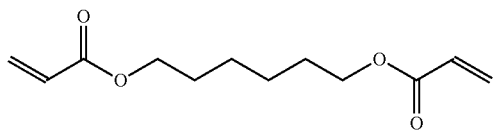 |
| C12  | C13 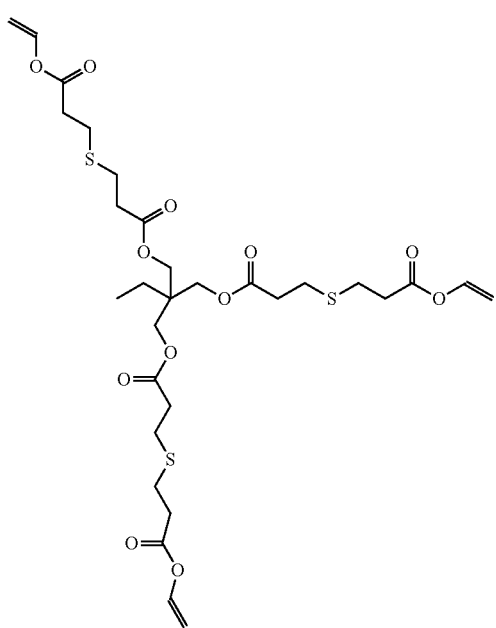 |

-continued
C14
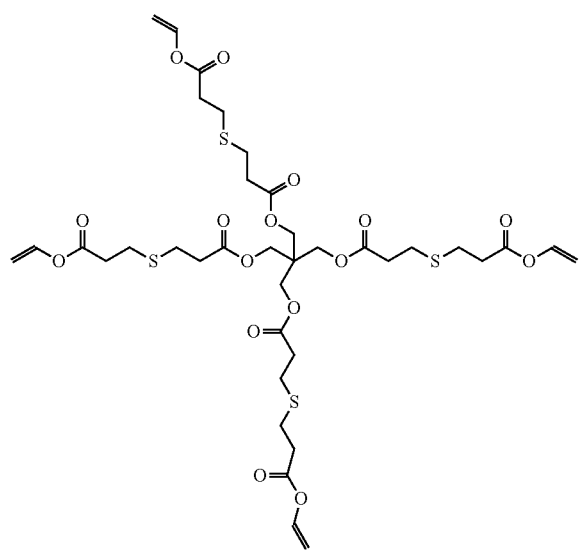
C15
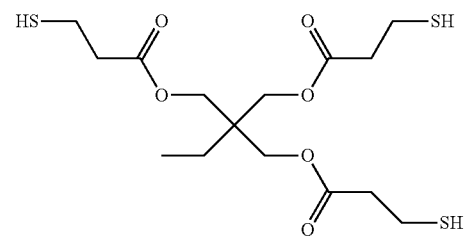
C16
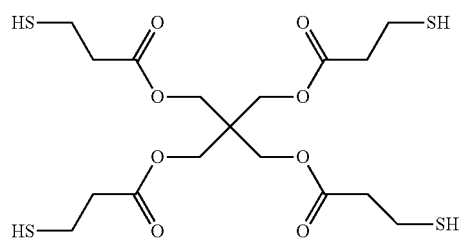
C17
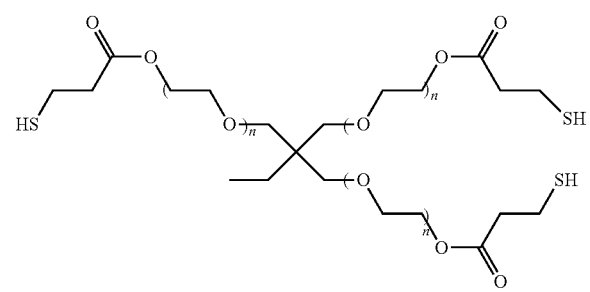
C18
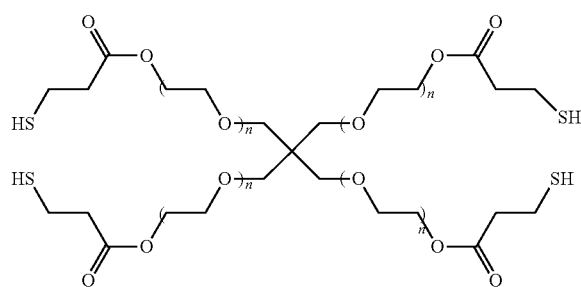
C19
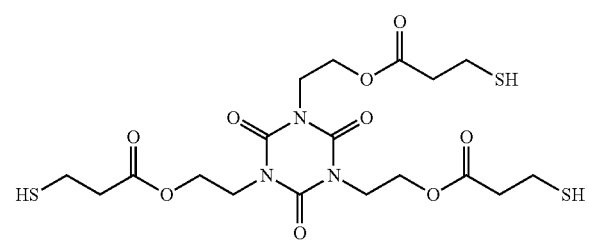
C20
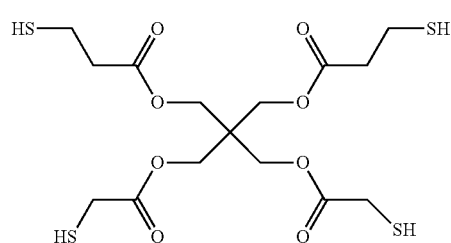

C21
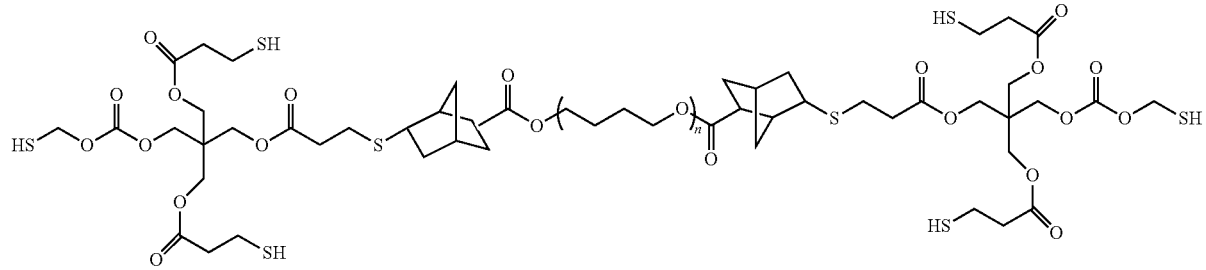
C22
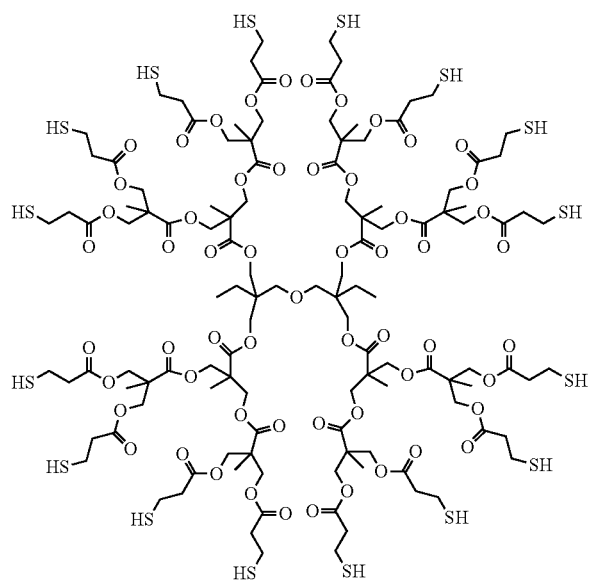
C23
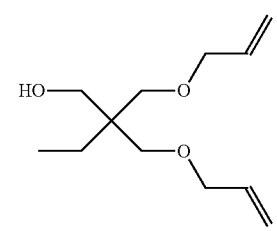
C24
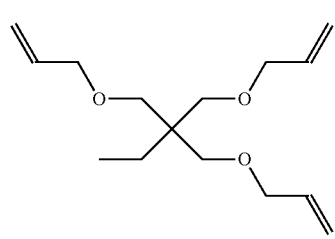
C25
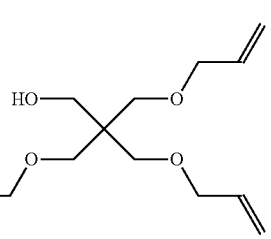
C26
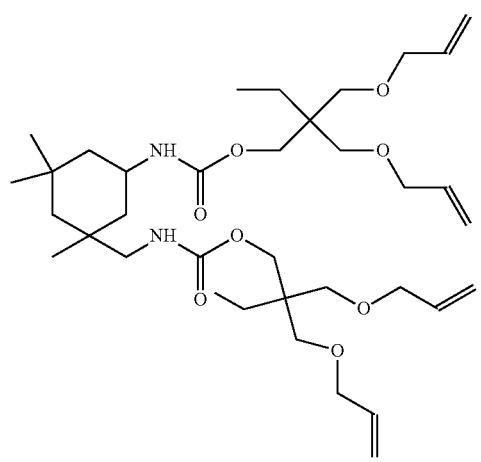
C27
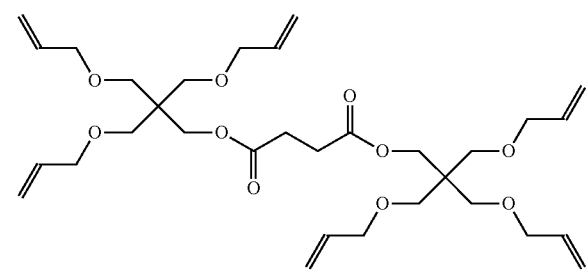

-continued
C28
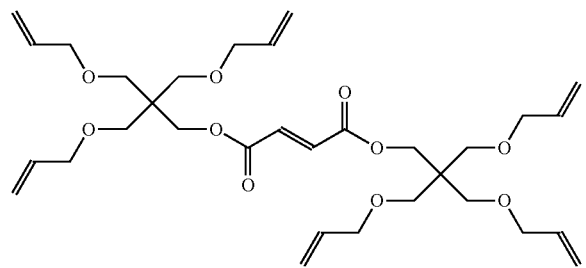
C29
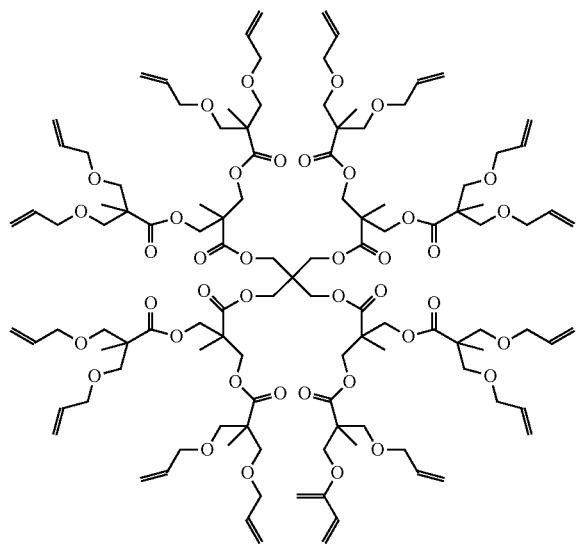
C30
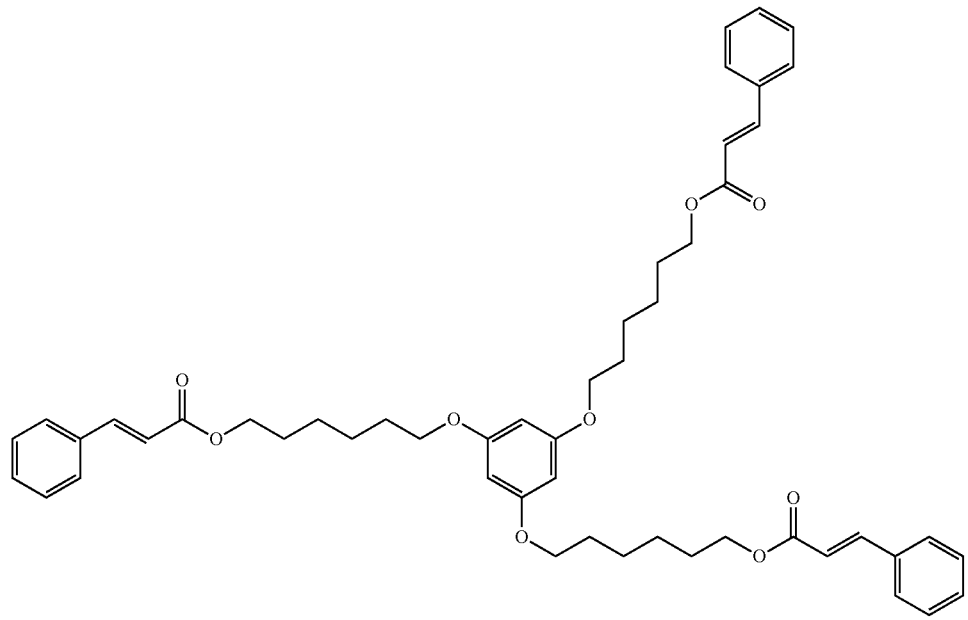
C31
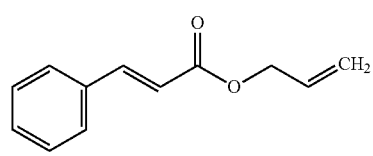
C32
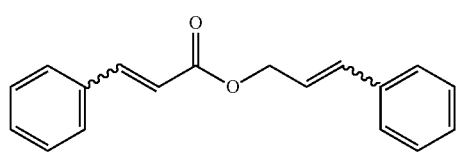
C33
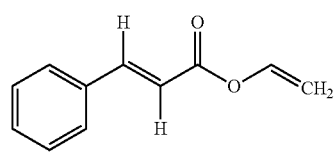
C34
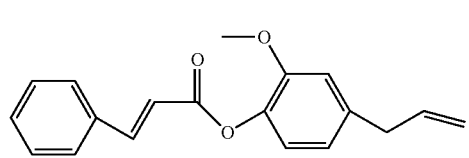

-continued
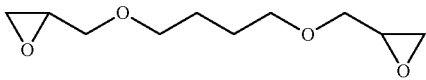
C35 C36
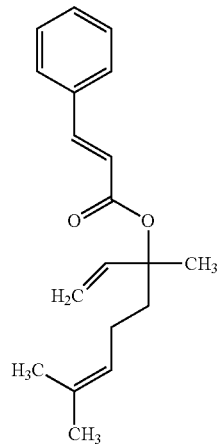
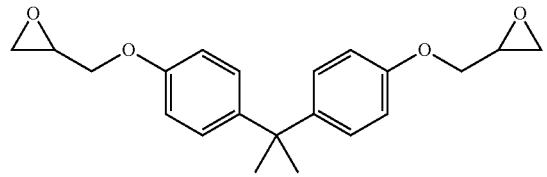
C37
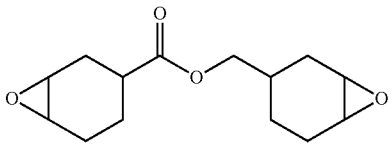
C38
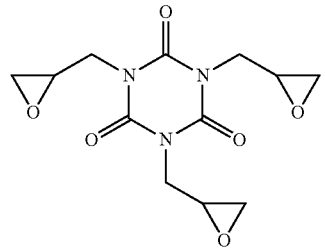
C39
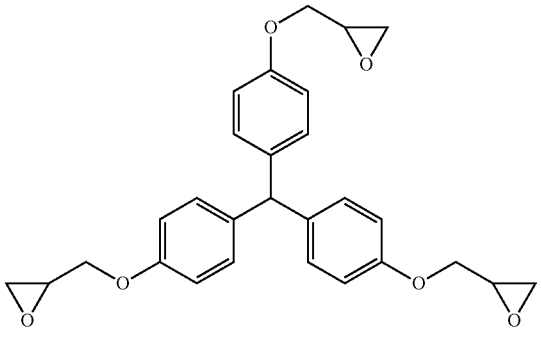
C40
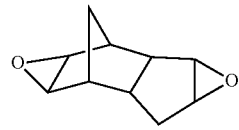
C41
C42
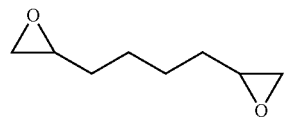
C43
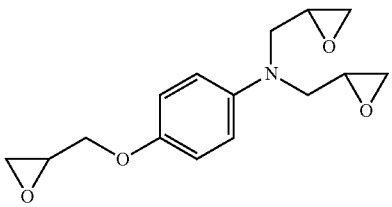
C44
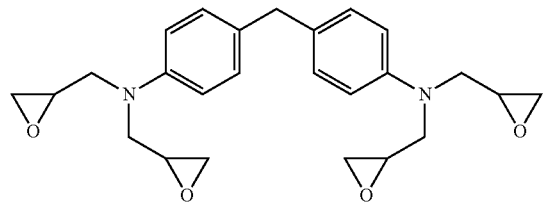
C45
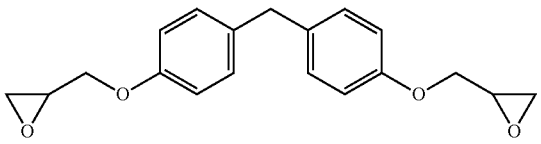
C46

C47
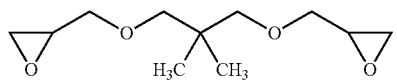

C48
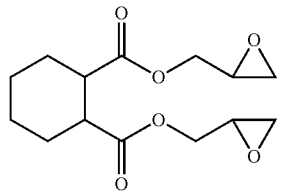

C49
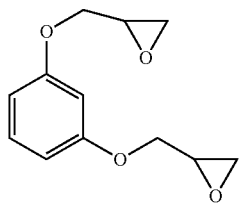

C50
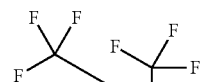

C51
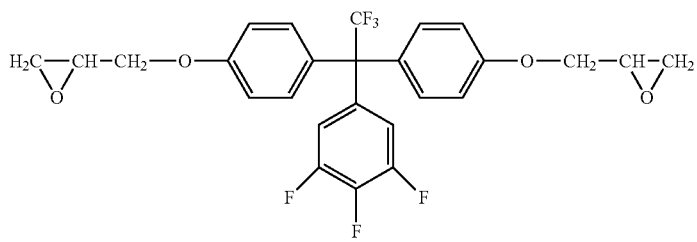

or, (C) a combination thereof.

Photoinitiator

In some examples, a polymer blend comprises at least one OSC polymer, at least one crosslinker, and at least one photoinitiator.

The photoinitiator is a key component of photocuring products. In some examples, the photoinitiator comprises at least one free radical photoinitiator. Free-radical based photoinitiators include reactive free radicals that initiate photopolymerization when exposed to UV light. In one example, the mechanism by which photoinitiator TPO initiates thiol-ene free-radical polymerization is shown below.

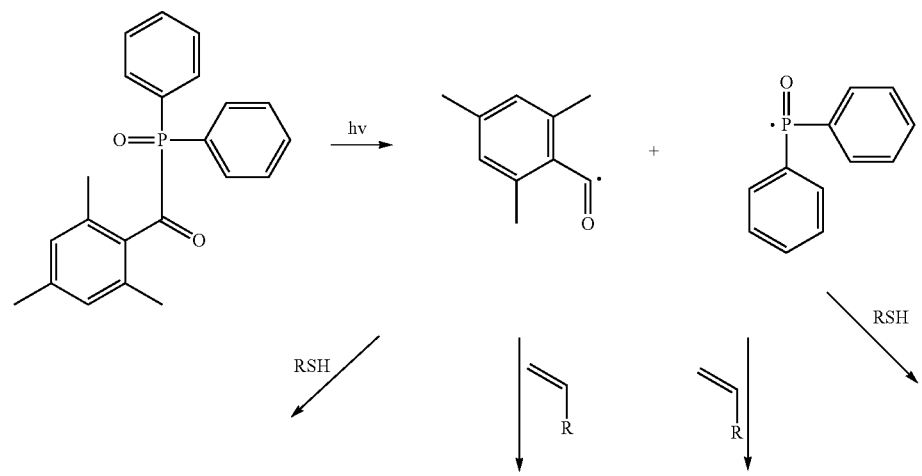

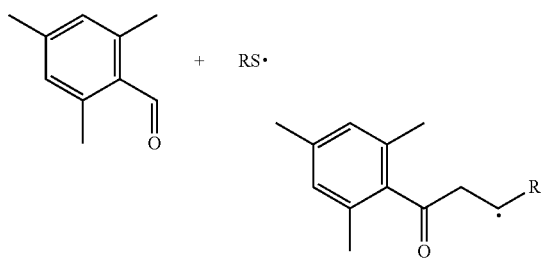

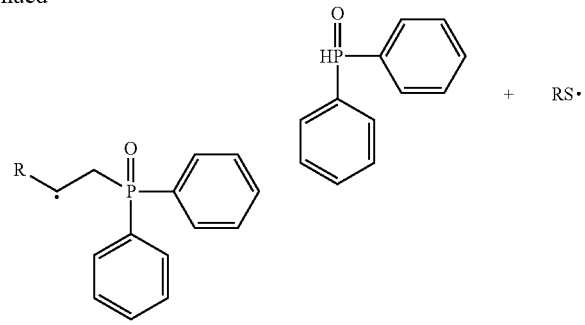

In some examples, the photoinitiator comprises at least one cationic photoinitiator. Cationic photoinitiators are also called photo-acid generators (PAGs). Once a cationic photoinitiator absorbs UV light, the initiator molecule is converted into a strong acid species, either a Lewis or Brönsted acid, that initiates polymerization. Typical photoacids/photoacid generators include aryl diazo salts, diaryliodonium salts, triaryl sulfonium salts, and aryl ferrocenium salts. In one example, the mechanism by which polymerization proceeds in using PAGs is show n below.

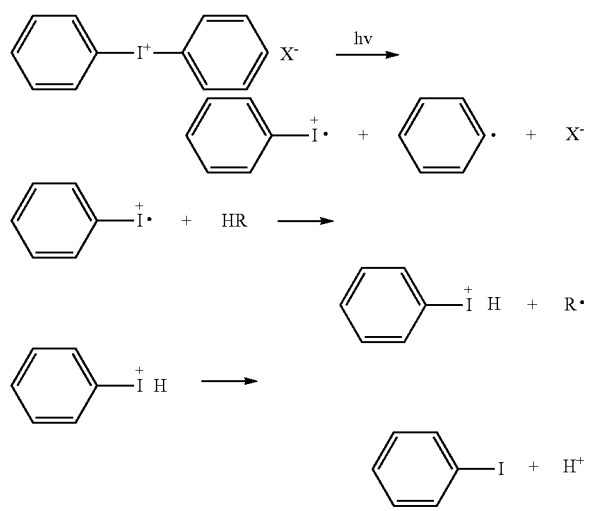

In some examples, the at least one photoinitiator includes: 1-hydroxy-cyclohexyl-phenyl-ketone (184); 2-benzyl-2-dimethylamino-1-(4-morpholinophenyl)-butanone-1 (369); diphenyl(2,4,6-trimethylbenzoyl)phosphine oxide (TPO); 2-isopropyl thioxanthone (ITX); 1-[4-(phenylthio) phenyl]-1,2-octanedione 2-(O-benzyloxime) (HRCURE-OXE01); 2,2-dimethoxy-1,2-diphenylethan-1-one (BDK); benzoyl peroxide (BPO); hydroxyacetophenone (HAP); 2-hydroxy-2-methylprophenone (1173); 2-methyl-4'-(methylthio)-2-morpholinopropiophenone (907); 2-benzyl-2-(dimethylamino)-4'-morpholinobutyrophenone (IHT-PI 910); Ethyl-4-(dimethylamino)benzoate (EDB); methyl o-benzoyl benzoate (OMBB); bis-(2,6 dimethoxy-benzoyl)-phenyl phosphine oxide (BAPO); 4-benzoyl-4' methyldiphenylsulfide (BMS); benzophenone (BP); 1-chloro-4-propoxy thiozanthone (CPTX); chlorothioxanthone (CTX); 2,2-diethoxyacetophenone (DEAP); diethyl thioxanthone (DETX); 2-dimethyl aminoethyl benzonate (DMB); 2,2-dimethoxy-2-phenyl acetophenone (DMPA); 2-ethyl anthraquinone (2-EA); ethyl-para-N,N-dimethyl-dimethylamino lenzoate (EDAB); 2-ethyl hexyl-dimethylaminolenzoate (EHA); 4,4-bis-(diethylamino)-benzophenone (EMK); methyl benzophenone (MBF); 4-methyl benzophenone (MBP); Michler's ketone (MK); 2-methyl-1-[4(methylthiol) phenyl]-2-morpholino propanone (1) (MMMP); 4-phenylbenzophenone (PBZ); 2,4,6-trimethyl-benzoly-ethoxyl phenyl phosphine oxide (TEPO); bis(4-tert-butylphenyl) iodonium perfluoro-1-butanesulfonate; bis(4-tert-butylphenyl) iodonium p-toluenesulfonate; bis(4-tert-butylphenyl) iodonium triflate; boc-methoxyphenyldiphenylsulfonium triflate; (4-tert-Butylphenyl) diphenylsulfonium triflate; diphenyliodonium hexafluorophosphate; diphenyliodonium nitrate; diphenyliodonium p-toluenesulfonate; diphenyliodonium triflate; (4-fluorophenyl) diphenylsulfonium triflate; N-hydroxynaphthalimide triflate; N-hydroxy-5-norbornene-2,3-dicarboximide perfluoro-1-butanesulfonate; (4-iodophenyl) diphenylsulfonium triflate; (4-methoxyphenyl) diphenylsulfonium triflate; 2-(4-Methoxystyryl)-4,6-bis (trichloromethyl)-1,3,5-triazine; (4-methylthiophenyl) methyl phenyl sulfonium triflate; 1-naphthyl diphenylsulfonium triflate; (4-phenoxyphenyl) diphenylsulfonium triflate; (4-phenylthiophenyl) diphenylsulfonium triflate; triarylsulfonium hexafluoroantimonate salts, mixed 50 wt. % in propylene carbonate; triarylsulfonium hexafluorophosphate salts, mixed 50 wt. % in propylene carbonate; triphenylsulfonium perfluoro-1-butanesufonate; triphenylsulfonium triflate; tris(4-tert-butylphenyl) sulfonium perfluoro-1-butanesulfonate; tris(4-tert-butylphenyl)sulfonium triflate; aryl diazo salts; diaryliodonium salts; triaryl sulfonium salts; aryl ferrocenium salts; or combinations thereof.

Structures for representative photoinitiators are shown in Table 1 below.

TABLE 1
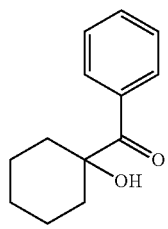 [SMILES: O=C(c1ccccc1)C1(O)CCCCC1]
P1
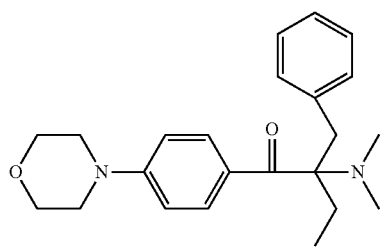 [SMILES: CCC(Cc1ccccc1)(C(=O)c1ccc(N2CCOCC2)cc1)N(C)C]
P2
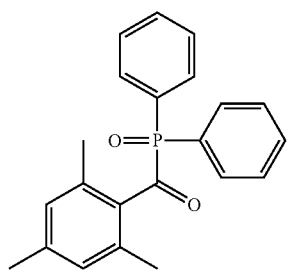 [SMILES: Cc1cc(C)c(C(=O)P(=O)(c2ccccc2)c2ccccc2)c(C)c1]
P3
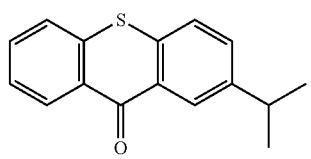 [SMILES: CC(C)c1ccc2sc3ccccc3c(=O)c2c1]
P4
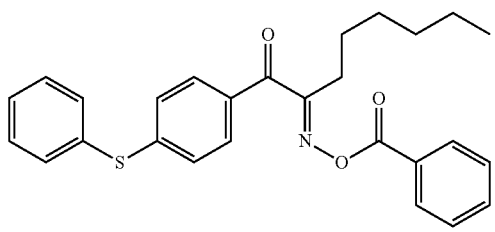 [SMILES: CCCCCC/C(=N\OC(=O)c1ccccc1)C(=O)c1ccc(Sc2ccccc2)cc1]
P5
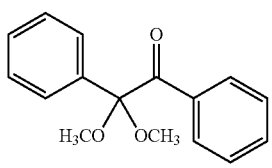 [SMILES: COC(OC)(C(=O)c1ccccc1)c1ccccc1]
P6
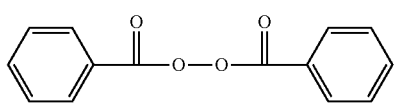
P7
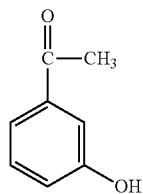
P8

TABLE 1-continued
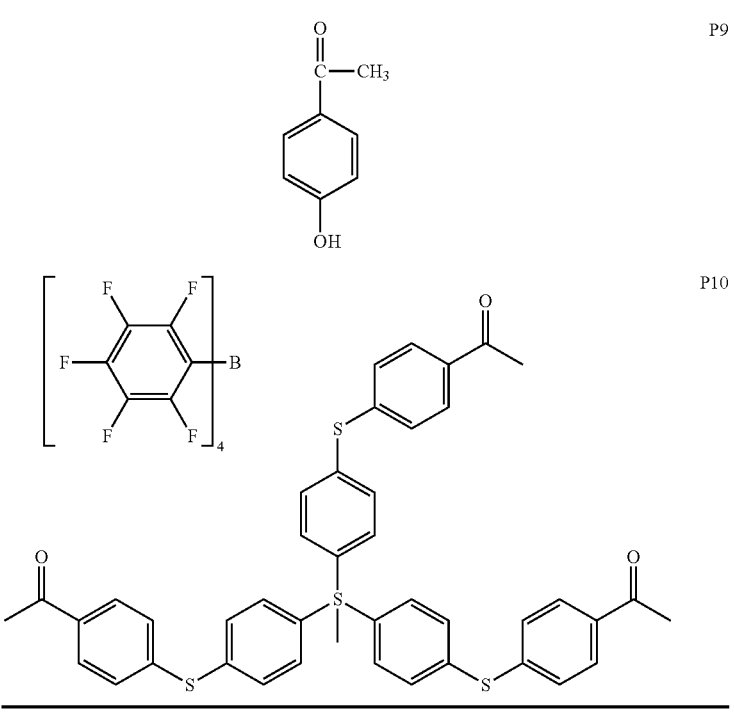
Structures for representative aryl diazo salt, diaryliodonium salt, triaryl sulfonium salt, and aryl ferrocenium salt photoinitiators are shown in Table 2 below.
TABLE 2
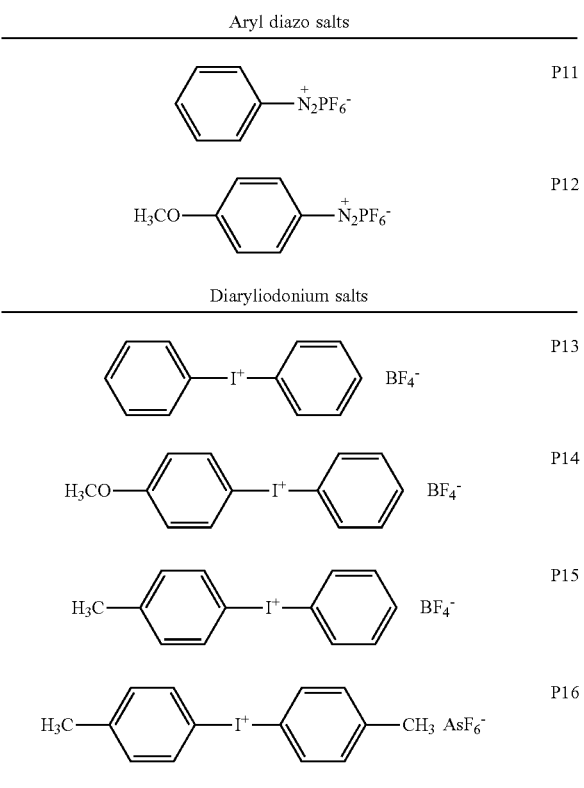
TABLE 2-continued
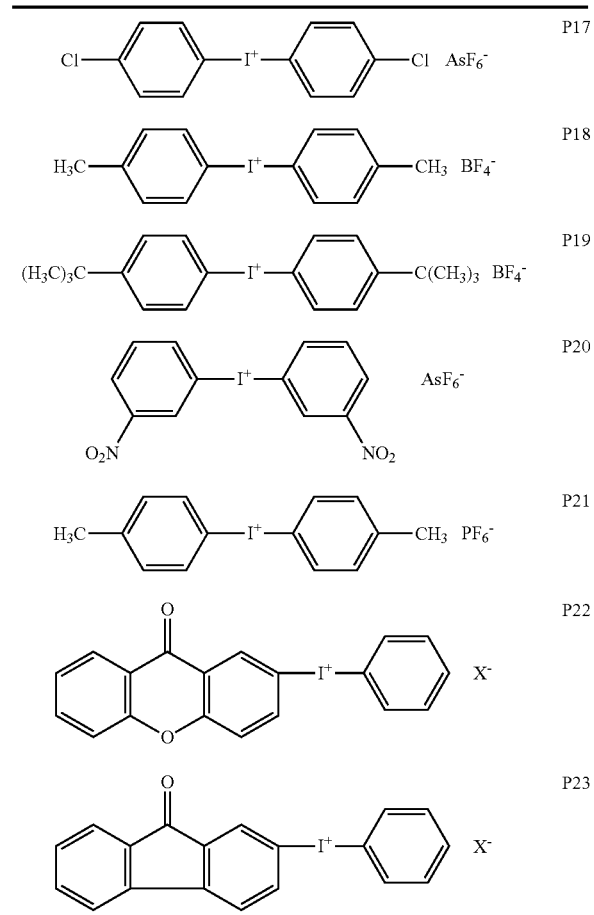

TABLE 2-continued

| | |
|---|---|
| H(2n+1)Cn—O—C6H4—I+—C6H5  SbF6− | P24 |
| C12H25—C6H4—I+—C6H4—C12H25  SbF6− | P25 |
| H3COCHN—C6H4—I+—C6H4—NHCOCH3  AsF6− | P26 |

Triaryl sulfonium salts

| | |
|---|---|
| (C6H5)3S+  PF4− | P27 |
| (C6H5)3S+  BF4− | P28 |
| (C6H5)3S+  AsF6− | P29 |
| PF6−  (C6H5)2S+—C6H4—OCH3 | P30 |
| AsF6−  (C6H5)2S+—C6H4—OCH3 | P31 |
| SbF6−  (C6H5)2S+—C6H4—S—C6H5 | P32 |
| SbF6−  (C6H5)2S+—C6H4—S—C6H4—S+(C6H5)2  SbF6− | P33 |
| (C6H5)3S+  X−  —C6H4—S—C6H5 | P34 |
| BF4−  (C6H5)2S+—C6H4—CH3 | P35 |

TABLE 2-continued

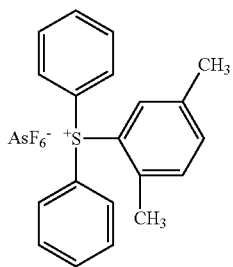
P36

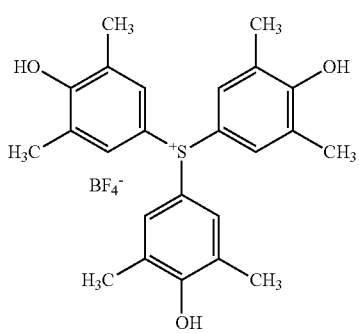
P37

Aryl ferrocenium salt

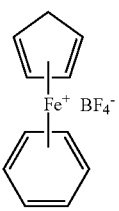
P38

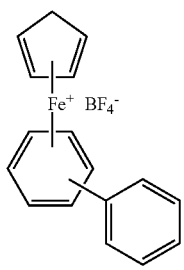
P39

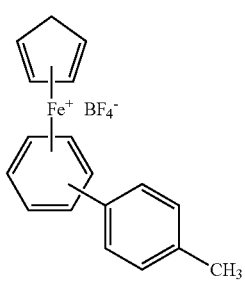
P40

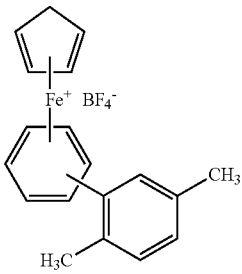
P41

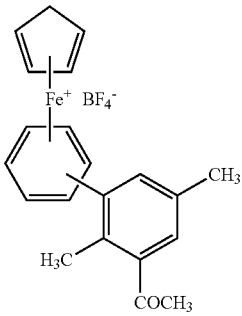
P42

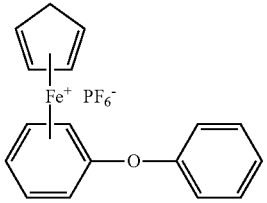
P43

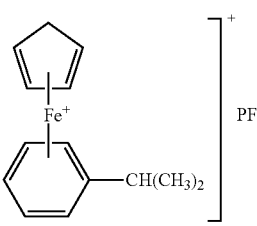
P44

Additives

In some examples, a polymer blend comprises at least one OSC polymer, at least one crosslinker, at least one photoinitiator, and at least one additive, such as antioxidants (i.e., oxygen inhibitors), lubricants, compatibilizers, leveling agents, nucleating agents, or combinations thereof. In some examples, oxygen inhibitors include phenols, thiols, amines, ethers, phosphites, organic phosphines, hydroxylamines, or combinations thereof.

Polymer Blend

In some examples, the performance of a device comprising the OSC polymer may be improved by blending the OSC polymer with a crosslinker. In some examples, the OSC polymer is blended with a crosslinker in a solvent. In some examples, the solvent is chloroform, methylethylketone, toluene, xylenes, chlorobenzene, 1,2-dichlorobenzene, 1,2,4-trichlorobenzene, tetralin, naphthalene, chloronaphthalene, or combinations thereof. In some examples, a mixture of more than one solvent may be used.

In some examples, the at least one OSC polymer is present in a range of 1 wt. % to 99 wt. %, or in a range of 5 wt. % to 95 wt. %, or in a range of 10 wt. % to 90 wt. %, or in a range of 25 wt. % to 85 wt. %, or in a range of 50 wt. % to 80 wt. %. In some examples, the at least one OSC polymer is present at 1 wt. %, or 2 wt. %, or 3 wt. %, or 5 wt. %, or 10 wt. %, or 15 wt. %, or 20 wt. %, or 25 wt. %, or 30 wt. %, or 35 wt. %, or 40 wt. %, or 50 wt. %, or 60 wt. %, or 70 wt. %, or 80 wt. %, or 90 wt. %, or 95 wt. %, or 99 wt. %, or any range defined by any two of those endpoints.

In some examples, the at least one crosslinker is present in a range of 1 wt. % to 99 wt. %, or in a range of 5 wt. % to 95 wt. %, or in a range of 10 wt. % to 90 wt. %, or in a range of 15 wt. % to 85 wt. %, or in a range of 20 wt. % to 80 wt. %, or in a range of 25 wt. % to 75 wt. %, or in a range of 25 wt. % to 65 wt. %, or in a range of 25 wt. % to 55 wt. %. In some examples, the at least one crosslinker is present at 0.1 wt. %, or 0.2 wt. %, or 0.3 wt. %, or 0.5 wt. %, or 0.8 wt. %, or 1 wt. %, or 2 wt. %, or 3 wt. %, or 5 wt. %, or 10 wt. %, or 15 wt. %, or 20 wt. %, or 25 wt. %, or 30 wt. %, or 35 wt. %, or 40 wt. %, or 45 wt. %, or 50 wt. %, or 55 wt. %, or 60 wt. %, or 65 wt. %, or 70 wt. %, or 75 wt. %, or 80 wt. %, or 85 wt. %, or 90 wt. %, or 95 wt. %, or 99 wt. %, or any range defined by any two of those endpoints. In some examples, the at least one crosslinker comprises a first crosslinker and a second crosslinker, the first crosslinker being present in a range of 30 wt. % to 50 wt. % and the second crosslinker being present in a range of 0.5 wt. % to 25 wt. %.

In some examples, the at least one photoinitiator is present in a range of 0.1 wt. % to 10 wt. %; or in a range of 0.2 wt. % to 8 wt. %, or in a range of 0.3 wt. % to 6 wt. %, or in a range of 0.4 wt. % to 5 wt. %, or in a range of 0.5 wt. % to 4.5 wt. %, or in a range of 0.5 wt. % to 4 wt. %, or in a range of 0.6 wt. % to 3.5 wt. %, or in a range of 0.7 wt. % to 3 wt. %. In some examples, the at least one photoinitiator is present at 0.1 wt. %, or 0.2 wt. %, or 0.3 wt. %, or 0.4 wt. %, or 0.5 wt. %, or 0.6 wt. %, or 0.7 wt. %, or 0.8 wt. %, or 0.9 wt. %, or 1 wt. %, or 1.5 wt. %, or 2 wt. %, or 2.5 wt. %, or 3 wt. %, or 3.5 wt. %, or 4 wt. %, or 4.5 wt. %, or 5 wt. %, or 6 wt. %, or 7 wt. %, or 8 wt. %, or 9 wt. %, or 10 wt. %, or any range defined by any two of those endpoints.

In some examples, the at least one OSC polymer is present in a range of 1 wt. % to 99 wt. %; the at least one crosslinker is present in a range of 1 wt. % to 99 wt. %; and the at least one photoinitiator is present in a range of 0.1 wt. % to 10 wt. %. In some examples, the at least one OSC polymer is present in a range of 50 wt. % to 80 wt. %; and the at least one crosslinker is present in a range of 25 wt. % to 55 wt. %.

In some examples, the at least one antioxidant, lubricant, compatibilizer, leveling agent, or nucleating agent may each be present, independently, in a range of 0.05 wt. % to 5 wt. %, or in a range of 0.1 wt. % to 4.5 wt. %, or in a range of 0.2 wt. % to 4 wt. %, or in a range of 0.3 wt. % to 3.5 wt. %, or in a range of 0.4 wt. % to 3 wt. %, or in a range of 0.5 wt. % to 2.5 wt. %. In some examples, the at least one antioxidant, lubricant, compatibilizer, leveling agent, or nucleating agent may each be present, independently, at 0.05 wt. %, or 0.1 wt. %, or 0.2 wt. %, or 0.3 wt. %, or 0.4 wt. %, or 0.5 wt. %, or 0.6 wt. %, or 0.7 wt. %, or 0.8 wt. %, or 0.9 wt. %, or 1 wt. %, or 1.5 wt. %, or 2 wt. %, or 2.5 wt. %, or 3 wt. %, or 3.5 wt. %, or 4 wt. %, or 4.5 wt. %, or 5 wt. %, or any range defined by any two of those endpoints.

In some examples, the blend comprises at least two of: OSC polymers, crosslinkers, photoinitiators, and additives as described herein. In some examples, the blend comprises at least three of: OSC polymers, crosslinkers, photoinitiators, and additives as described herein. In some examples, the blend comprises at least four of: OSC polymers, crosslinkers, photoinitiators, and additives as described herein.

OTFT Device Fabrication

Applications using OTFT devices require patterning of organic semiconducting materials to prevent undesired high off-currents and crosstalk between adjacent devices. Photolithography is a common patterning technique in semiconductor device fabrication. However, photolithography usually involves harsh $O_2$ plasma during pattern transfer or photoresist removal and aggressive developing solvents which may severely damage the OSC layer and lead to significant deterioration of OTFT device performance. In other words, conjugated organic materials tend to degrade when exposed to light and the chemicals used in photolithography may have an adverse effect on organic thin film transistors. Therefore, patterning of organic semiconducting materials using photolithography is not practical. Moreover, currently available patternable semiconducting polymers with photosensitive side groups require time-consuming molecule design and synthesis. These crosslinked polymers may also have adverse effect on OTFT devices, due to reduction of the effective conjugation of the polymer's crosslinked backbone.

FIGS. 1A to 1C illustrate patterning techniques 100 of organic semiconductor blends, according to some embodiments. In a first step (FIG. 1A), a thin film 104 of the blended OSC polymer is deposited over a substrate 102. Optionally, the thin film 104 may be thermally annealed. In some examples, depositing comprises at least one of spin coating; dip coating; spray coating; electrodeposition; meniscus coating; plasma deposition; and roller, curtain and extrusion coating.

The thin film 104 was prepared as a polymer blend described above comprising at least one organic semiconductor (OSC) polymer, at least one crosslinker, and optionally, at least one photoinitiator and at least one additive, wherein the at least one OSC polymer is a diketopyrrolopyrrole-fused thiophene polymeric material, wherein the fused thiophene is beta-substituted, and wherein the crosslinker includes at least one of: acrylates, epoxides, oxetanes, alkenes, alkynes, azides, thiols, allyloxysilanes, phenols, anhydrides, amines, cyanate esters, isocyanate esters, silyl hydrides, cinnamates, coumarins, fluorosulfates, silyl ethers, or a combination thereof.

In some examples, the blending includes dissolving the at least one OSC polymer in a first organic solvent to form a first solution, dissolving the at least one crosslinker in a second organic solvent to form a second solution, and dissolving at least one photoinitiator in a third organic solvent to form a third solution; and combining the first, second, and third solutions in any suitable order to create the polymer blend. In some examples, the first, second, and third solutions may be combined simultaneously. In some examples, the at least one OSC polymer, at least one crosslinker, and at least one photoinitiator may be prepared together in a single organic solvent. The weight compositions of each component of the polymer blend is as provided above.

In some examples, after the thin film of the blended OSC polymer is deposited over the substrate and before exposing the thin film to UV light, the thin film may be heated at a temperature in a range of 50° C. to 200° C. for a time in a range of 10 sec to 10 min to remove excess solvent.

In a second step (FIG. 1B), the thin film 104 was exposed to UV light 108 through a photomask 106 to form a higher crosslinked portion 110 of the thin film 104. In some examples, the exposing comprises exposing the thin film to UV light having an energy in a range of 10 mJ/cm$^2$ to 600 mJ/cm$^2$ (e.g., 400 mJ/cm$^2$) for a time in a range of 1 sec to 60 sec (e.g., 10 sec). In some examples, the UV light may have an energy in a range of 300 mJ/cm$^2$ to 500 mJ/cm$^2$ and be operable for a time in a range of 5 sec to 20 sec. The exposure to UV light operates to change the solubility of the thin film in a subsequent developer solvent solution for pattern formation atop the substrate.

In the step of FIG. 1C, when light exposure is complete, the portion of the thin film 104 not exposed to UV light 108 was stripped using a predetermined solvent 112, thereby leaving the desired pattern 114 into the thin film layer. In other words, the higher crosslinked portion 110 was developed in a solvent to remove an un-patterned region of the thin film 104. In some examples, the developing comprises exposing the un-patterned region of the thin film to a solvent comprising chlorobenzene, 1,2-dichlorobenzene, 1,3-dichlorobenzene, 1,2,4-trichlorobenzene, dioxane, p-xylene, m-xylene, toluene, cyclopentanone, cyclohexanone, methyl lactate, 2-butanone, 2-pentanone, 3-pentanone, 2-heptanone, 3-heptanone, anisole, mesitylene, decalin, butylbenzene, cyclooctane, tetralin, chloroform, or combinations thereof, for a time in a range of 10 sec to 10 min. In some examples, the developer solution comprises chlorobenzene, p-xylene, dioxane, or combinations thereof.

In some examples, after developing the patterned thin film in a solvent to remove the un-patterned region of the thin film, the thin film may be heated at a temperature in a range of 50° C. to 200° C. for a time in a range of 10 sec to 30 min.

Figure 2:
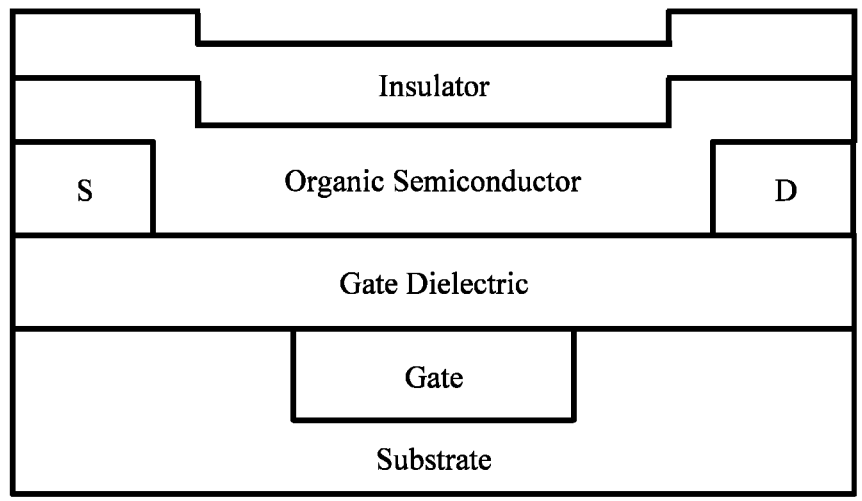
FIGS. 2 and 3 illustrate exemplary OTFT devices, according to some embodiments.
Figure 3:
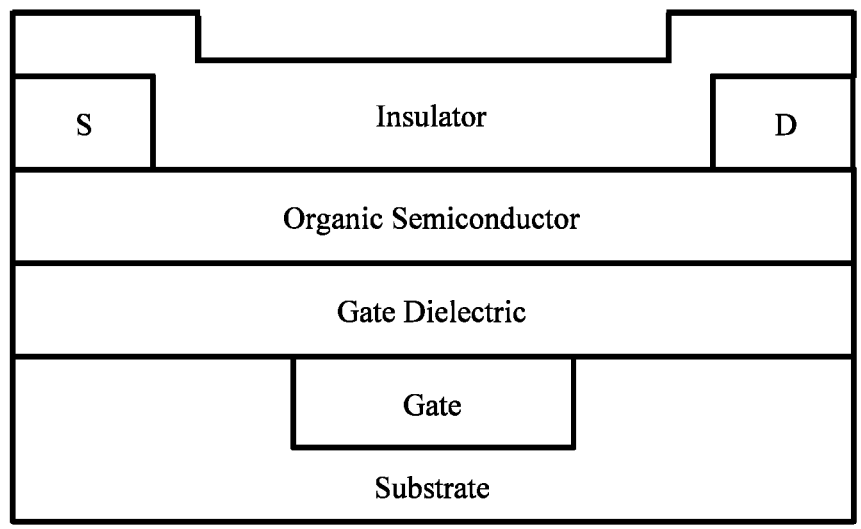

Thereafter, the OTFT devices may be completed by forming a gate electrode over the substrate; forming a gate dielectric layer over the substrate; forming patterned source and drain electrodes over the gate dielectric layer; forming an organic semiconductor active layer over the and gate dielectric layer, and forming an insulator layer over the patterned organic semiconductor active layer. (FIGS. 2 and 3).

EXAMPLES

The embodiments described herein will be further clarified by the following examples.

Example 1—Synthesis of Cross-Bred OSC Polymer

Example 1 is based on the OFET structure as shown in FIG. 3.

In a first step, predetermined amounts of linear alkyl-substituted DPP monomer ('x' mol), branched alkyl-substituted DPP monomer ('y' mol), and fused thiophene monomer ('x'+'y' mol) are measured along with 2% Pd$_2$(DBA)$_3$ (e.g., catalyst) and 8% o-tolyl phosphine (e.g., ligand) into a 3-neck round bottom flask ("reaction vessel"), which is then vacuumed and filled with inert gas (e.g., N$_2$, Ar, etc.). The reaction vessel is connected with a condenser and chlorobenzene (20 mL) is added to the vessel. A thermocouple is inserted into the reaction vessel and the reaction mixture is heated from room temperature to about 120° C. and stirred in an oil bath for about 1 hr to 2 hrs after the mixture reaches 120° C.

While the reaction mixture is still hot, it is poured directly into a stirred methanol container (300 mL). The empty reaction vessel is washed with methanol and added to the methanol container. Thereafter, concentrated HCl$_{(aq)}$(4 mL) is added to the methanol container and the combination is mixed overnight. The resulting polymer is then filtered from solution using a Buchner funnel and side arm conical flask with reduced pressure, with the filtrate solution discarded. Then, the polymer is transferred into a Soxhlet thimble (with the polymer not exceeding half height of thimble) and loaded into a Soxhlet extraction apparatus. Polymer Soxhlet extraction is conducted with acetone (300 mL) for 24 hrs. The acetone solution and/or suspension is discarded thereafter.

Soxhlet extraction with hexane (300 mL) is conducted for 24 hrs, with the hexane solution and/or suspension is discarded thereafter. The polymer is then extracted into chloroform (300 mL) until its dissolution limit (i.e., no more material will dissolve). The polymer is precipitated by pouring the chloroform solution into a stirring beaker of acetone (400 mL), and then stirring the solution until it reaches room temperature. Finally, the polymer is filtered from the chloroform solution with a Buchner funnel and side arm conical flask at reduced pressure. The filtrate solution is discarded and the polymer is dried under vacuum.

Example 2—General OFET Device Fabrication Procedure

Example 2 is based on the OFET structure as shown in FIG. 3.

An organic semiconductor device is prepared comprising the cross-bred OSC polymer described herein. In some examples, a bottom gate, bottom contact OTFT device can be formed as following: patterning a gold (Au) or silver (Ag) gate electrode onto a substrate, followed by spin-coating a dielectric onto the substrate and treating to obtain a gate dielectric layer. After patterning Au or Ag source and drain electrodes, an OSC layer may be formed by the materials and methods of patterning as described herein to a thickness in a range of 10 nm to 200 nm. In some examples, p-xylene solvent was used to as the medium housing the cross-bred OSC polymer. In some examples, chlorobenzene solvent was used to as the medium housing the cross-bred OSC polymer. After forming the OSC layer, the structure was annealed. Finally, an insulator layer was positioned.

Example 3—OFET Device Performance

Example 3 is based on the OFET structure as shown in FIG. 3.

Figure 4:
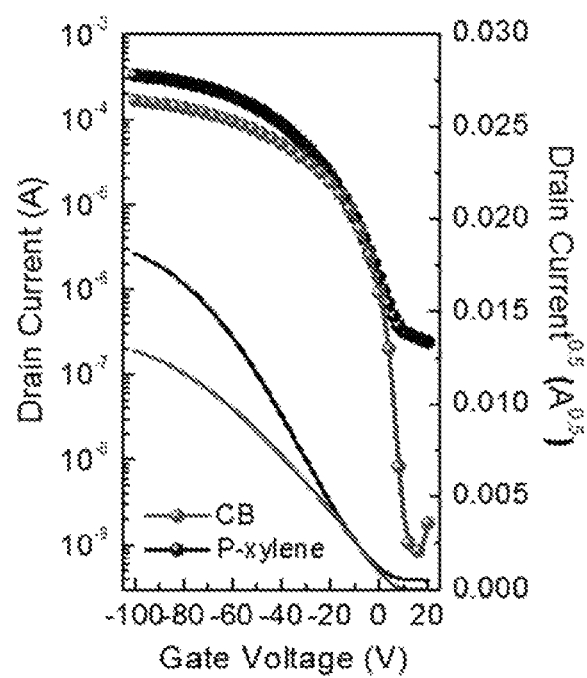
FIG. 4 illustrates a plot of drain current (A) versus gate voltage (V) of a device tested in air after annealing, according to some embodiments.

The device as formed in Example 2 was tested, with the results shown in Table 3 below and FIG. 4. Both p-xylene and chlorobenzene were tested as solvent, with p-xylene showing higher mobility ($\mu_h$), but chlorobenzene demonstrating a better $I_{on}/I_{off}$ ratio. Charge mobility is one parameter to determine OTFT device performance and represents how fast an electron or hole can move per unit voltage; the higher mobility, the better. The $I_{on}/I_{off}$ ratio is another parameter to determine OTFT device performance and represents the on/off current ratio. A higher on/off ratio means a lower off-current (lower power consumption) when an on-current is fixed; thus, the higher $I_{on}/I_{off}$ ratio, the better. Device performance was significantly improved after annealing at 160° C. for 1 hour in glove box (GB).

For example, in FIG. 4, device performance is measured in air after a 160° C. annealing in a glove box (entries 4 and 8 in Table 3, below). Entries 4 and 8 show that annealing in air at a higher temperature may lead to better device performance, at least in terms of charge mobility and $I_{on}/I_{off}$ ratio. Devices made with chlorobenzene have higher $I_{on}/I_{off}$ ratio. The results of Table 3 are illustrated in FIG. 4.

TABLE 3

| Entry | Solvent | Annealing? (No: as-cast; Yes: 160° C. in GB) | $\mu_h$ [cm$^2$V$^{-1}$s$^{-1}$] (measured in air or GB) | $I_{ON}/I_{OFF}$ | $V_{th}$ [V] | $I_{ON}$ [Å] |
|---|---|---|---|---|---|---|
| 1 | p-xylene | No | 0.043 (GB) | $6 \times 10^2$ | −14 | $3.04 \times 10^{-5}$ |
| 2 | p-xylene | Yes | 0.155 (GB) | $3 \times 10^2$ | −22 | $8.98 \times 10^{-5}$ |
| 3 | p-xylene | No | 0.278 (Air) | $2 \times 10^4$ | 6 | $9.31 \times 10^{-5}$ |
| 4 | p-xylene | Yes | 0.609 (Air) | $1 \times 10^3$ | 1 | $3.92 \times 10^{-4}$ |
| 5 | chlorobenzene | No | 0.009 (GB) | $2 \times 10^2$ | −39 | $3.30 \times 10^{-6}$ |
| 6 | chlorobenzene | Yes | 0.081 (GB) | $1 \times 10^3$ | −49 | $2.20 \times 10^{-5}$ |
| 7 | chlorobenzene | No | 0.074 (Air) | $3 \times 10^4$ | 6 | $1.73 \times 10^{-5}$ |
| 8 | chlorobenzene | Yes | 0.256 (Air) | $3 \times 10^5$ | 6 | $1.59 \times 10^{-4}$ |

Example 4—Photo Patterning Experiments

Example 4 is based on the OFET structure as shown in FIG. 3.

A first solution of cross-bred OSC polymers was prepared comprising a random copolymer of a first DPP-fused thiophene portion (having a first fused thiophene portion and a first linear alkyl-substituted DPP portion, e.g., Formula 5) and a second DPP-fused thiophene portion (having a second fused thiophene portion and a second branched alkyl-substituted DPP portion, e.g., Formula 4) in a relative high boiling point solvent (e.g., chlorobenzene, mesitylene, etc.) with the mole ratio between the first DPP-fused thiophene portion and the second DPP-fused thiophene portion in the copolymer being 3:7, respectively. Moreover, a second solution of non-cross-bred OSC polymers was prepared comprising the polymer of Formula 5 and the polymer of Formula 4 (i.e., each polymer existing distinctly) in the same or similar solvent as in the first solution at a mole ratio of 3:7 (polymer of Formula 5: polymer of Formula 4).

After stirring overnight at about 90° C. in an oil bath, a crosslinker as disclosed herein, was added to the first solution and the second solution in a suitable weight ratio to the cross-bred OSC polymers in the first solution or to the mixture of non-cross-bred polymers in the second solution. Thereafter, selectively, a suitable amount of second crosslinker was added to each the first and second solution and the resulting solution was stirred at room temperature for 20 minutes. A photoinitiator (3 wt. % relative to the cross-bred OSC polymers and the first crosslinker) was added into each solution and the mixture was stirred at room temperature for 2 hrs. A 0.45 μm PTFE filter was used to filter each solution.

The filtered solutions were each separately spun coated as a thin film coating onto a glass substrate, followed by baking at 90° C. Under a photo mask, the glass substrate comprising a film of the first solution and the glass substrate comprising a film of the second solution was cured at 365 nm using a UV lamp with a suitable curing dose. Thereafter, the glass substrates were washed sequentially with mixed solvents such as chlorobenzene/dioxane or chlorobenzene/anisole in different ratios for several times. The photo-patterned OSC polymer thin films on the glass substrates were dried with nitrogen gas.

Example 5—Results Comparison

Figure 5A:
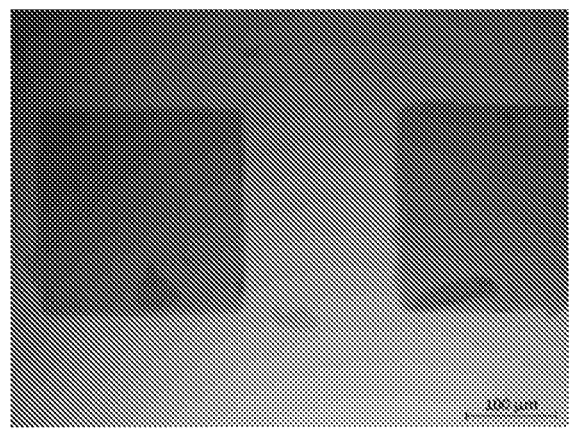
FIGS. 5A to 5D illustrate patterned non-cross-bred OSC polymer films, according to some embodiments.
Figure 5B:
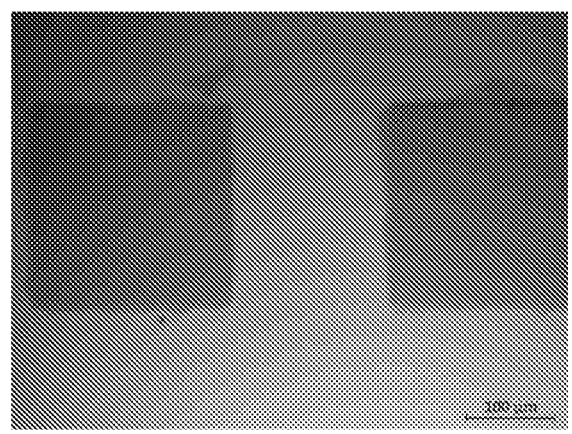
Figure 5C:
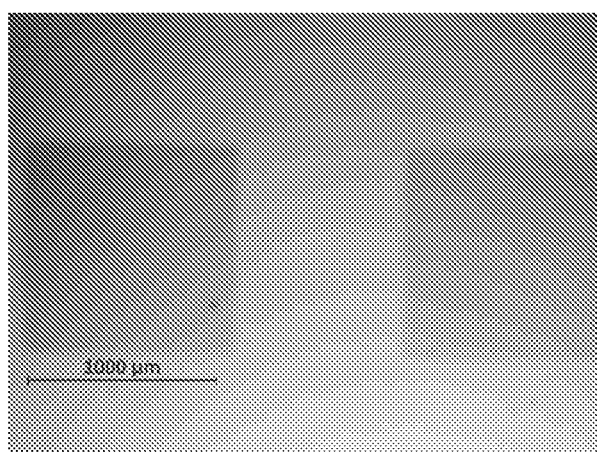
Figure 5D:

FIGS. 5A to 5D illustrate the patterned film formed from the second solution of Example 4 using a chlorobenzene dissolving solvent and a chlorobenzene/dioxane (8:2) rinsing solvent (FIGS. 5A and 5B), a mesitylene/anisole (6.7:3.3) rinsing solvent (FIG. 5C), and a mesitylene/dioxane (6.7:3.3) rinsing solvent (FIG. 5D). These images show that the rinsed photo-patterned film still has debris scattered around the cured area, thereby resulting in low reproducibility. The debris may be due to varying solubilities of the polymers used in the formation of the cross-bred OSC polymer. For example, the polymer of Formula 4 has a higher solubility than the polymer of Formula 5. As a result, different surface regions of spin-coated films made from the mixture of the polymer of Formula 4 and the polymer of Formula 5 may have different solubility, depending on the ratio of the two polymers of that region. Regions having a higher ratio of the polymer of Formula 5 tend to form insoluble debris because of their lower solubility.

Figure 6A:
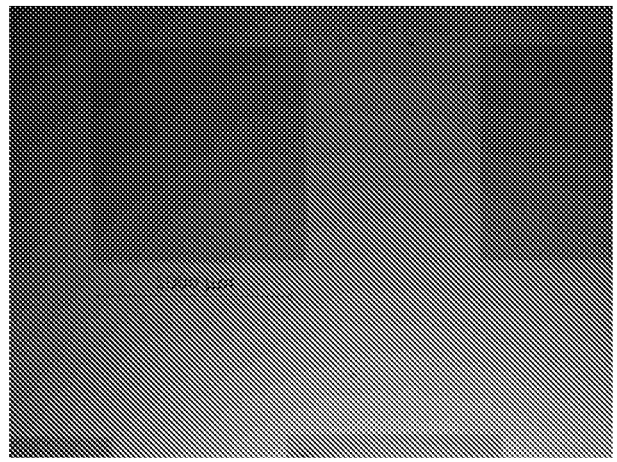
FIGS. 6A and 6B illustrate patterned cross-bred OSC polymer films, according to some embodiments.
Figure 6B:
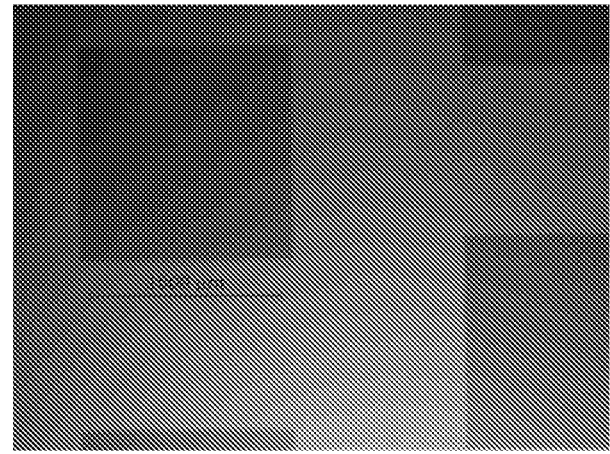
Figure 7A:
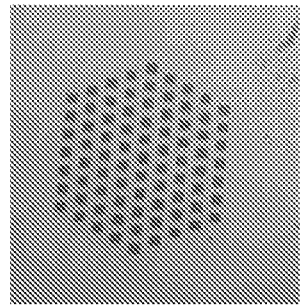
FIGS. 7A to 7C illustrate patterned cross-bred OSC polymer films, according to some embodiments.
Figure 7B:
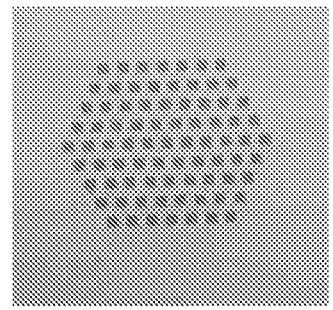
Figure 7C:
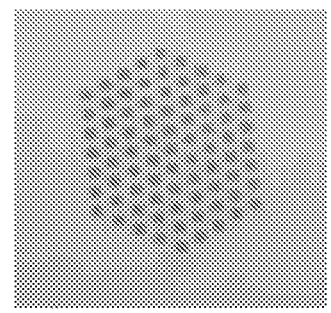

FIGS. 6A and 6B illustrates the patterned film formed from the first solution of Example 4 using a chlorobenzene dissolving solvent and a chlorobenzene/dioxane (8:2) rinsing solvent (FIG. 6A) or a mesitylene/dioxane (8:2) rinsing solvent (FIG. 6B). These images show the advantage of using cross-bred OSC polymers versus a mixture of non-cross-bred OSC polymers (as in FIGS. 5A to 5D). Photo imaging resulted in clean images without any residual debris scattered around the cured area. Using chlorobenzene as a dissolving agent with either chlorobenzene/dioxane, mesitylene/dioxane, or the like (e.g., mesitylene/anisole, toluene/anisole, etc.) as the rinsing agent resulted in excellent photo-patterning and much better reproducibility as compared with mixtures of non-cross-bred OSC polymers. FIGS. 7A to 7C further exemplify the improved photo patterning and reproducibility, which illustrate the patterned film formed from the first solution of Example 4 using a chlorobenzene dissolving solvent and a chlorobenzene/dioxane (8:2) rinsing solvent (FIG. 7A), a mesitylene/anisole (6.7:3.3) rinsing solvent (FIG. 7B), and a toluene/anisole (8:2) rinsing solvent (FIG. 7C).

Thus, as presented herein, improved UV patternable cross-bred OSC polymer blends and use thereof for OSC layers of organic thin-film transistors are disclosed.

Advantages of the UV patternable cross-bred OSC polymer blends include: (1) combining the virtues of multiple individual OSC polymers, each having only one type of donor/acceptor monomers, by forming a novel cross-bred OSC polymer (e.g., FIGS. 6A to 7C); the individual advantages of each individual OSC polymer cannot be achieved by mere physical blending (e.g., FIGS. 5A to 5D); (2) providing an efficient and low-cost approach to create OSC polymers with synergetic new properties at the molecular level (e.g., intrinsically as one material, cross-bred OSC polymers are easier to process, leading to much better reproducibility for solution-based OSC thin film manufacturing; in comparison, physical blending of individual OSC polymers often leads to non-cooperative behaviors, such as asynchronous precipitation, phase separation, varying crystallization kinetics, etc.); (3) fine-tuning polymer properties by manipulating ratios among different monomers (i.e., this is extremely valuable for tailoring products embedded with OSC polymers, such as photo-patternable OSC polymers adapting to specific customer-driven UV curing processes); and (4) comparing with individual polymers and their physical blends, cross-bred OSC polymers having both branched and linear side chain monomers are better for large-scale solution-based processes, providing less severe gelling issues and having better UV patterning results when used in a UV-patternable OSC blending formulation, thereby leading to better OTFT device performance and stability.

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

As utilized herein, "optional," "optionally," or the like are intended to mean that the subsequently described event or circumstance can or cannot occur, and that the description includes instances where the event or circumstance occurs and instances where it does not occur. The indefinite article "a" or "an" and its corresponding definite article "the" as used herein means at least one, or one or more, unless specified otherwise.

References herein to the positions of elements (e.g., "top," "bottom," "above," "below," etc.) are merely used to describe the orientation of various elements in the FIGURES. It should be noted that the orientation of various elements may differ according to other exemplary embodiments, and that such variations are intended to be encompassed by the present disclosure.

With respect to the use of substantially any plural and/or singular terms herein, those having skill in the art can translate from the plural to the singular and/or from the singular to the plural as is appropriate to the context and/or application. The various singular/plural permutations may be expressly set forth herein for the sake of clarity.

It will be apparent to those skilled in the art that various modifications and variations can be made without departing from the spirit or scope of the claimed subject matter. Accordingly, the claimed subject matter is not to be restricted except in light of the attached claims and their equivalents.

What is claimed is:

1. A polymer blend, comprising:
   at least one cross-bred organic semiconductor (OSC) polymer and at least one crosslinker,
   wherein:
   the at least one cross-bred OSC polymer is a diketopyrrolopyrrole (DPP)-fused thiophene polymeric material,
   the DPP-fused thiophene polymeric material comprises a first linear alkyl-substituted DPP portion and a second branched alkyl-substituted DPP portion,
   the fused thiophene is beta-substituted, and the at least one crosslinker comprises at least one of:

(A) a polymer selected from:

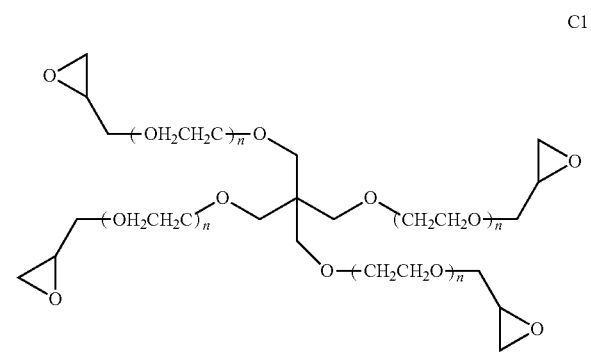

wherein n is an integer greater than or equal to two, or (B) a small-molecule selected from:

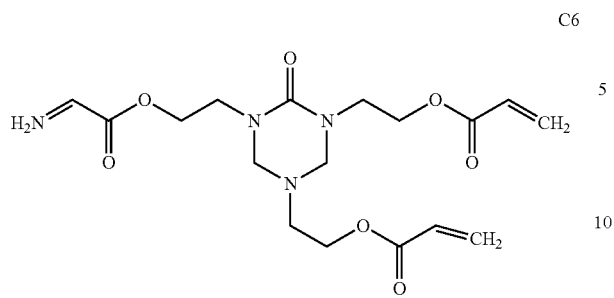
C6
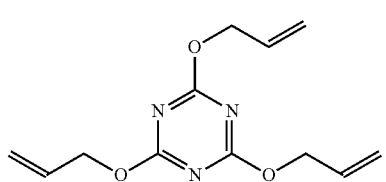
C7
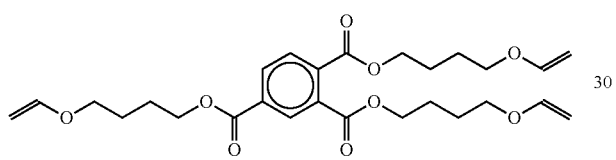
C8
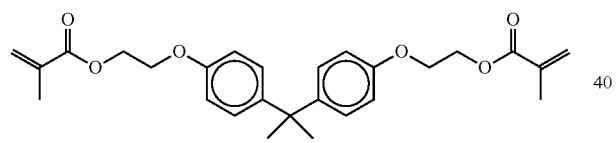
C9
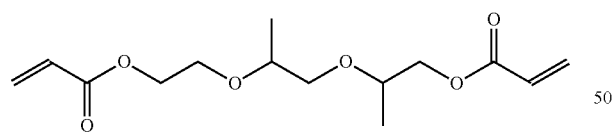
C10
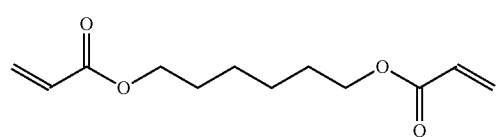
C11
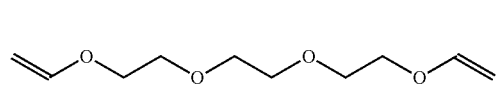
C12
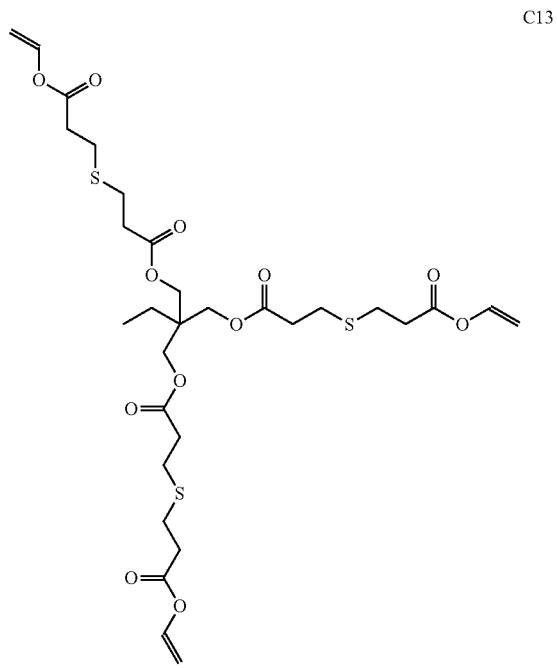
C13
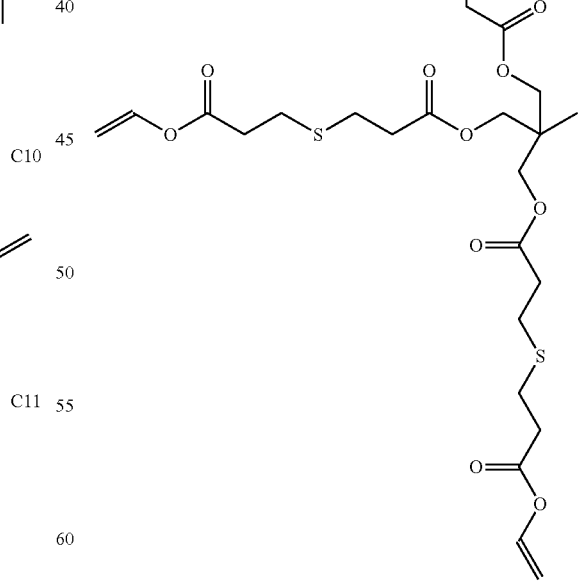
C14
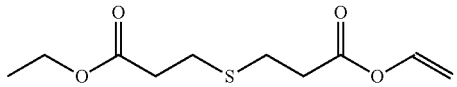

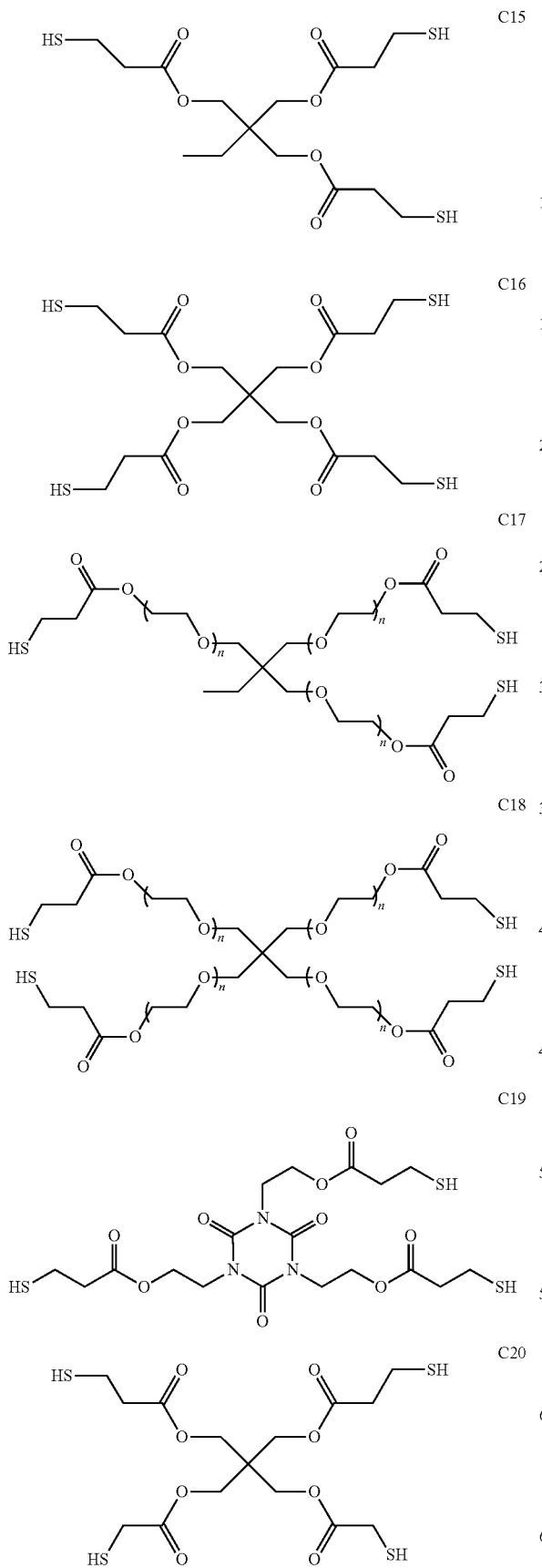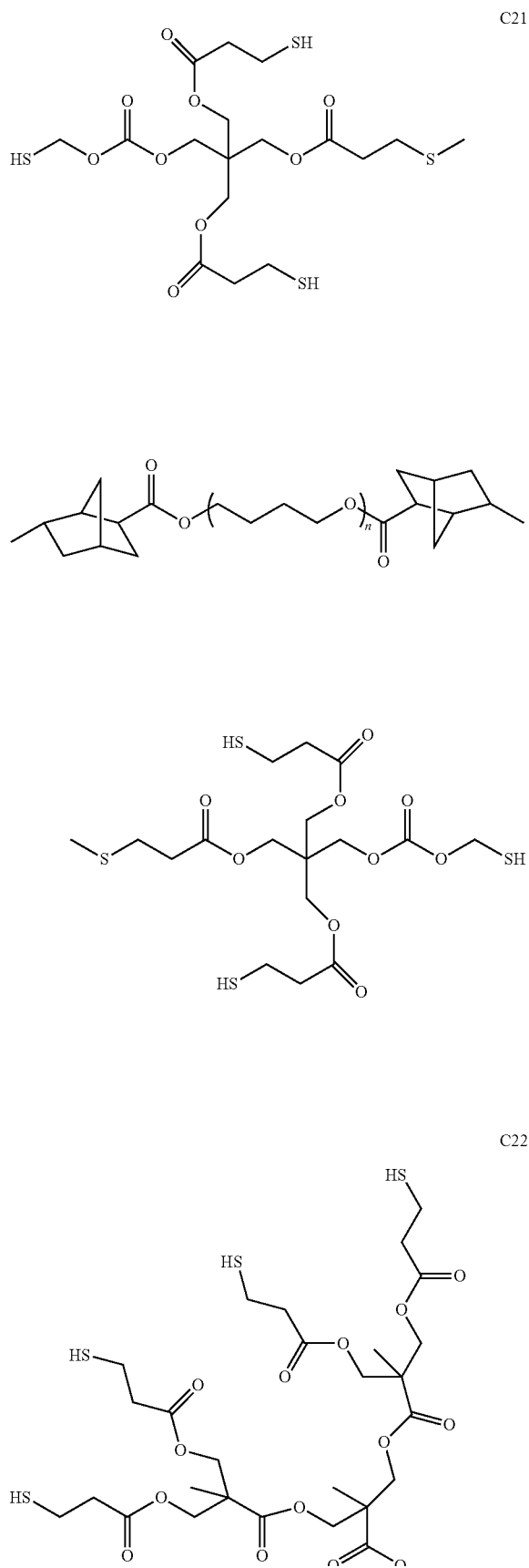

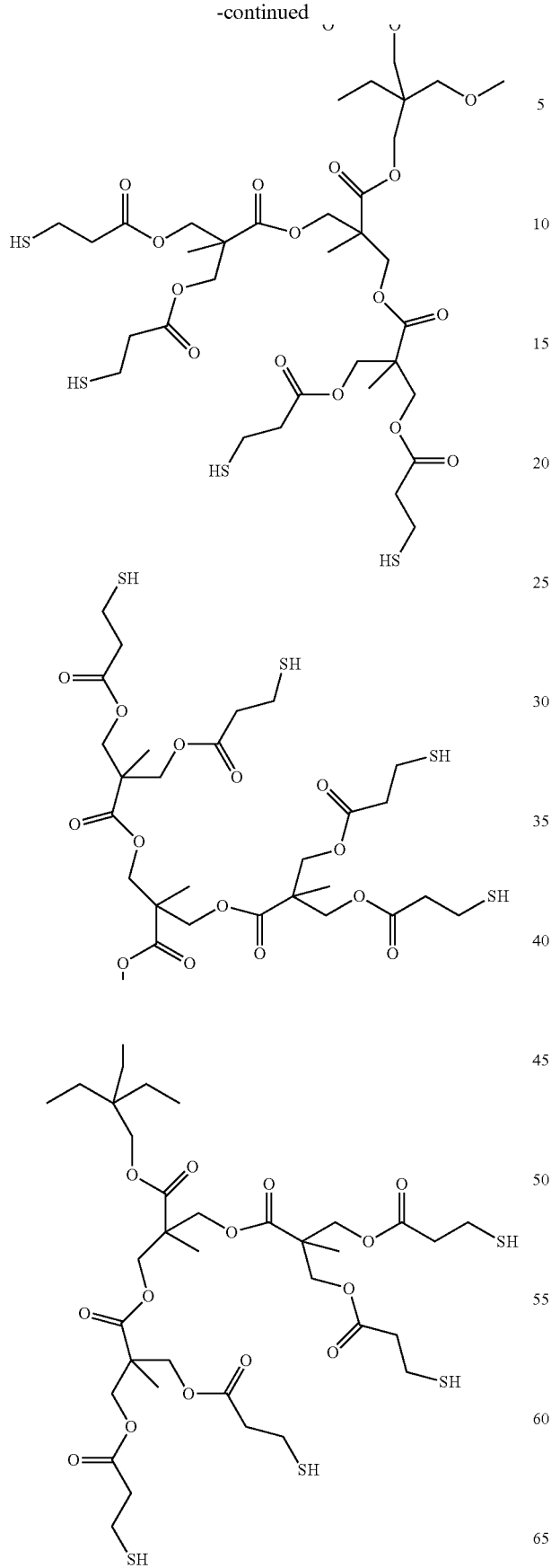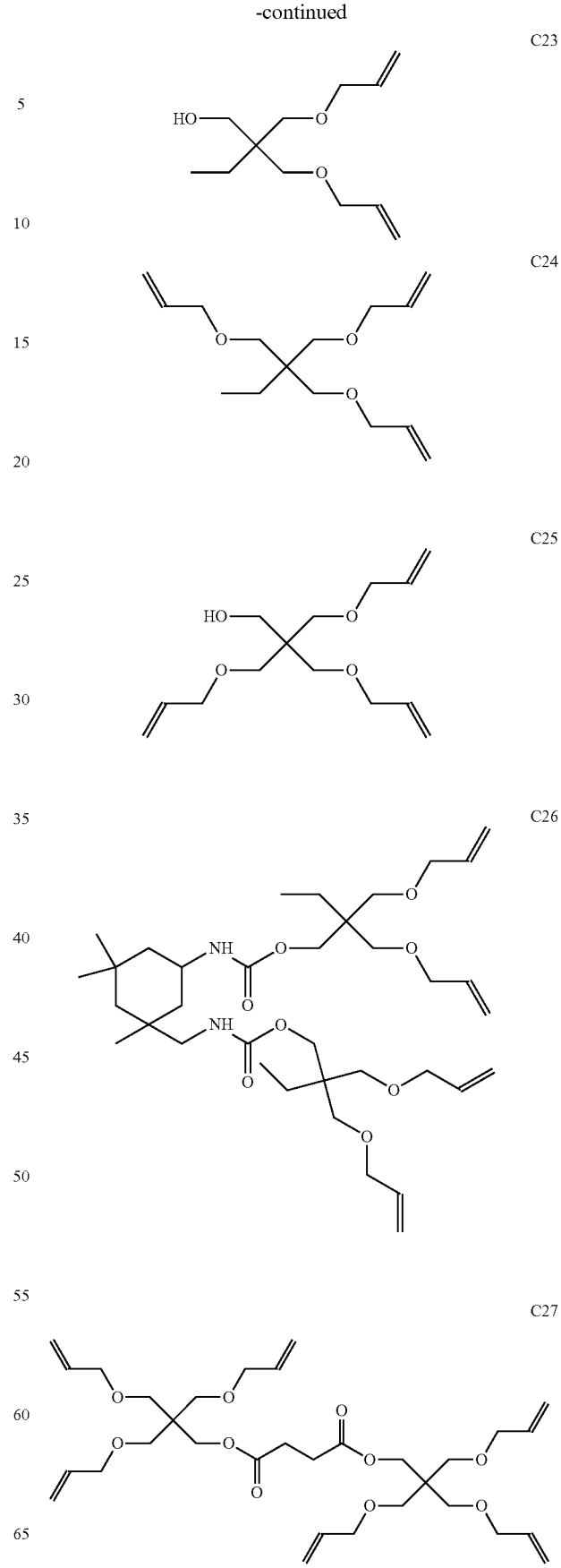

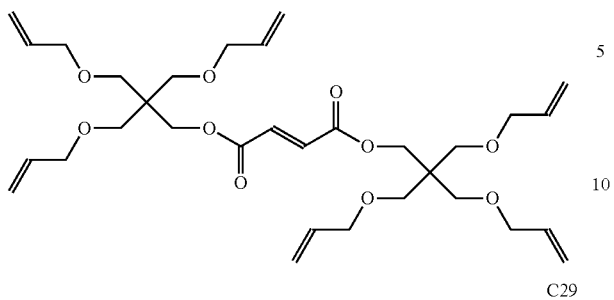
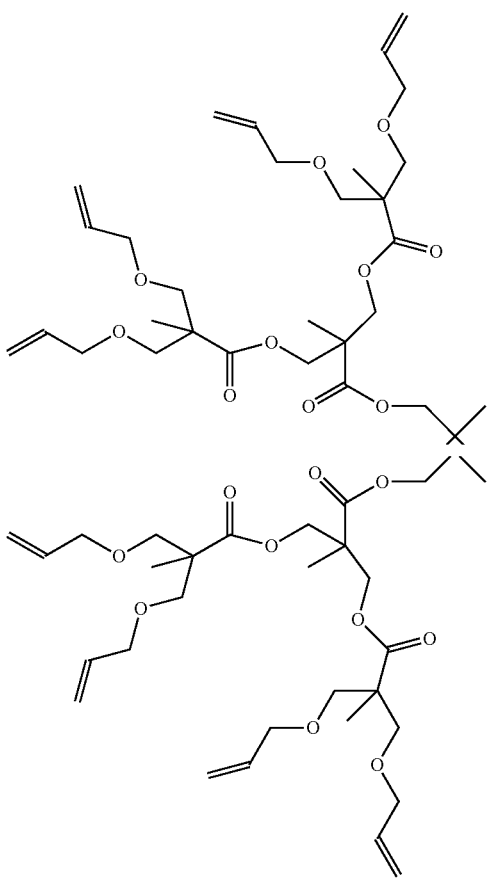
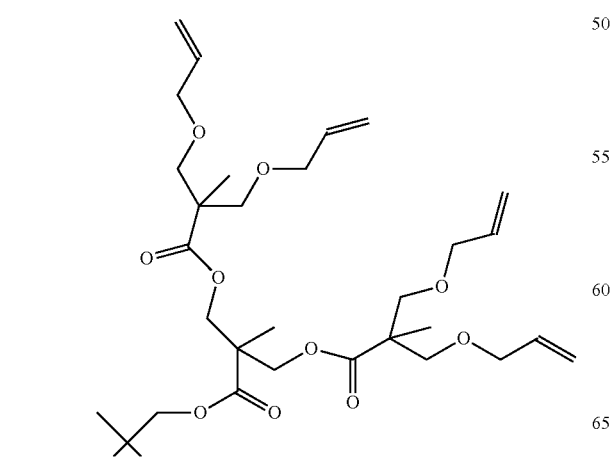
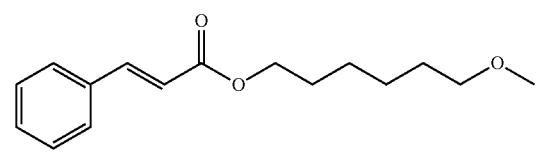
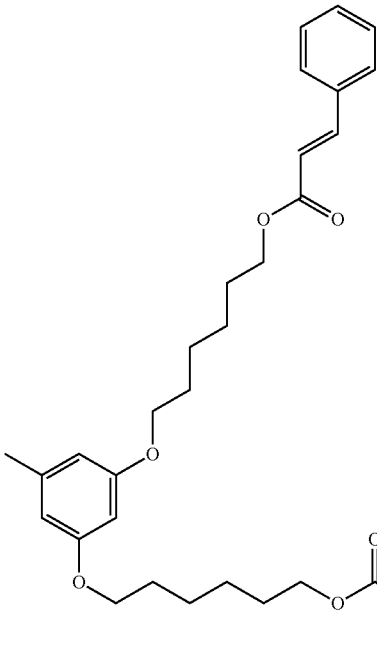
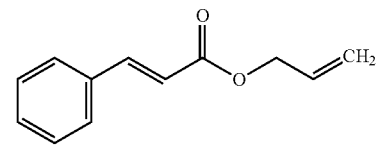
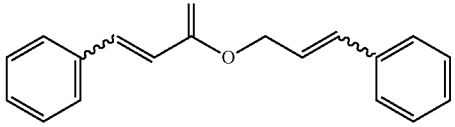

-continued
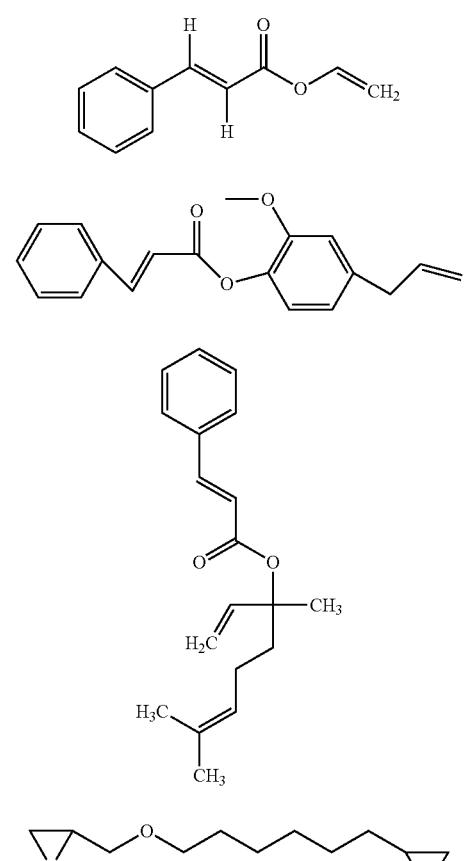
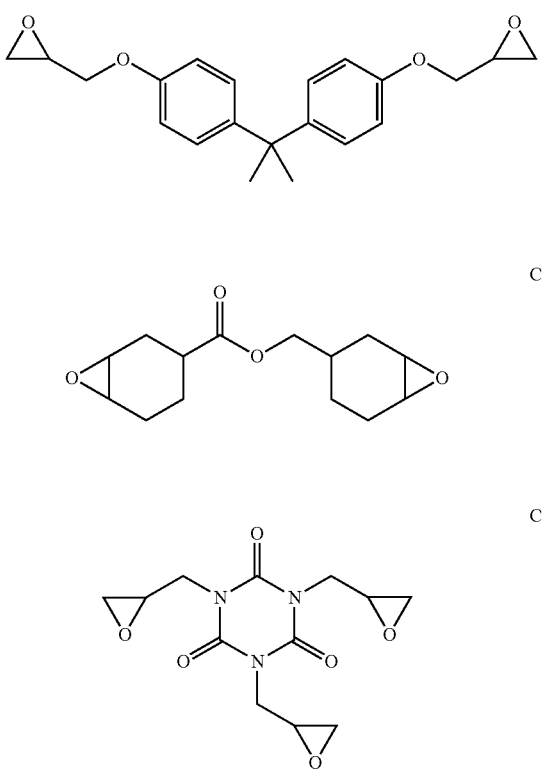
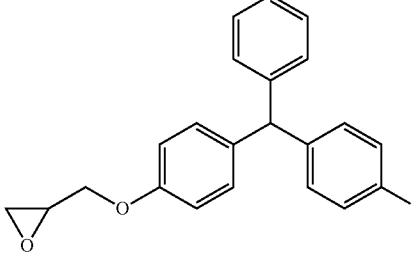
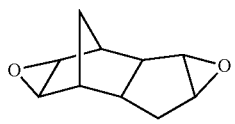
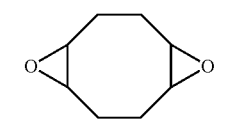
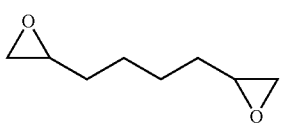
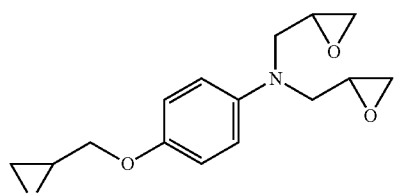
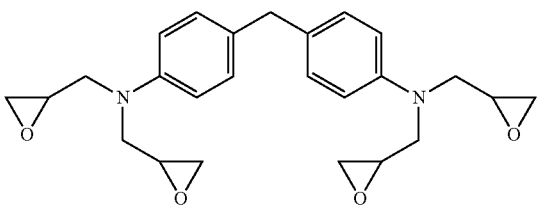
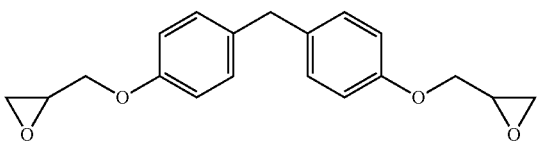

73
-continued

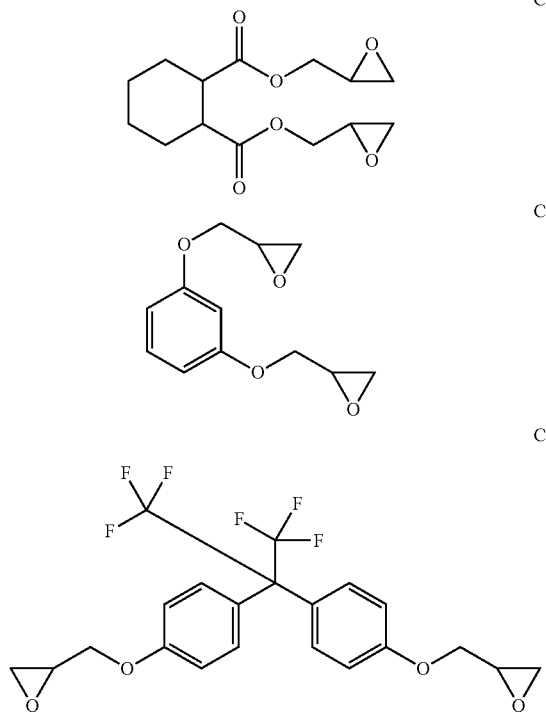

C48
C49
C50

74
-continued

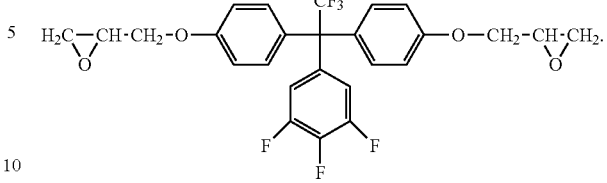

C51 or, (C) a combination thereof.

2. The polymer blend of claim 1, further comprising:
at least one photoinitiator, wherein the at least one photoinitiator is present in a range of 0.1 wt. % to 10 wt. %.

3. The polymer blend of claim 1, further comprising:
at least one of antioxidants, lubricants, compatibilizers, leveling agents, or nucleating agents present in a range of 0.05 wt. % to 5 wt. %.

4. The polymer blend of claim 1, wherein the first linear alkyl-substituted DPP portion and the second branched alkyl-substituted DPP portion are each, independently, a repeat unit of Formula 1 or Formula 2, or a salt or isomer thereof:

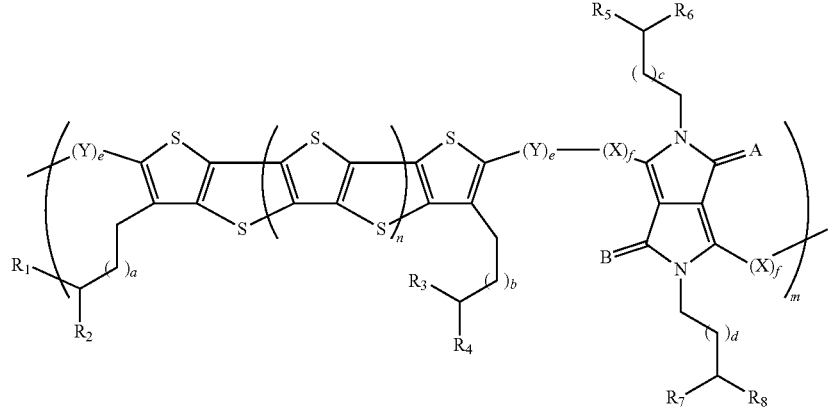

Formula 1

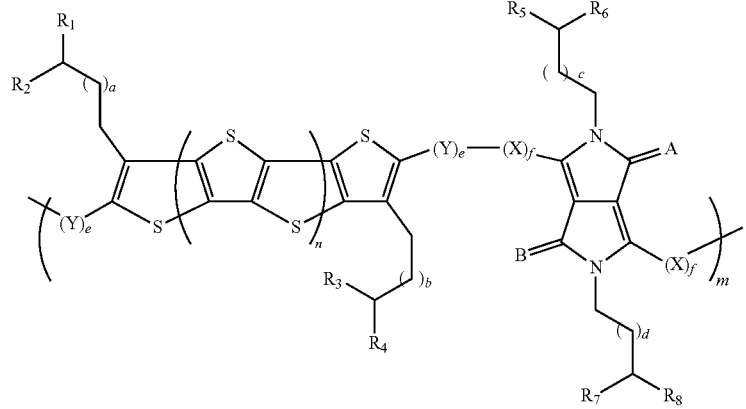

Formula 2 wherein in Formula 1 and Formula 2:

m is an integer greater than or equal to one;

n is 0, 1, or 2;

$R_1$, $R_2$, $R_3$, $R_4$, $R_5$, $R_6$, $R_7$, and $R_8$, may be, independently, hydrogen, substituted or unsubstituted $C_4$ or greater alkyl, substituted or unsubstituted $C_4$ or greater alkenyl, substituted or unsubstituted $C_4$ or greater alkynyl, or $C_5$ or greater cycloalkyl;

a, b, c, and d are independently, integers greater than or equal to 3;

e and f are integers greater than or equal to zero;

X and Y are, independently a covalent bond, an optionally substituted aryl group, an optionally substituted heteroaryl, an optionally substituted fused aryl or fused heteroaryl group, an alkyne or an alkene; and A and B may be, independently, either S or O, with the provisos that:

i. at least one of $R_1$ or $R_2$; one of $R_3$ or $R_4$; one of $R_5$ or $R_6$; and one of $R_7$ or Re is a substituted or unsubstituted alkyl, substituted or unsubstituted alkenyl, substituted or unsubstituted alkynyl, or cycloalkyl;

ii. e and f cannot both be 0;

iii. if either e or f is 0, then c and d, independently, are integers greater than or equal to 5.

5. The polymer blend of claim 1, wherein the at least one cross-bred OSC polymer comprises a repeat unit having: the first linear alkyl-substituted DPP portion, the second branched alkyl-substituted DPP portion, and at least one fused thiophene.

6. The polymer blend of claim 1, wherein the at least one cross-bred OSC polymer comprises a repeat unit having: the first linear alkyl-substituted DPP portion, the second branched alkyl-substituted DPP portion, and at least two fused thiophenes.

* * * * *

UNITED STATES PATENT AND TRADEMARK OFFICE
CERTIFICATE OF CORRECTION

PATENT NO. : 12,052,911 B2
APPLICATION NO. : 17/291406
DATED : July 30, 2024
INVENTOR(S) : Deng et al.

It is certified that error appears in the above-identified patent and that said Letters Patent is hereby corrected as shown below:

In the Claims

Claim 1, Column 63, Lines 5-13, delete:

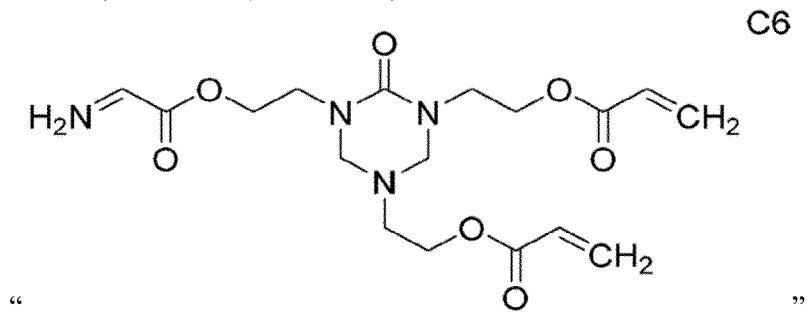

"

And insert:

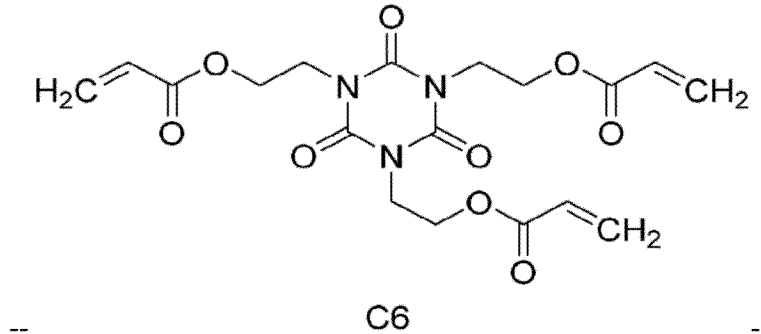

-- --.

Signed and Sealed this
Ninth Day of December, 2025

John A. Squires
*Director of the United States Patent and Trademark Office*

Claim 1, Column 63, Lines 46-52, delete:
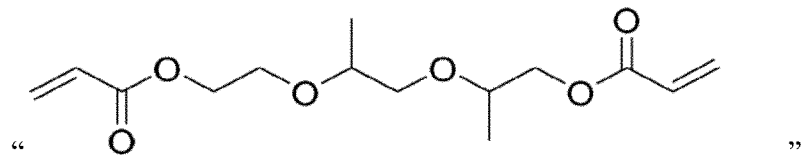
" "
And insert:
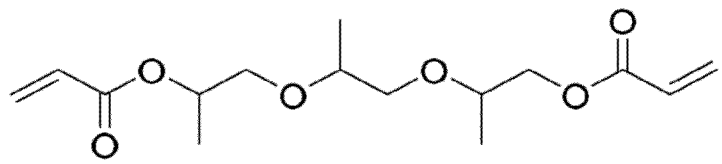
-- --.
Claim 1, Column 64, Lines 30-66, delete the two chemical structures under the label C14, and insert:
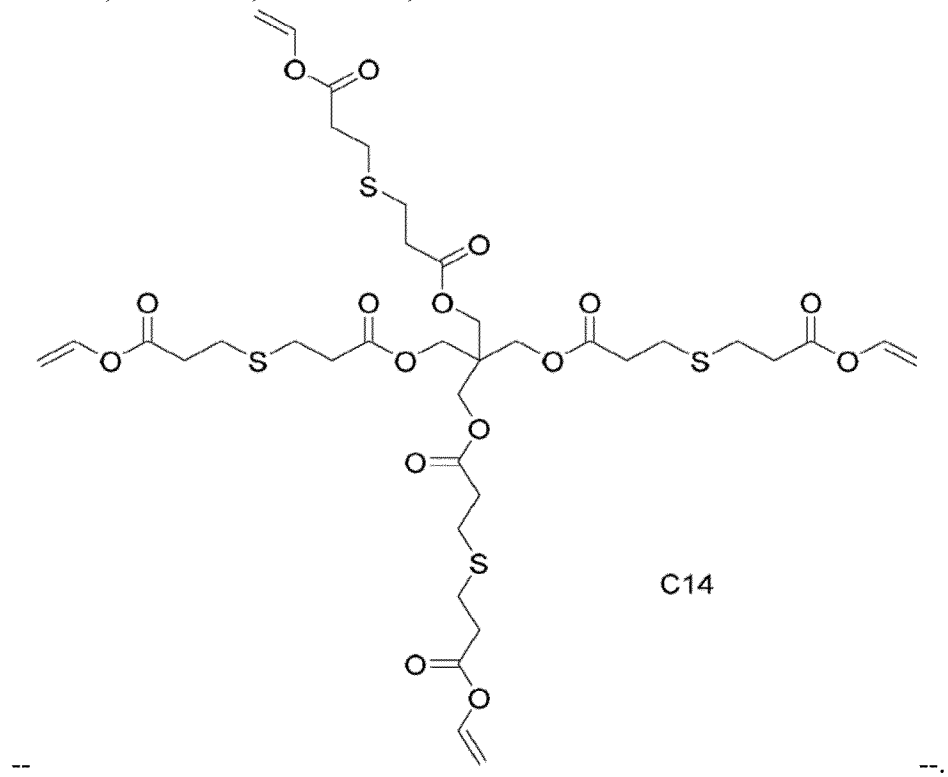
-- --.

Claim 1, Column 66, Lines 1-43, delete the three chemical structures under the label C21, and insert:
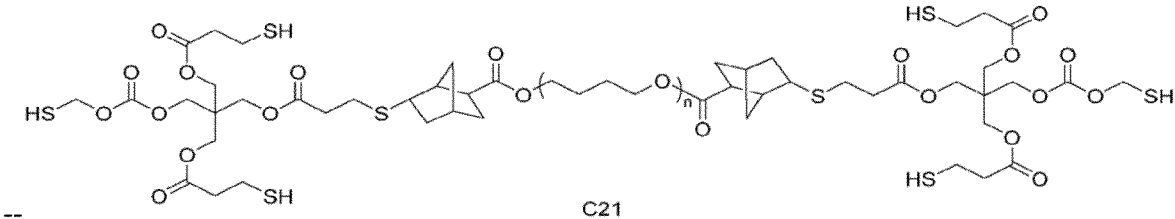
-- C21 --.
Claim 1, Column 66, Line 50, through Column 67, Line 66, delete the chemical structures under the label C22, and insert:
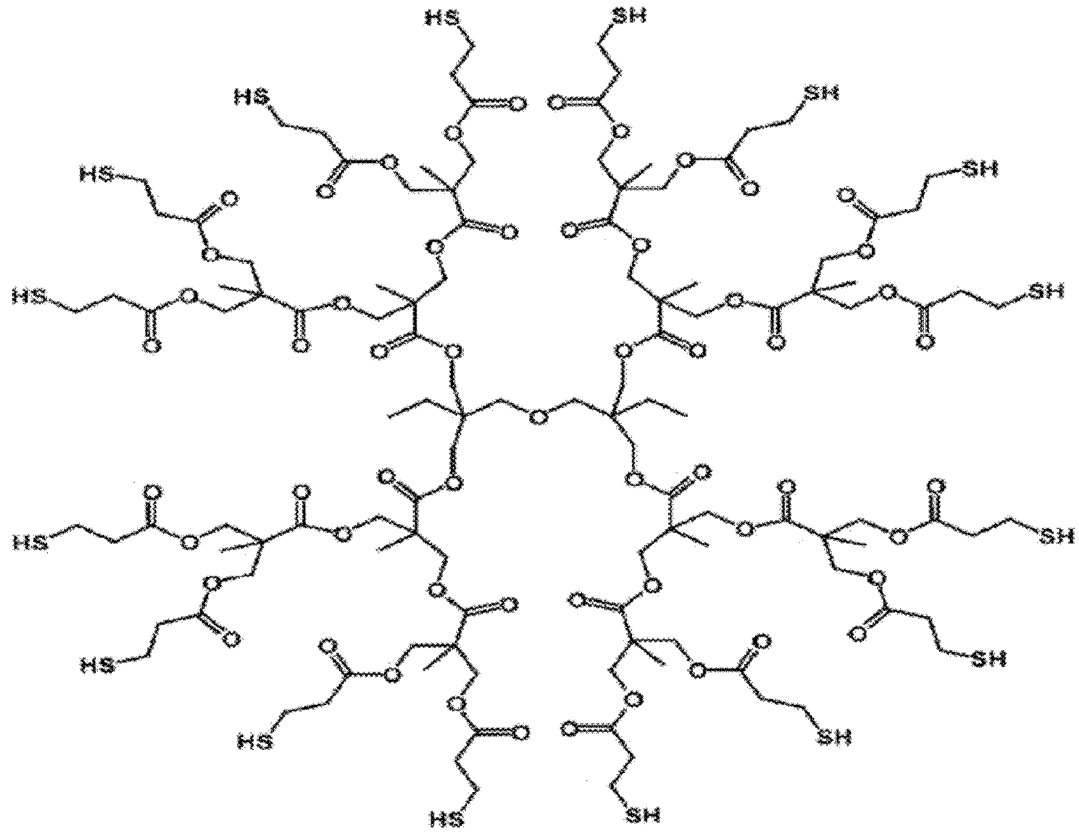
-- C22 --.
Claim 1, Column 69, Line 15, through Column 70, Line 17, delete the three chemical structures under the labeled C29, and insert:

CERTIFICATE OF CORRECTION (continued)
U.S. Pat. No. 12,052,911 B2

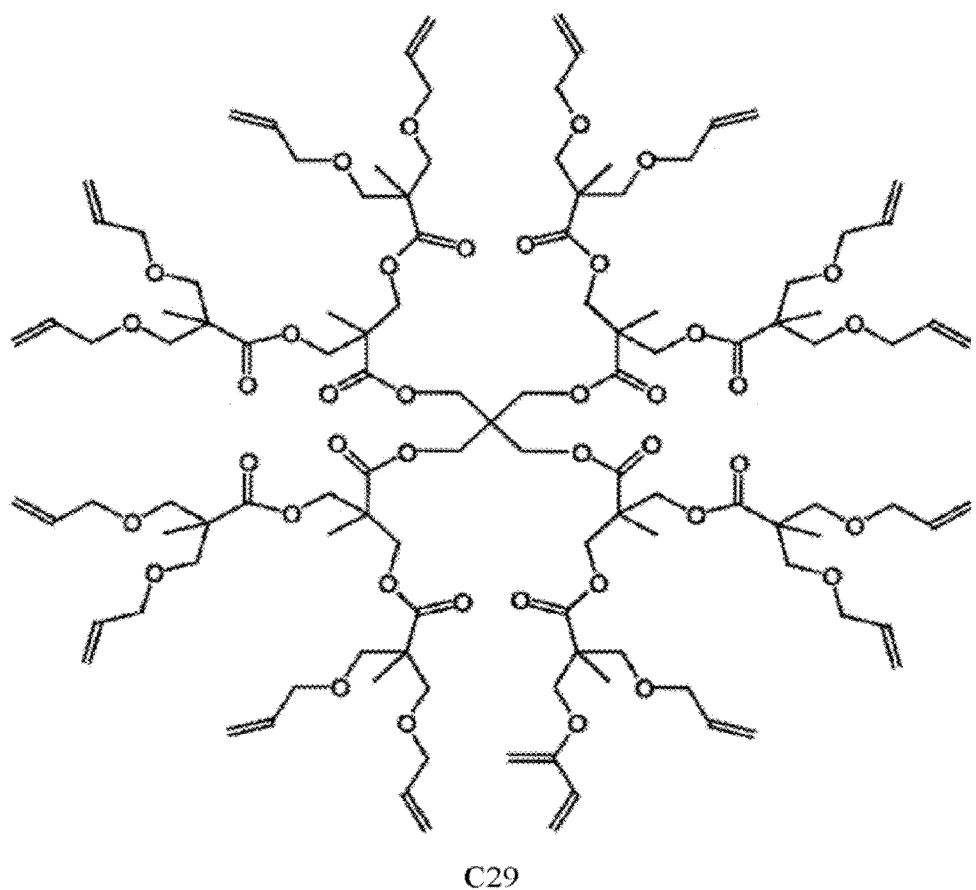

-- C29 --.

Claim 1, Column 70, Lines 19-49, delete the two chemical structures under the label C30, and insert:

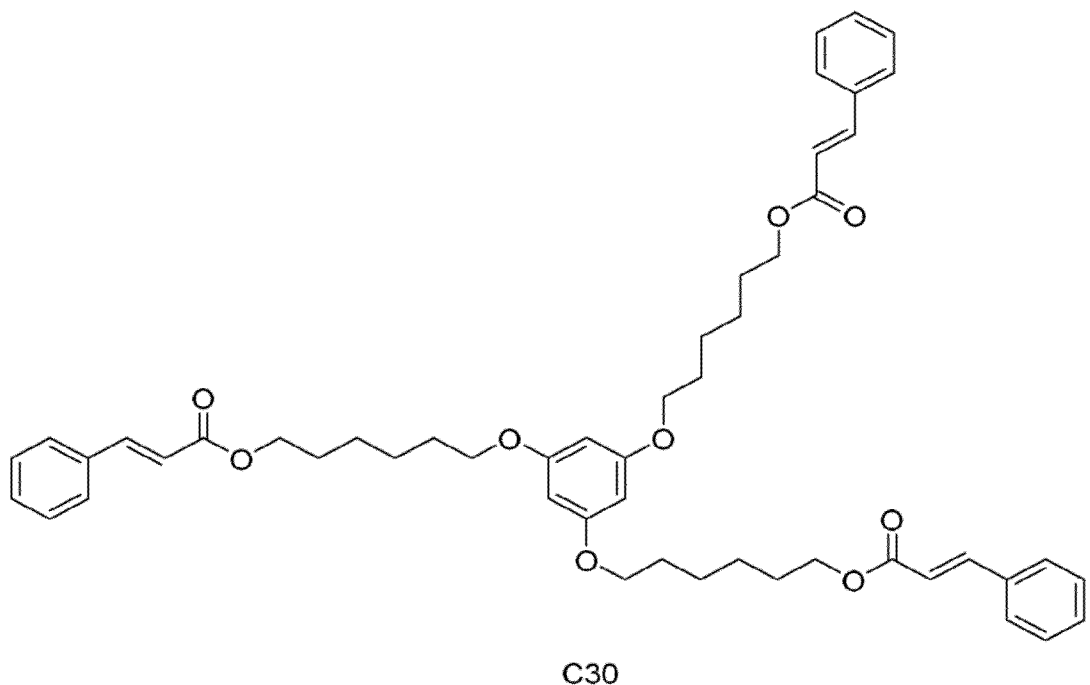
-- C30 --.
Claim 1, Column 71, Lines 32-35, delete:
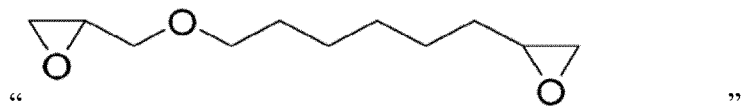
" C36 "
And insert:
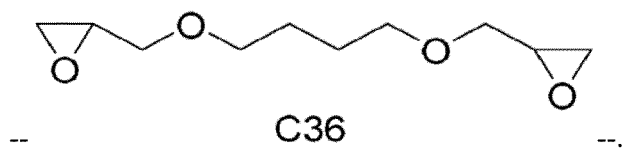
-- C36 --.
Claim 4, Column 74, Line 30, delete:
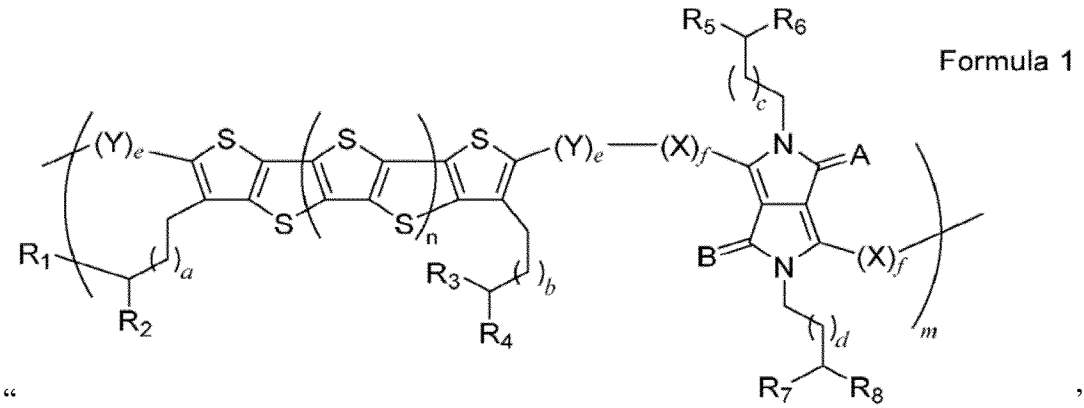
Formula 1
" "
And insert:

CERTIFICATE OF CORRECTION (continued)
U.S. Pat. No. 12,052,911 B2

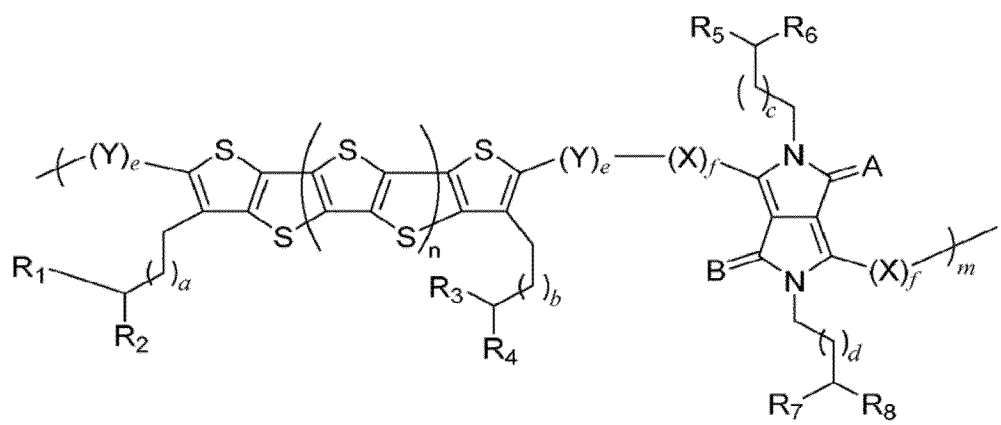

-- Formula 1 --.

Claim 4, Column 75, Line 19, delete:
"Re"
And insert:
-- $R_8$ --.